(12) United States Patent
Naito

(10) Patent No.: US 10,535,761 B2
(45) Date of Patent: Jan. 14, 2020

(54) SEMICONDUCTOR DEVICE INCLUDING A MESA PORTION INCLUDING AN EMITTER REGION HAVING A VARIED WIDTH

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/045,707

(22) Filed: Jul. 25, 2018

(65) Prior Publication Data

US 2019/0051739 A1 Feb. 14, 2019

(30) Foreign Application Priority Data

Aug. 9, 2017 (JP) ................................. 2017-154181

(51) Int. Cl.
*H01L 29/739* (2006.01)
*H01L 29/423* (2006.01)
(Continued)

(52) U.S. Cl.
CPC ...... *H01L 29/7397* (2013.01); *H01L 29/0696* (2013.01); *H01L 29/0804* (2013.01); *H01L 29/1004* (2013.01); *H01L 29/1095* (2013.01); *H01L 29/36* (2013.01); *H01L 29/4236* (2013.01); *H01L 29/8613* (2013.01); *H01L 29/063* (2013.01); *H01L 29/0619* (2013.01); *H01L 29/407* (2013.01); *H01L 29/4238* (2013.01)

(58) Field of Classification Search
None
See application file for complete search history.

(56) References Cited

U.S. PATENT DOCUMENTS 7,622,351 B2 11/2009 Kobayashi
2010/0289076 A1* 11/2010 Nishida ............... H01L 29/0696
257/334
(Continued)

FOREIGN PATENT DOCUMENTS

JP H08274301 A 10/1996
JP 2009170629 A 7/2009
(Continued)

*Primary Examiner* — Andres Munoz

(57) ABSTRACT

A semiconductor device including: a semiconductor substrate; a first gate trench portion and a dummy trench portion provided from an upper surface of the semiconductor substrate to a drift region, extending in the extending direction; a first transistor mesa portion sandwiched by the first gate trench portion and dummy trench portion; a base region contacting with the first gate trench portion above the drift region; an emitter region contacting with the same on the semiconductor substrate upper surface; and a second conductivity type region exposed on the semiconductor substrate upper surface, wherein the emitter region and second conductivity type region are arranged alternately in the extending direction; and the emitter region width in the extending direction contacting with the first gate trench portion is greater than the second conductivity type region width in the extending direction contacting with the same, will be provided.

27 Claims, 47 Drawing Sheets

(51) Int. Cl.
*H01L 29/10* (2006.01)
*H01L 29/08* (2006.01)
*H01L 29/06* (2006.01)
*H01L 29/36* (2006.01)
*H01L 29/861* (2006.01)
*H01L 29/40* (2006.01)

(56) References Cited

U.S. PATENT DOCUMENTS

| | | | |
|---|---|---|---|
| 2015/0206960 A1* | 7/2015 | Hirabayashi | H01L 27/0727 |
| | | | 257/140 |
| 2016/0056306 A1 | 2/2016 | Masuoka et al. | |
| 2016/0336404 A1* | 11/2016 | Naito | H01L 29/7397 |
| 2016/0351561 A1 | 12/2016 | Senoo | |
| 2017/0025522 A1* | 1/2017 | Naito | H01L 29/407 |
| 2017/0141216 A1 | 5/2017 | Abe | |
| 2017/0263740 A1* | 9/2017 | Onozawa | H01L 29/8613 |

FOREIGN PATENT DOCUMENTS

| | | |
|---|---|---|
| JP | 2016225345 A | 12/2016 |
| WO | 2014199465 A1 | 12/2014 |
| WO | 2016125490 A1 | 8/2016 |

* cited by examiner

SEMICONDUCTOR DEVICE INCLUDING A MESA PORTION INCLUDING AN EMITTER REGION HAVING A VARIED WIDTH

The contents of the following Japanese patent application(s) are incorporated herein by reference:
NO. 2017-154181 filed in JP on Aug. 9, 2017.

BACKGROUND

1. Technical Field

The present invention relates to a semiconductor device.

2. Related Art

Conventionally, semiconductor devices such as insulated gate bipolar transistor (IGBT) are known (refer to the Patent Document 1, for example). Patent Document 1: Japanese Patent Application Publication No. 2016-225345

In semiconductor devices, preferably variance in saturation current or the like is improved.

SUMMARY

In a first aspect of the present invention, a semiconductor device including: a semiconductor substrate having a drift region of the first conductivity type; a first gate trench portion that is provided from an upper surface of the semiconductor substrate to the drift region, extending in a predetermined extending direction on the upper surface of the semiconductor substrate; a dummy trench portion that is provided from the upper surface of the semiconductor substrate to the drift region, extending in the extending direction; and a first transistor mesa portion that is sandwiched by the first gate trench portion and the dummy trench portion will be provided. The semiconductor device includes: a base region of the second conductivity type contacting with the first gate trench portion above the drift region; an emitter region of the first conductivity type that is provided on the semiconductor substrate contacting with the first gate trench portion and has higher doping concentration than that of the drift region; and a second conductivity type region exposed on the upper surface of the semiconductor substrate. On an upper surface of the first transistor mesa portion, the emitter region and the second conductivity type region are arranged alternately in the extending direction, and the width of the emitter region in the extending direction contacting with the first gate trench portion is greater than the width of the second conductivity type region in the extending direction contacting with the first gate trench portion.

On the upper surface of the first transistor mesa portion, the width of the emitter region in the extending direction contacting with the first gate trench portion may be greater than the width of the emitter region in the extending direction contacting with the dummy trench portion. In the first transistor mesa portion, the second conductivity type region contacts with the dummy trench portion, and the width of the second conductivity type region in the extending direction contacting with the dummy trench portion may be greater than the width of the second conductivity type region in the extending direction contacting with the first gate trench portion.

The emitter regions may contact with the dummy trench portions. The width of the second conductivity type region in the extending direction contacting with the first gate trench portion may be smaller than the width of the emitter region in the extending direction contacting with the dummy trench portion.

The emitter regions may be spaced apart from the dummy trench portions. The second conductivity type region may further have a first intermediate region of the second conductivity type having lower doping concentration than that of the second conductivity type region. The first intermediate region may be sandwiched by the dummy trench portion and the emitter region and contact with both the dummy trench portion and the emitter region. The second conductivity type region may have a second intermediate region of the second conductivity type having lower doping concentration than that of a contact region of the second conductivity type and a contact region. The contact regions may be spaced apart from the first gate trench portions. The second intermediate regions may contact with the first gate trench portions.

The second intermediate region may be sandwiched by the first gate trench portion and the contact region contacting with both the first gate trench portion and the contact region. The width of the second intermediate region in the extending direction contacting with the first gate trench portion may be smaller than the width of the emitter region in the extending direction contacting with the dummy trench portion.

In the first transistor mesa portion, the emitter region may be continuously arranged in the extending direction, and the emitter region and the second conductivity type region may be arranged alternately in the extending direction. The width of the emitter region in the extending direction may be changed stepwise.

The semiconductor device may further include an interlayer dielectric film on the upper surface of the semiconductor substrate, and the interlayer dielectric film may have contact holes. Below the contact hole, the emitter region and the second conductivity type region may be next to and contact with each other in a direction from the dummy trench portion to the first gate trench portion. The end portion of the emitter region may be arranged below the contact hole.

The semiconductor device may further include an interlayer dielectric film on the upper surface of the semiconductor substrate, and the interlayer dielectric film may have contact holes. Below the contact hole, the emitter region and the second conductivity type region may be next to and contact with each other in the extending direction. The end portion of the emitter region may be arranged, in the top view of the semiconductor substrate, between the contact hole and the first gate trench portion. The end portion of the emitter region may be arranged, in the top view of the semiconductor substrate, between the contact hole and the dummy trench portion. The width of the emitter region in the extending direction may be changed continuously.

The width of the emitter region in the extending direction between the contact hole and the first gate trench portion may be equal to the width of the emitter region in the extending direction between the contact hole and the dummy trench portion. The semiconductor device may further include an accumulation region of the first conductivity type, above the drift region and below the base region, contacting with the first gate trench portion and having higher doping concentration than that of the drift region. The accumulation region may overlap the emitter region in the top view of the semiconductor substrate.

In a second aspect of the present invention, the semiconductor device may further include: a second gate trench portion that is provided from the upper surface of the semiconductor substrate to the drift region, extending in the extending direction, and arranged next to the first gate trench portion and on the opposite side to the dummy trench portion; a second transistor mesa portion that is sandwiched by the first gate trench portion and the second gate trench portion. The base region may contact with both the first gate trench portion and the second gate trench portion above the drift region. The emitter region may contact with both the first gate trench portion and the second gate trench portion on the upper surface of the semiconductor substrate. The second conductivity type region may be provided exposed on the upper surface of the semiconductor substrate. The width of the emitter region in the second transistor mesa portion in the extending direction contacting with the second gate trench portion may be smaller than the width of the emitter region in the first transistor mesa portion in the extending direction contacting with the second gate trench portion.

In the second transistor mesa portion, the emitter region and the second conductivity type region may be arranged alternately in the extending direction. In the second transistor mesa portion, the second conductivity type region may be spaced apart from both the first gate trench portion and the second gate trench portion. The second conductivity type regions may contact with the first gate trench portions. The width of the second conductivity type region in the second transistor mesa portion in the extending direction contacting with the first gate trench portion may be greater than the width of the emitter region in the first transistor mesa portion in the extending direction contacting with the first gate trench portion.

The summary clause does not necessarily describe all necessary features of the embodiments of the present invention. The present invention may also be a sub-combination of the features described above.

BRIEF DESCRIPTION OF THE DRAWINGS

FIG. 1b illustrates an exemplary a-a' cross-section in FIG. 1a.

FIG. 1c is an enlarged view of the region A1 in FIG. 1a.

FIG. 2b is an enlarged view of a region A2 in FIG. 2a.

FIG. 3b is an enlarged view of the region A3 in FIG. 3a.

FIG. 4b is an enlarged view of the region A4 in FIG. 4a.

FIG. 5b is an enlarged view of the region A5 in FIG. 5a.

FIG. 6b is an enlarged view of the region A6 in FIG. 6a.

FIG. 7b is an enlarged view of the region A7 in FIG. 7a.

FIG. 8b is an enlarged view of the region A8 in FIG. 8a.

FIG. 9b is an enlarged view of the region A9 in FIG. 9a.

FIG. 10b is an enlarged view of the region A10 in FIG. 10a.

FIG. 11b is an enlarged view of the region A11 in FIG. 11a.

FIG. 12b is an enlarged view of the region A12 in FIG. 12a.

FIG. 13b is an enlarged view of the region A13 in FIG. 13a.

FIG. 15b illustrates an exemplary z-z' cross-section in FIG. 15a.

FIG. 15c is an enlarged view of the region B1 in FIG. 15a.

FIG. 16b is an enlarged view of the region B2 in FIG. 16a.

FIG. 17b is an enlarged view of the region B3 in FIG. 17a.

FIG. 18b is an enlarged view of the region B4 in FIG. 18a.

FIG. 19a is an enlarged view of the region E1 in FIG. 1a.

FIG. 19b illustrates an exemplary b-b' cross-section in FIG. 19a.

FIG. 20a is another enlarged view of the region E1 in FIG. 1a.

FIG. 20b illustrates an exemplary c-c' cross-section in FIG. 20a.

FIG. 21a is another enlarged view of the region E1 in FIG. 1a.

FIG. 21b illustrates an exemplary e-e' cross-section in FIG. 21a.

FIG. 22b illustrates an exemplary g-g' cross-section in FIG. 22a.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in a direction parallel to a depth direction of a semiconductor substrate is referred to as "above", and the other side is referred to as "below". One of two principal surfaces of a substrate, a layer or some other member is referred to as an upper surface, and the other surface is referred to as a lower surface. The "above" and "below" directions are not limited by the direction of gravity or a direction of attachment to a substrate or the like at the time of implementation of a semiconductor device.

In the present specification, technical matters may be described using orthogonal coordinate axes of X-axis, Y-axis and Z-axis. In the present specification, a plane parallel to an upper surface of the semiconductor substrate is regarded as XY-plane, and the depth direction of the semiconductor substrate is regarded as the Z-axis.

Although in each example shown, the first conductivity type is N-type, and second conductivity type is P-type, the first conductivity type may be P-type, and the second conductivity type may be N-type. In this case, conductivity types of substrates, layers, regions and the like in each example have opposite polarities, respectively.

Figure 1A:
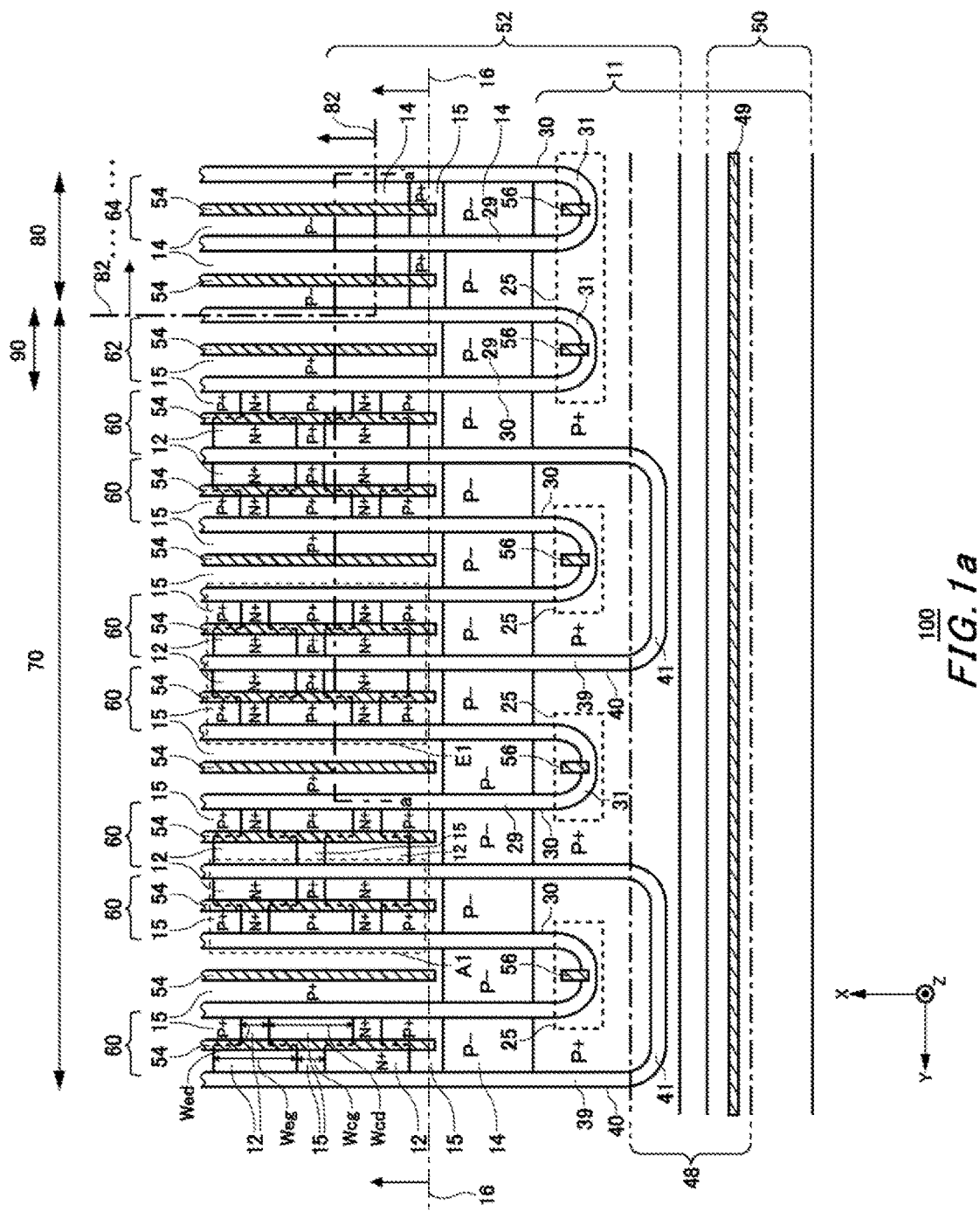
FIG. 1a partially illustrates an upper surface of a semiconductor device 100 according to an embodiment of the present invention.

FIG. 1a partially illustrates an upper surface of a semiconductor device 100 according to an embodiment of the present invention. The semiconductor device 100 in the present example is a semiconductor chip that includes a transistor portion 70 and a diode portion 80. The transistor portion 70 includes transistors such as IGBTs. The diode portion 80 includes diodes such as FWD s (Free Wheel Diode) provided being lined up with the transistor portion 70 on an upper surface of a semiconductor substrate. The transistor portion 70 includes a boundary portion 90 that is positioned in a boundary between the transistor portion 70 and the diode portion 80. FIG. 1a shows a chip upper surface around a chip end portion and omits the other regions.

Also, FIG. 1a shows an active region of the semiconductor substrate in the semiconductor device 100, which may have an edge termination structure portion surrounding the active region. The active region refers to a region where current flows when the semiconductor device 100 is controlled in ON state. The edge termination structure portion relaxes electric field concentration on the upper surface side of the semiconductor substrate. The edge termination structure portion has, for example, a guard ring, a field plate, a resurf, and a structure of combination thereof.

The semiconductor device 100 in the present example includes first gate trench portions 40, dummy trench portions 30, a well region 11, emitter regions 12, base regions 14, and second conductivity type regions, and they are provided inside the semiconductor substrate and exposed on the upper surface of the semiconductor substrate. The second conductivity type region is a region of P-type exposed on the upper surface of the semiconductor substrate in a mesa portion. The second conductivity type region may be a contact region 15, as an example. The contact regions 15 may be a region contacting with the emitter regions 12, as an example, to allow resistance of paths where carriers of the same conductivity type as that of the base region pass through to get lower than that of the base region 14. Also, the semiconductor device 100 in the present example includes an emitter electrode 52 and a gate metal layer 50 which are provided above the upper surface of the semiconductor substrate. The emitter electrode 52 and the gate metal layer 50 are provided separately from each other.

An interlayer dielectric film is formed between the upper surface of the semiconductor substrate, and the emitter electrode 52 and the gate metal layer 50, but this is omitted in FIG. 1a. In the interlayer dielectric film in the present example, contact holes 56, contact holes 49 and contact holes 54 are formed penetrating the interlayer dielectric film.

Also, the emitter electrode 52 is connected to dummy conductive portions in the dummy trench portions 30 through the contact holes 56. Connection portions 25 which are formed of conductive material such as polysilicon or the like doped with impurities may be provided between the emitter electrode 52 and the dummy conductive portions. An insulating film such as an oxide film is formed between the connection portions 25 and the upper surface of the semiconductor substrate.

The gate metal layer 50 contacts with the gate runner 48 through the contact holes 49. The gate runner 48 is formed of polysilicon or the like doped with impurities. The gate runner 48 is connected to gate conductive portions in the first gate trench portions 40 on the upper surface of the semiconductor substrate. The gate runner 48 is not connected to the dummy conductive portions in the dummy trench portion 30. The gate runner 48 in the present example is formed from below the contact holes 49 to an edge portion of the first gate trench portion 40. An insulating film such as an oxide film or the like is formed between the gate runner 48 and the upper surface of the semiconductor substrate. In the edge portion of the first gate trench portion 40, the gate conductive portion is exposed on the upper surface of the semiconductor substrate. The first gate trench portions 40 contact with the gate runner 48 at the exposed portion of the gate conductive portions.

The emitter electrode 52 and the gate metal layer 50 are formed of metal-contained material. For example, at least a part of region of each electrode is formed of aluminum or aluminum-silicon alloy. Each electrode may have, in an under layer of the region formed of aluminum or the like, barrier metal which is formed of titanium, titanium compounds, or the like. Also, each electrode may have a plug formed of tungsten or the like in the contact hole.

One or more first gate trench portions 40 and one or more dummy trench portions 30 are arrayed at predetermined intervals along a predetermined array direction (Y-axis direction, in the present example). The first gate trench portions 40 in the present example may have two extending portions 39 which are parallel to the upper surface of the semiconductor substrate and extend along an extending direction perpendicular to the array direction (X-axis direction, in the present example), and a connecting portion 41 to connect the two extending portions 39. Preferably, at least part of the connecting portion 41 is formed in a curved shape. Connecting end portions of the two extending portions 39 of the first gate trench portions 40 can relax the electric field concentration at the end portions of the extending portions 39. The gate runner 48 may be connected to the gate conductive portion at the connecting portion 41 of the first gate trench portion 40.

The dummy trench portions 30 in the present example, like the first gate trench portions 40, may have U-shapes on the upper surface of the semiconductor substrate. That is, the dummy trench portion 30 in the present example may have two extending portions 29 extending along the extending direction, and connecting portions 31 to connect the two extending portions 29.

The emitter electrode 52 is formed above the first gate trench portions 40, the dummy trench portions 30, the well region 11, the emitter regions 12, the base regions 14 and the contact regions 15. The contact region 15 and the well region 11 are of P(+)-type. The well region 11 is formed in a predetermined range from an end portion of the active region on a side where the gate metal layer 50 is provided. A diffusion depth of the well region 11 may be greater than those of the first gate trench portion 40 and the dummy trench portion 30. Part of regions of the first gate trench portion 40 and the dummy trench portion 30 which are closer to the gate metal layer 50 is formed in the well region 11. The bottoms of the end of the first gate trench portions 40 and the dummy trench portions 30 in the extending direction may be covered with the well region 11.

In the transistor portion 70, the contact hole 54 is formed above each region of the contact regions 15 and the emitter regions 12. In the diode portion 80, the contact holes 54 are formed above the base regions 14. Any contact hole 54 is not arranged above the base regions 14 and the well region 11 which are arranged on the both ends in X-axis direction.

In a direction parallel to the upper surface of the semiconductor substrate, mesa portions are provided contacting with the trench portions respectively, in Y-axis direction. The mesa portion may be a portion of the semiconductor substrate sandwiched by two trench portions that are next to each other, and may be a portion from the upper surface of the semiconductor substrate down to the depth of the bottom portion, which is the deepest portion, of each trench portion. Also, the extending portion 39 and the extending portion 29 of each trench portion may be regarded as one trench portion. That is, regions sandwiched by two of the extending portions 39 and two of the extending portions 29 may be regarded as mesa portions.

In the transistor portion 70 except the boundary portion 90, first transistor mesa portions 60 are provided contacting with the first gate trench portions 40. The first transistor mesa portions 60 may be sandwiched by the two first gate trench portions 40, and may be sandwiched by the first gate trench portion 40 and the dummy trench portion 30. In the boundary portion 90, boundary mesa portions 62 are provided contacting with the trench portions, respectively. Also, in the diode portion 80, the diode mesa portion 64 is provided in a region sandwiched by dummy trench portions 30 that are next to each other. At the both end portions of the first transistor mesa portion 60, the boundary mesa portion 62, and the diode mesa portion 64 in X-axis direction, the base regions 14 are provided, as an example. Note that FIG. 1a shows only one of the end portions in X-axis direction.

On the upper surface of the first transistor mesa portion 60, the emitter regions 12 of the first conductivity type are provided contacting with the first gate trench portion 40. The emitter region 12 in the present example is of N(+)-type. On the upper surface of the first transistor mesa portion 60, the emitter regions 12 may be provided contacting with the dummy trench portions 30 or spaced apart from them. The emitter region 12 in the present example is provided contacting with the dummy trench portion 30. The emitter region 12 may be formed so as to connect the first gate trench portion 40 and the dummy trench portion 30 which contact with each other such as to sandwich the first transistor mesa portion 60.

On the upper surface of the first transistor mesa portion 60, the contact regions 15 of the second conductivity type are provided. The contact region 15 may have higher doping concentration than that of the base region 14. The contact region 15 in the present example is of P(+)-type. On the upper surface of the first transistor mesa portion 60, the contact regions 15 may be provided contacting with the first gate trench portions 40 or spaced apart from them. The contact regions 15 in the present example are provided contacting with the first gate trench portions 40. On the upper surface of the first transistor mesa portion 60, the contact regions 15 may be provided contacting with the dummy trench portions 30 or spaced apart from them. The contact regions 15 in the present example are provided contacting with the dummy trench portions 30. The contact region may be formed so as to connect the first gate trench portion 40 and the dummy trench portion 30 which contact with each other such as to sandwich the first transistor mesa portion 60.

The width Weg of the emitter region 12 in X-axis direction contacting with the first gate trench portion 40 is provided so as to be greater than the width Wcg of the contact region 15 in X-axis direction contacting with the first gate trench portion 40. The width Weg may be two to five times greater than the width Wcg. That the width Weg is greater than the width Wcg includes a case where the width Wcg is 0, that is, the contact region 15 is spaced apart from the first gate trench portion 40.

Also, the width Wcd of the contact region 15 in X-axis direction contacting with the dummy trench portion 30 is provided so as to be greater than the width Wed of the emitter region 12 in X-axis direction contacting with the dummy trench portion 30. The width Wcd may be two to five times greater than the width Wed. In the first transistor mesa portion 60, the emitter regions 12 and the contact regions 15 may be alternately provided in the extending direction of the first gate trench portion 40. That, in the present specification, the emitter regions 12 and the contact regions 15 are alternately provided in the extending direction of the first gate trench portions 40 refers to that the emitter region 12 and the contact region 15 have, at at least one position in Y-axis direction in the first transistor mesa portion 60, p-n junctions having boundaries parallel to Y-axis direction, and are provided repeatedly along X-axis direction.

In the transistor portion 70, the contact regions 15 are provided, on the upper surface of the mesa portions, sandwiched by the dummy trench portions 30. The contact regions 15 may be provided in the entire regions that are sandwiched by the base regions 14 provided on the both end portions in X-axis direction.

On the upper surface of the boundary mesa portion 62, the contact region 15 having higher doping concentration than that of the base region 14 is provided. The contact region 15 in the present example is of P(+)-type. The contact regions 15 may be provided in the entire regions that are sandwiched by the base regions 14 provided on the both end portions of the boundary mesa portion 62 in X-axis direction.

In the semiconductor device 100 in the present example, the dummy trench portion 30 is provided in the diode portion 80. The linear extending portions 29 of each dummy trench portion 30 may be connected in the connecting portion 31. In a region sandwiched by the dummy trench portions 30, the diode mesa portion 64 is provided.

On the upper surface of the diode mesa portion 64, the contact region 15 is provided on the both end portions in X-axis direction. Also, the base region 14 is provided in regions sandwiched by the contact regions 15. The base region 14 may be provided in the entire regions sandwiched by the contact regions 15.

On the diode mesa portion 64, the emitter region 12 may not, or may be formed. In the present example, the emitter region 12 is not formed in the diode mesa portion 64. In the diode mesa portions 64, the contact region 15 or the base region 14 is formed from one dummy trench portion 30 to the other dummy trench portion 30, having the diode mesa portion 64 therebetween. That is, on the upper surface of the semiconductor substrate, the width of the diode mesa portion 64 in Y-axis direction is equal to the width, in Y-axis direction, of the contact region 15 or the base region 14 which is provided to the diode mesa portion 64.

The semiconductor device 100 has an accumulation region 16 of the first conductivity type below the base region 14 inside the semiconductor substrate. The accumulation region 16 in the present example is of N(+)-type. In FIG. 1a, a range where the accumulation region 16 is formed is indicated by a chain line. The accumulation region 16 is formed, in the top view of the semiconductor substrate, on +X-axis direction side from a region where the contact region 15 at an end in −X-axis direction and the contact hole 54 overlap. Note that the accumulation region 16 may not contact with the dummy trench portion 30.

The diode portion 80 has a cathode region 82 of the first conductivity type on the lower surface of the semiconductor substrate side. The cathode region 82 in the present example is of N(+)-type. In FIG. 1a, a region where the cathode region 82 is provided in the top view of the semiconductor substrate is indicated by a chain line part. The diode portion 80 may be a region obtained by projecting the cathode region 82 on the upper surface of the semiconductor substrate. The region obtained by projecting the cathode region 82 on the upper surface of the semiconductor substrate may be apart from the contact region 15 in +X-axis direction. In a region which contacts with the lower surface of the semiconductor substrate and where the cathode region 82 is not formed, a collector region of P(+)-type may be formed. The transistor portion 70 may be a region where the trench portion or the mesa portion is formed within the region obtained by projecting the collector regions on the upper surface of the semiconductor substrate.

Figure 1B:
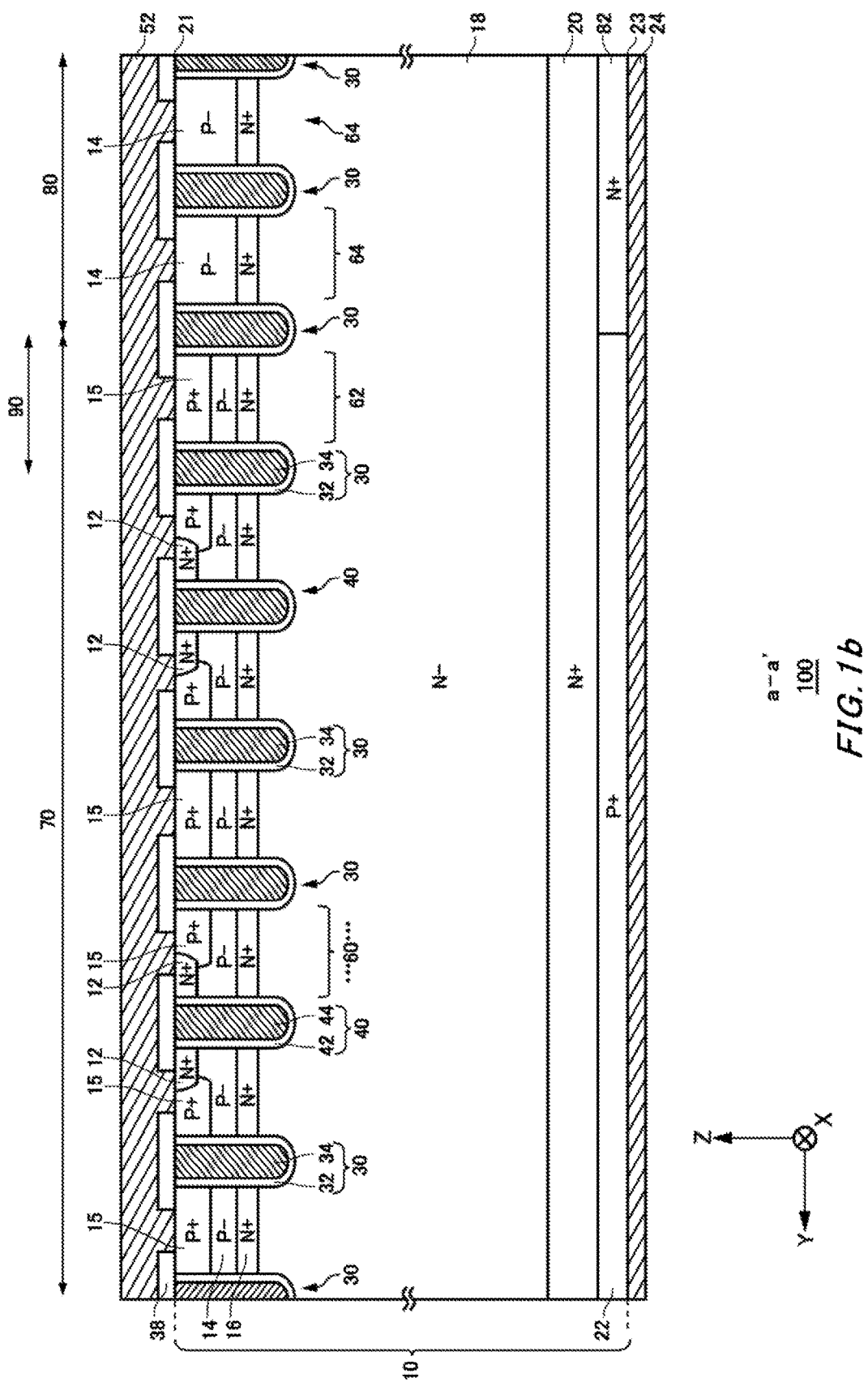

FIG. 1b illustrates an exemplary a-a' cross-section in FIG. 1a. The a-a' cross-section is YZ-plane which passes through the emitter regions 12, the contact regions 15 and the base regions 14 in the transistor portion 70 and the diode portion 80. The second conductivity type region may be the contact region 15, as an example. The semiconductor device 100 in the present example has the semiconductor substrate 10, the interlayer dielectric film 38, the emitter electrode 52 and the collector electrode 24 on the a-a' cross-section. The emitter electrode 52 is formed on an upper surface 21 of the semiconductor substrate 10 and an upper surface of the interlayer dielectric film 38. The collector electrode 24 is formed on a lower surface 23 of the semiconductor substrate 10. The emitter electrode 52 and the collector electrode 24 are formed of conductive material such as metal.

The semiconductor substrate 10 may be a silicon substrate, a silicon carbide substrate, or a nitride semiconductor substrate such as gallium nitride or the like. The semiconductor substrate 10 in the present example is a silicon substrate.

The semiconductor substrate 10 in the present example includes a drift region 18 of the first conductivity type. The drift region 18 in the present example is of N(−)-type. The drift region 18 in the semiconductor substrate 10 may be a remaining region where the other doping regions are not formed. That is, the doping concentration of the drift region 18 may be the doping concentration of the semiconductor substrate 10.

Below the drift region 18, a buffer region 20 of the first conductivity type is formed. The buffer region 20 in the present example is of N(+)-type. The doping concentration of the buffer region 20 is higher than the doping concentration of the drift region 18. The buffer region 20 may function as a field stop layer which prevents the depletion layers expanding from the lower surface side of base regions 14 from reaching the collector region 22 of P(+)-type and the cathode region 82 of N(+)-type.

The diode portion 80 has the cathode region 82 of N(+)-type below the buffer region 20. The cathode region 82 may be provided at approximately the same depth of that of the collector region 22 of the transistor portion 70. By the cathode region 82 being provided at the same depth of that of the collector region 22 of the transistor portion 70, when the transistor portion 70 of another semiconductor device 100 is turned off in a power conversion circuit such as an inverter, the diode portion 80 may function as a free wheeling diode (FWD) which flows free wheeling current conducting in the opposite direction.

In the transistor portion 70, below the buffer region 20, the collector region 22 of P(+)-type is formed. The collector region 22 may extend up to a region on a lower surface 23 side of the boundary mesa portion 62. The collector region 22 extending up to the lower surface 23 of the boundary mesa portion 62 can ensure the distance between the emitter region 12 of the transistor portion 70 and the cathode region 82 of the diode portion 80. This can prevent electrons implanted to the drift region 18 from a gate structure portion including the emitter regions 12 of the transistor portion 70 from flowing out to the cathode region 82 of the diode portion 80.

In the present example, as compared with a case where the cathode region 82 is provided down to directly under the boundary mesa portion 62, the distance between the contact region 15 of the boundary mesa portion 62 and the cathode region 82 of the diode portion 80 can also be made longer. This can reduce implantation of holes, when the diode portion 80 is conducted, from the contact region 15 having higher doping concentration than that of the base region 14 to the cathode region 82.

In the first transistor mesa portion 60 and the boundary mesa portion 62, the accumulation regions 16 of N(+)-type may be provided above the drift region 18. The accumulation region 16 is provided contacting with the first gate trench portion 40. The doping concentration of the accumulation region 16 is higher than the doping concentration of the drift region 18. The accumulation region 16 being provided can enhance a carrier injection enhancement effect (IE effect) to decrease an ON voltage.

In the first transistor mesa portion 60 and the boundary mesa portion 62, the base regions 14 of the second conductivity type are provided above the accumulation region 16. The base region 14 in the present example is of P(−)-type. The base region 14 is provided contacting with the first gate trench portion 40. Further, in the first transistor mesa portion 60, the emitter region 12 and the contact region 15 are provided between the base region 14 and the upper surface 21. The emitter regions 12 are provided contacting with the first gate trench portions 40. The contact regions 15 may be provided contacting with the dummy trench portions 30. The doping concentration of the emitter region 12 is higher than the doping concentration of the drift region 18. An example of a dopant of the emitter region 12 is arsenic (As).

In the boundary mesa portion 62, the contact region 15 of P(+)-type is provided above the accumulation region 16. The contact region 15 in the present example is provided contacting with the dummy trench portion 30. In the boundary mesa portion 62, the emitter region 12 may not be provided on the upper surface 21.

In diode mesa portion 64, the accumulation region 16 of N(+)-type may be provided above the drift region 18. Also, in the diode mesa portion 64, the base region 14 may be provided above the accumulation region 16. In the diode mesa portion 64, the emitter region 12 may not be provided in the upper surface 21 obtained by projecting the cathode region 82.

On the upper surface 21, one or more first gate trench portion(s) 40 and one or more dummy trench portion(s) 30 are formed. Each trench portion is provided from the upper surface 21 through the drift region 18. In regions where at least any of the emitter region 12, the contact region 15 and the accumulation region 16 is provided, trench portions each reach the drift region 18, penetrating these regions as well. A configuration where the trench portion penetrates the doping region is not limited to configurations which are manufactured in order of forming the trench portion after forming the doping region. A configuration where the doping region between the trench portions is formed after forming the trench portion is also included in the configuration where the trench portion penetrates the doping region.

The first gate trench portion 40 has the gate trench, the gate-insulating film 42, and the gate conductive portion 44 which are formed on the upper surface 21. The gate-insulating film 42 is formed covering the inner wall of the gate trench. The gate-insulating film 42 may be formed by oxidizing or nitriding a semiconductor that is the inner wall of the gate trench. The gate conductive portion 44 is formed inside the gate trench on an inner side relative to the gate-insulating film 42. The gate-insulating film 42 insulates the gate conductive portion 44 and the semiconductor substrate 10 from each other. The gate conductive portion 44 is formed of conductive material such as polysilicon or the like. The first gate trench portion 40 is covered with the interlayer dielectric film 38 on the upper surface 21.

The gate conductive portion 44 includes, in the depth direction of the semiconductor substrate 10, a region facing the neighboring base region 14 on the first transistor mesa portion 60 side, having the gate-insulating film 42 therebetween. When predetermined voltage is applied to the gate conductive portion 44, a channel of an inversion layer of electrons is formed on the surface layer of the boundary surface contacting with the gate trench of the base region 14.

In FIG. 1b, the dummy trench portion 30 may have the same structure as that of the first gate trench portion 40. The dummy trench portion 30 has a dummy trench, the dummy insulating film 32 and the dummy conductive portion 34 which are formed on the upper surface 21 side. The dummy insulating film 32 is formed covering an inner wall of the dummy trench. The dummy conductive portion 34 is formed inside the dummy trench and formed on an inner side relative to the dummy insulating film 32. The dummy insulating film 32 insulates the dummy conductive portion 34 and the semiconductor substrate 10 from each other. The dummy trench portion 30 is covered with the interlayer dielectric film 38 on the upper surface 21.

Figure 1C:
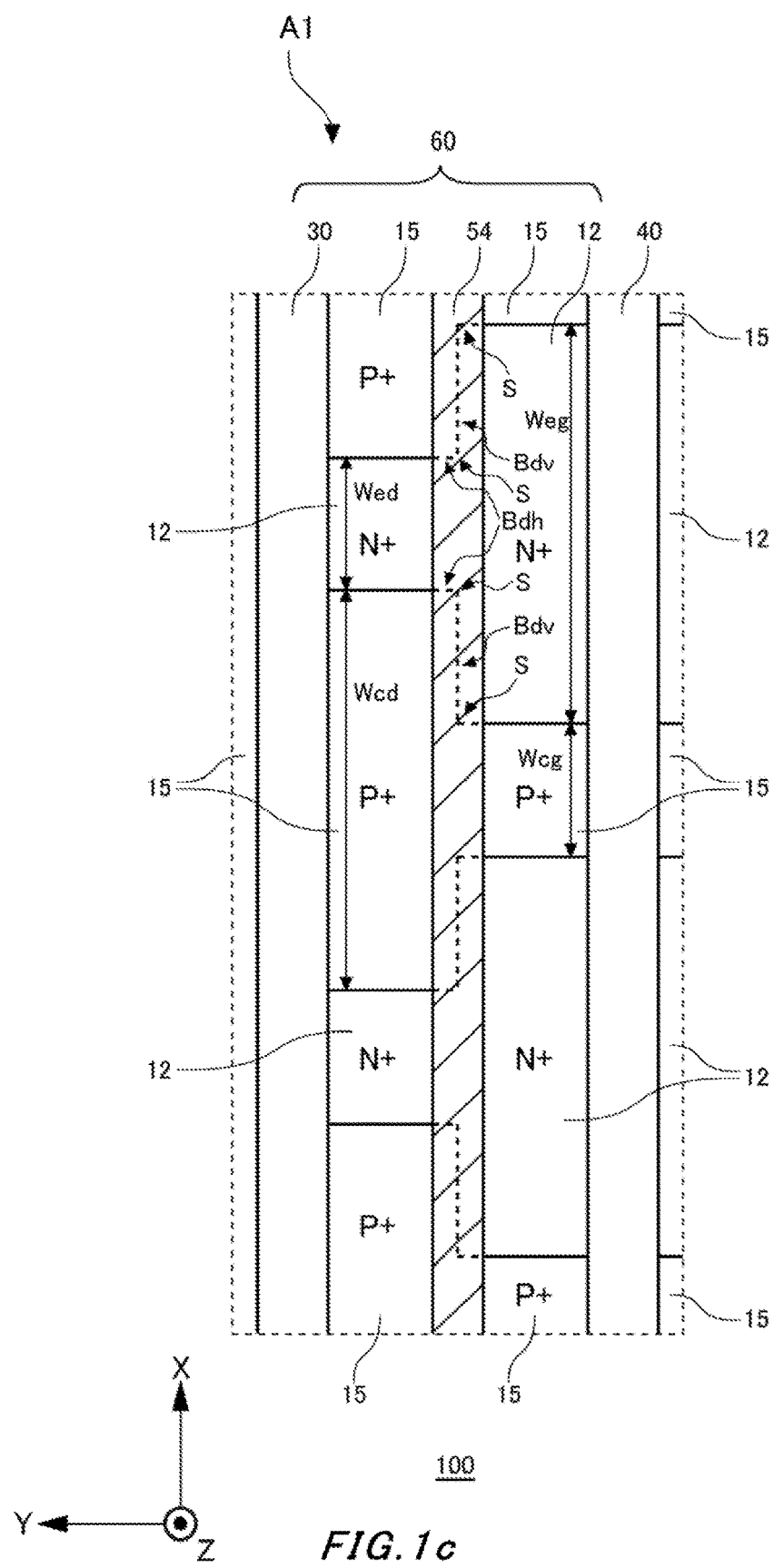

FIG. 1c is an enlarged view of the region A1 in FIG. 1a. The region A1 illustrates a part of a configuration, being arrayed under the same rule in FIG. 1a. As shown in FIG. 1c, in the semiconductor device 100 in the present example, the emitter regions 12 and the contact regions 15 are provided contacting with the first gate trench portion 40 on the upper surface of the first transistor mesa portion 60. The emitter regions 12 and the contact regions 15 are alternately provided in the extending direction of the first gate trench portion 40. Also, the emitter regions 12 and the contact regions 15 are provided contacting with the dummy trench portion 30 on the upper surface of the first transistor mesa portion 60.

In the semiconductor device 100 in the present example, as shown in FIG. 1c, the width of the emitter region 12 in X-axis direction may be changed stepwise on XY-plane. Also, the width Weg of the emitter region 12 in X-axis direction contacting with the first gate trench portion 40 may be greater than the width Wed of the emitter region 12 in X-axis direction contacting with the dummy trench portion 30. The width Weg may be twice to five times greater than the width Wed. Also, the width Wcd of the contact region 15 in X-axis direction contacting with the dummy trench portion 30 may be greater than the width Wcg of the contact region 15 in X-axis direction contacting with the first gate trench portion 40. The width Wcd may be twice to five times greater than the width Wcg.

In the semiconductor device 100 in the present example, the emitter regions 12 may contact with the dummy trench portion 30. Also, the contact regions 15 may contact with the first gate trench portion 40.

The width Weg of the emitter region 12 in X-axis direction contacting with the first gate trench portion 40 is, as shown in FIG. 1c, greater than the width Wcg of the contact region 15 in X-axis direction contacting with the first gate trench portion 40. The width Weg may be twice to five times greater than the width Wcg. Making the width Weg great can make saturation current of the transistor portion 70 great.

The width Wcd of the contact region 15 in X-axis direction contacting with the dummy trench portion 30 is, as shown in FIG. 1c, greater than the width Wed of the emitter region 12 in X-axis direction contacting with the dummy trench portion 30. The width Wcd may be twice to five times greater than the width Wed. Making Wcd great can make latch-up resistance of the transistor portion 70 great.

The semiconductor device 100 in the present example preferentially improves saturation current characteristics, as well as the latch-up resistance of the transistor portion 70 on a side contacting with the first gate trench portion 40 by satisfying the size relationship of the width Weg and the width Wcg as described above. Also, by satisfying the size relationship of the width Wcd and the width Wed as described above, the latch-up resistance of the transistor portion 70 is improved on a side contacting with the dummy trench portion 30. That is, the semiconductor device 100 in the present example can make a balance between the saturation current characteristics and the latch-up resistance better in the entire transistor portion 70.

In the emitter region 12, an end portion S is an end of the emitter region 12 where the width of the emitter region 12 in X-axis direction is changed stepwise. As shown in FIG. 1c, the end portion S may be arranged below the contact hole 54. Also, as shown in FIG. 1c, the emitter regions 12 and the contact regions 15 may be next to and contact with each other below the contact hole 54 in a direction from the dummy trench portion 30 to the first gate trench portion 40. That is, the emitter regions 12 and the contact regions 15 may form p-n junctions that have boundaries Bdv parallel to X-axis direction.

The end portion S and the boundary Bdv existing below the contact hole 54 can ensure distances in Y-axis direction from the first gate trench portion 40 to the end portion S and from the same to the boundary Bdv. This can prevent a dopant of the contact region 15 from reaching the first gate trench portion 40 and prevent and reduce variance in the threshold voltage of the transistor portion 70. Also, an area of the contact region 15 contacting with the contact hole 54 can be ensured, and thus carriers can be easily extracted.

As shown in FIG. 1c, the emitter regions 12 and the contact regions 15 may be next to and contact with each other below the contact hole 54 in the extending direction of the first gate trench portion 40. That is, the emitter regions 12 and the contact regions 15 may form p-n junctions that have boundaries Bdh parallel to Y-axis direction. By the boundary Bdh existing below the contact hole 54, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, as compared with a comparative example in FIG. 14a described below.

Figure 2A:
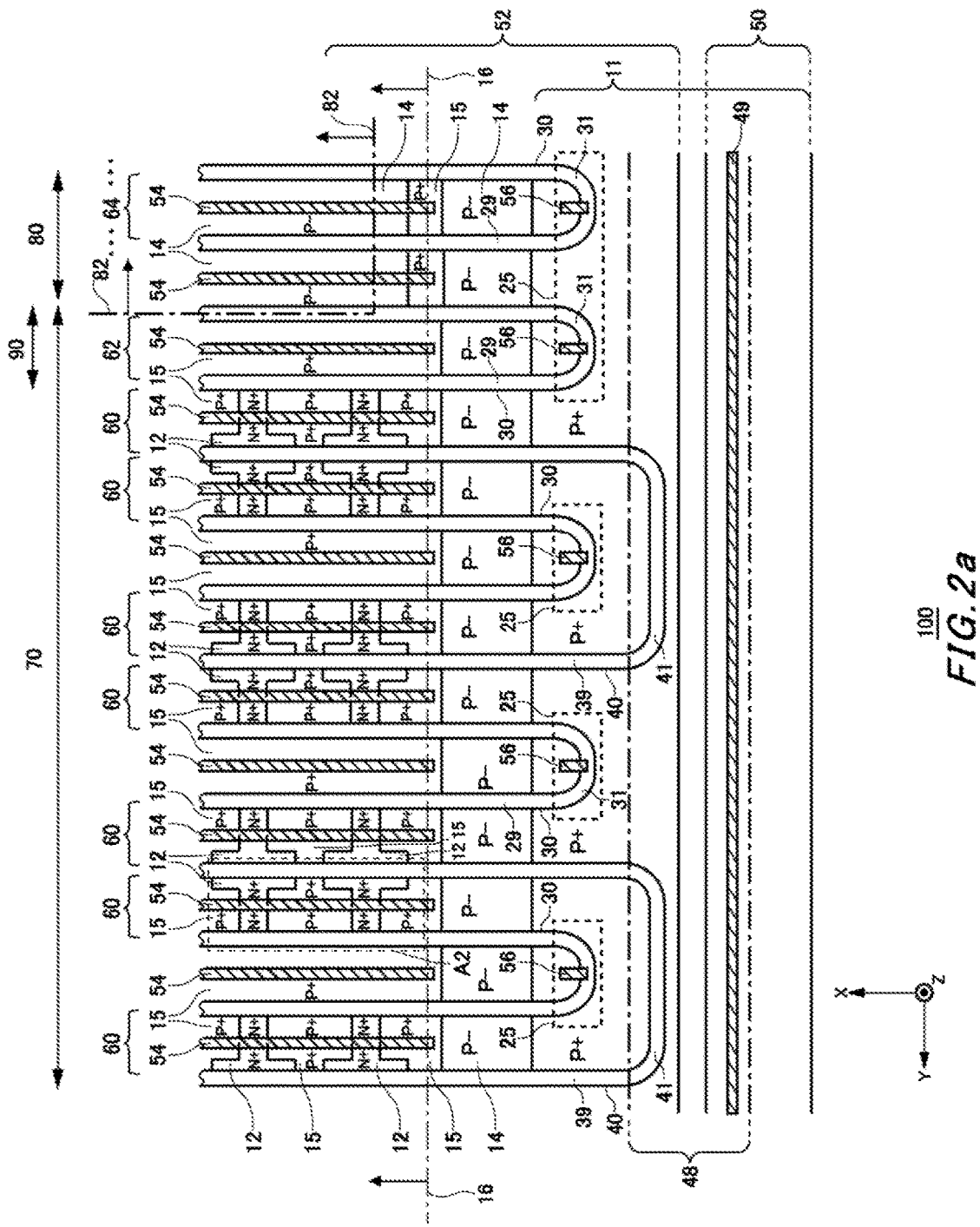
FIG. 2a partially illustrates an upper surface of a semiconductor device 100 according to another embodiment of the present invention.

FIG. 2a partially illustrates an upper surface of a semiconductor device 100 according to still another embodiment of the present invention. The semiconductor device 100 shown in FIG. 2a is different from the semiconductor device 100 shown in FIG. 1a in a point where boundaries between the emitter regions 12 and the contact regions 15 that exist below the contact hole 54 exist closer to the first gate trench portion 40.

Figure 2B:
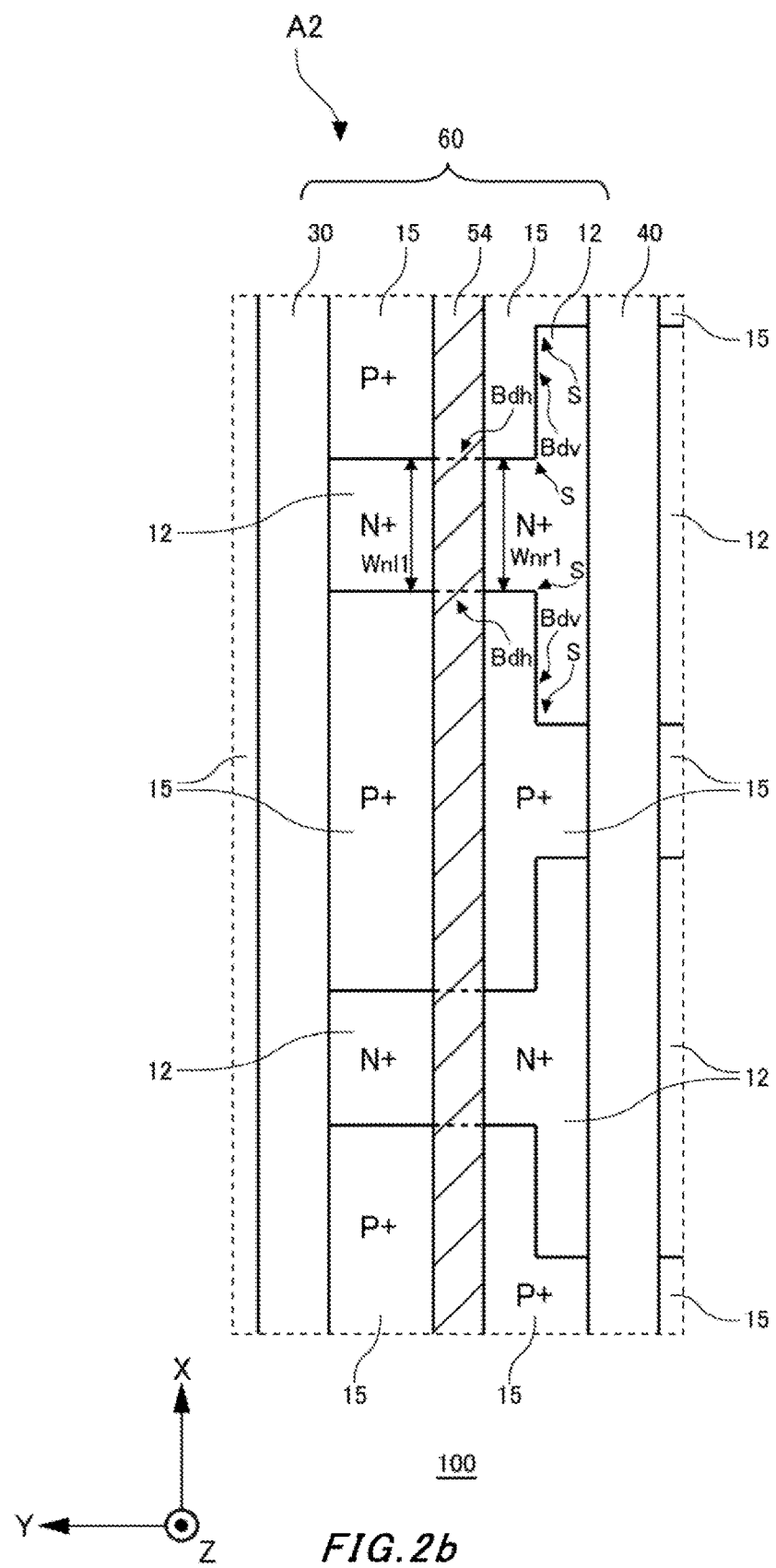

FIG. 2b is an enlarged view of a region A2 in FIG. 2a. The region A2 illustrates a part of a configuration, being arrayed under the same rule in FIG. 2a. The semiconductor device 100 shown in FIG. 2b is different from the semiconductor device 100 shown in FIG. 1c in a point where the end portions S are arranged, in the top view of the semiconductor substrate 10, between the contact hole 54 and the first gate trench portion 40, and there is no boundary Bdv below the contact hole 54.

The width Wnl1 of the emitter region 12 in X-axis direction in the positive side in Y-axis direction of the contact hole 54 and the width Wnr1 of the emitter region 12 in X-axis direction in the negative side in Y-axis direction thereof may be equal to each other. Here, that the width Wnl1 and width Wnr1 are equal to each other refers to a case where the width Wnl1 and the width Wnr1 match each other within an error range of 5% or less. In case where the equivalence such as "equal", "uniform", "the same" and the like are described in the present specification, they may include an error of 5% or less. Also, the width Wnl1 and the width Wnr1 may be equal to or different from the width Wed in FIG. 1c.

In the semiconductor device 100 in the present example, the ratio of the contact region 15 to the first transistor mesa portion 60 is greater than that of the semiconductor device 100 shown in FIG. 1c. This can make, as compared with the semiconductor device 100 shown in FIG. 1c, the semiconductor device 100 in the present example a semiconductor device 100 that focuses on the latch-up resistance, as well as the saturation current characteristics.

As shown in FIG. 2b, the emitter regions 12 and the contact regions 15 form, below the contact hole 54, p-n junctions that have boundaries Bdh parallel to Y-axis direction. Therefore, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, as compared with the semiconductor device 100 in FIG. 1c.

The distances in Y-axis direction from the first gate trench portion 40 to the end portion S and from the same to the boundary Bdv respectively are values such that the dopant of the contact region 15 does not reach the first gate trench portion 40. Particularly, depending on the variance at the time of manufacturing, the minimum values of the distances in Y-axis direction from the first gate trench portion 40 to the end portion S and from the same to the boundary Bdv only have to be greater than zero. This can prevent a dopant of the contact region 15 from reaching the first gate trench portion 40 and prevent and reduce variance in the threshold voltage of the transistor portion 70.

Figure 3A:
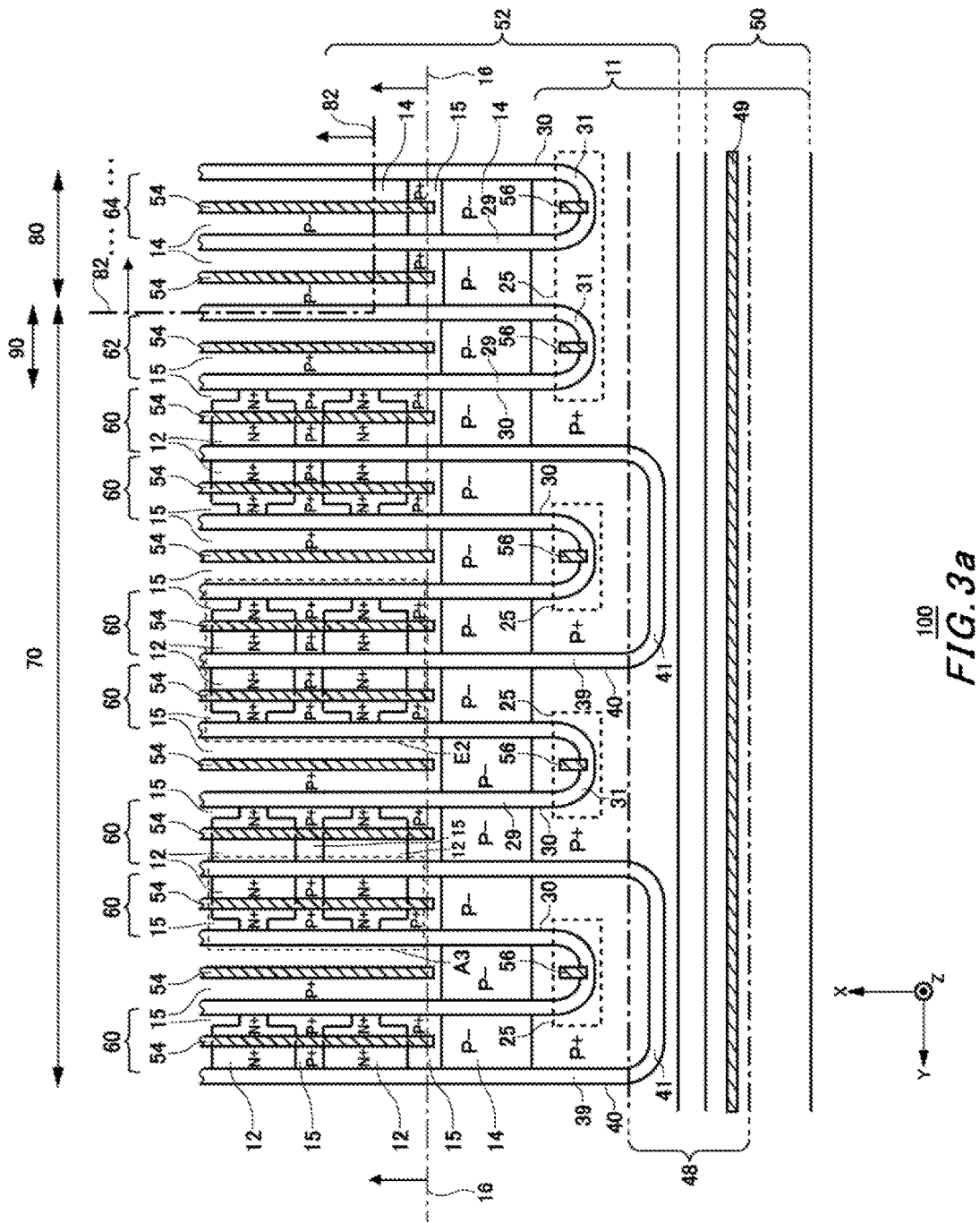
FIG. 3a partially illustrates an upper surface of a semiconductor device 100 according to still another embodiment of the present invention.

FIG. 3a partially illustrates an upper surface of a semiconductor device 100 according to still another embodiment of the present invention. The semiconductor device 100 shown in FIG. 3a is different from the semiconductor device 100 shown in FIG. 1a in a point where boundaries between the emitter regions 12 and the contact regions 15 that exist below the contact hole 54 exist closer to the dummy trench portion 30.

Figure 3B:
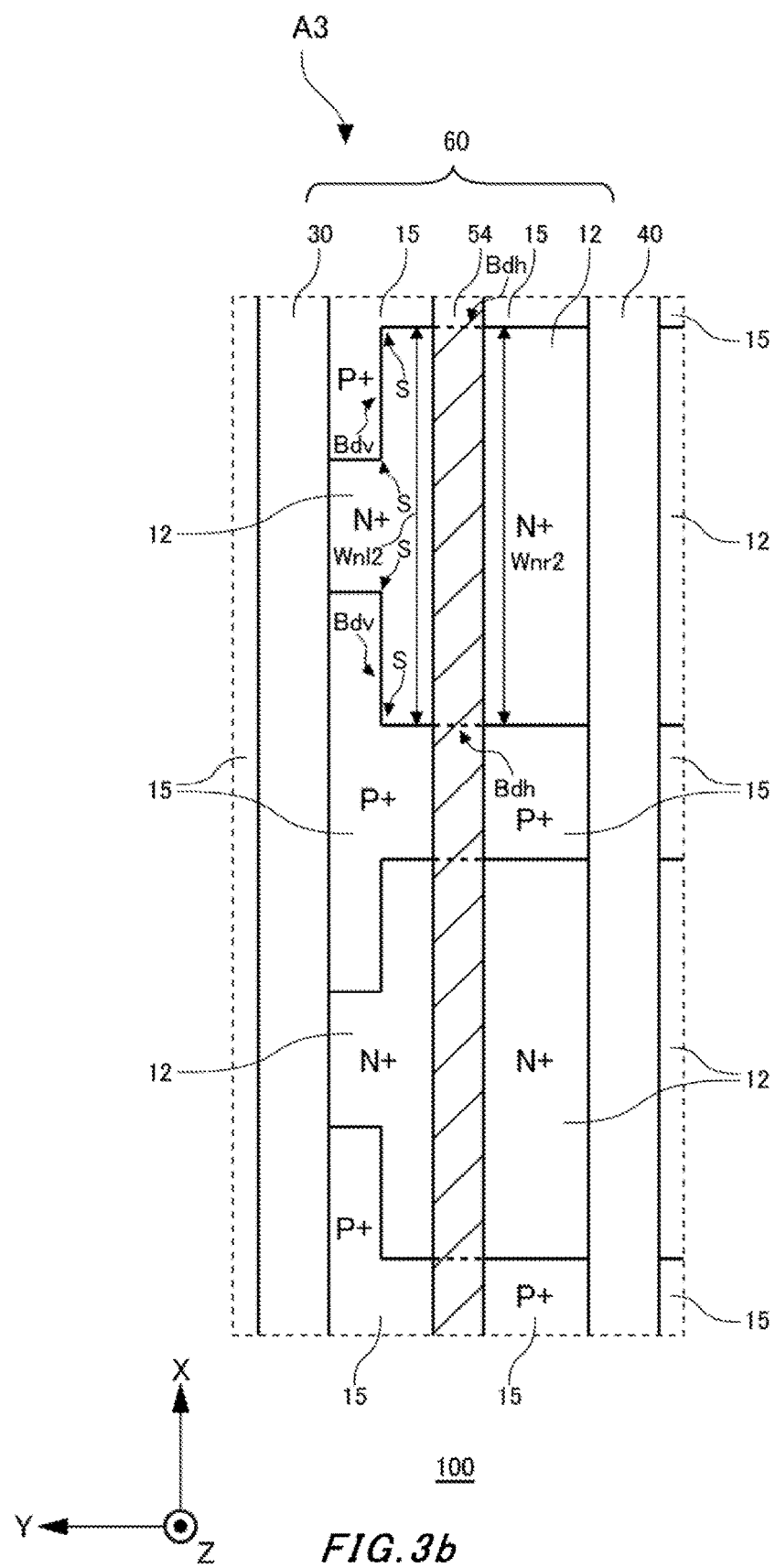

FIG. 3b is an enlarged view of the region A3 in FIG. 3a. The region A3 illustrates a part of a configuration, being arrayed under the same rule in FIG. 3a. The semiconductor device 100 shown in FIG. 3b is different from the semiconductor device 100 shown in FIG. 1c in a point where the end portions S are arranged, in the top view of the semiconductor substrate 10, between the contact hole 54 and the dummy trench portion 30, and there is no boundary Bdv below the contact hole 54.

The width Wnl2 of the emitter region 12 in X-axis direction on the positive side in Y-axis direction of the contact hole 54 and the width Wnr2 of the emitter region 12 in X-axis direction in the negative side in Y-axis direction thereof may be equal to each other. Also, the width Wnl 2 and the width Wnr 2 may be equal to or different from the width Weg in FIG. 1c.

In the semiconductor device 100 in the present example, the ratio of the contact region 15 to the first transistor mesa portion 60 is smaller than that of the semiconductor device 100 shown in FIG. 1c. This can make, as compared with the semiconductor device 100 shown in FIG. 1c, the semiconductor device 100 in the present example as a semiconductor device 100 that focuses on decrease in the contact resistance between the emitter region 12 and the emitter electrode, as well as the latch-up resistance.

In the semiconductor device 100 in the present example, the end portions S are arranged between the contact hole 54 and the dummy trench portion 30 in the top view of the semiconductor substrate 10, and thus the distances in Y-axis direction from the first gate trench portion 40 to the end portion S and from the same to the boundary Bdv can be ensured more, as compared with the semiconductor device 100 in FIG. 1c. This can prevent a dopant of the contact region 15 from reaching the first gate trench portion 40 and further prevent and reduce variance in the threshold voltage of the transistor portion 70, as compared with the semiconductor device 100 shown in FIG. 1c.

As shown in FIG. 3b, the emitter regions 12 and the contact regions 15 form, below the contact hole 54, p-n junctions that have boundaries Bdh parallel to Y-axis direction. Therefore, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, like the semiconductor device 100 in FIG. 2b.

Figure 4A:
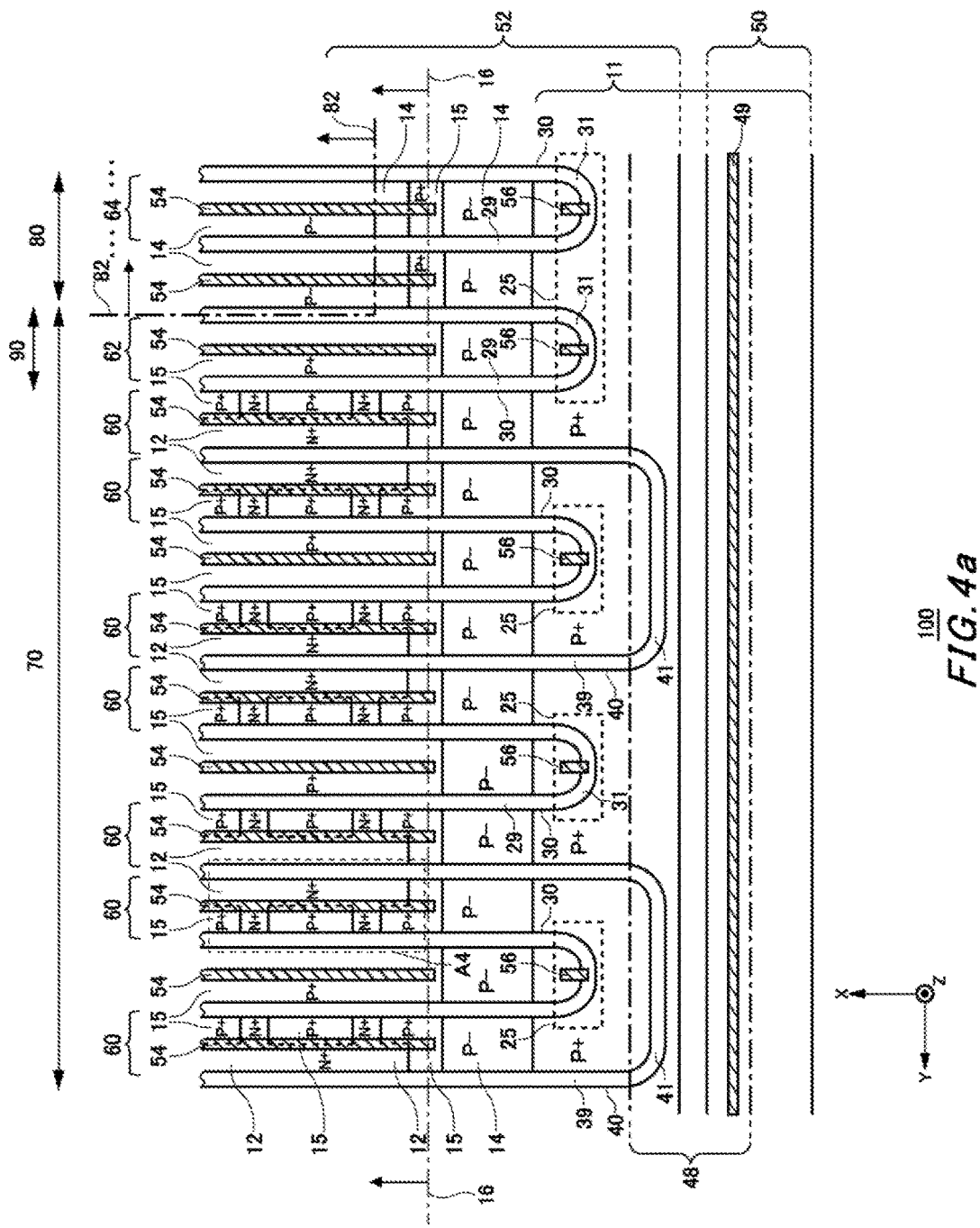
FIG. 4a partially illustrates an upper surface of a semiconductor device 100 according to still another embodiment of the present invention.

FIG. 4a partially illustrates an upper surface of a semiconductor device 100 according to still another embodiment of the present invention. The semiconductor device 100 shown in FIG. 4a is different from the semiconductor device 100 shown in FIG. 1a in a point where only the emitter region 12 is provided contacting with the first gate trench portion 40, except the most-negative-side region in X-axis direction.

Figure 4B:
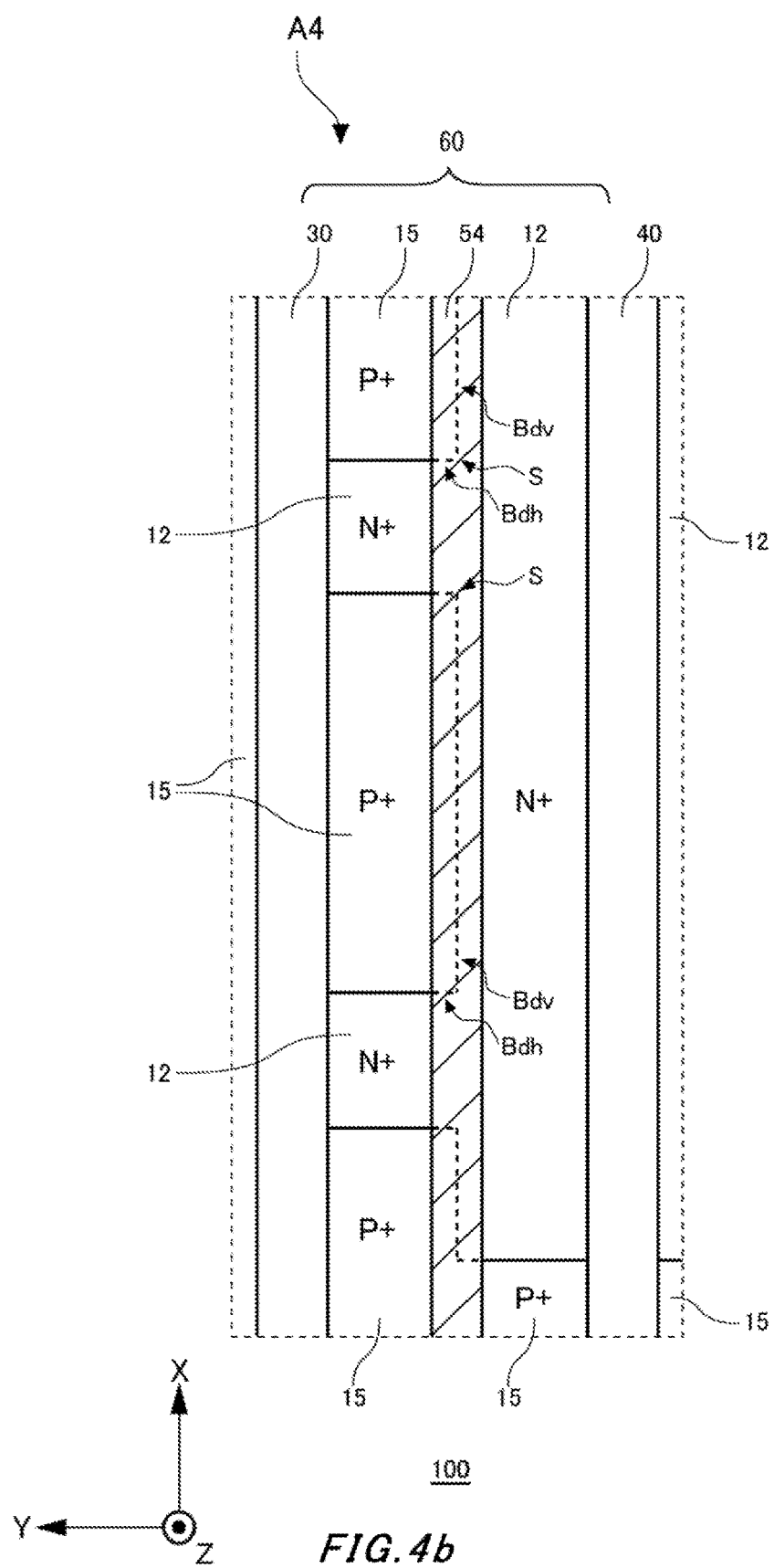

FIG. 4b is an enlarged view of the region A4 in FIG. 4a. The region A4 illustrates a part of a configuration, being arrayed under the same rule in FIG. 4a. The semiconductor device 100 shown in FIG. 4b is different from the semiconductor device 100 shown in FIG. 1c in a point where the emitter regions 12 are continuously arranged in X-axis direction contacting with the first gate trench portion 40, except the most-negative-side region in X-axis direction.

That the emitter region 12 is continuously arranged in X-axis direction contacting with the first gate trench portion 40 refers to that, on the upper surface of the first transistor mesa portion 60, except the most-negative-side region in X-axis direction and the most-positive-side region in X-axis direction that is not shown, only the emitter region 12 contacts with the first gate trench portion 40 in X-axis direction.

In the semiconductor device 100 in the present example, the emitter region 12 is continuously arranged in X-axis direction contacting with the first gate trench portion 40, and thus the saturation current characteristics of the transistor portion 70 can be more improved, as compared with the semiconductor device 100 shown in FIG. 1c. Also, in the semiconductor device 100 in the present example, the emitter region 12 is continuously arranged in X-axis direction contacting with the first gate trench portion 40, and thus the transconductance of the transistor portion 70 can be made higher, as compared with the semiconductor device 100 shown in FIG. 1c. This can make lower the resistance of the transistor portion 70.

As shown in FIG. 4b, the emitter regions 12 and the contact regions 15 may form, below the contact hole 54, p-n junctions that have boundaries Bdv in X-axis direction. The boundary Bdv existing below the contact hole 54 can ensure the distance in Y-axis direction from the first gate trench portion 40 to the boundary Bdv. This can prevent a dopant of the contact region 15 from reaching the first gate trench portion 40 and prevent and reduce variance in the threshold voltage of the transistor portion 70.

As shown in FIG. 4b, the emitter regions 12 and the contact regions 15 may form, below the contact hole 54, p-n junctions that have boundaries Bdh in Y-axis direction. By the boundary Bdh existing below the contact hole 54, even when the contact hole 54 is shifted, due to the manufacturing variance, from the middle of the first transistor mesa portion 60 to the positive side in Y-axis direction, the variance in a contact area between the emitter region 12 and the contact and the variance in a contact area between the contact region 15 and the contact can be prevented and reduced.

Figure 5A:
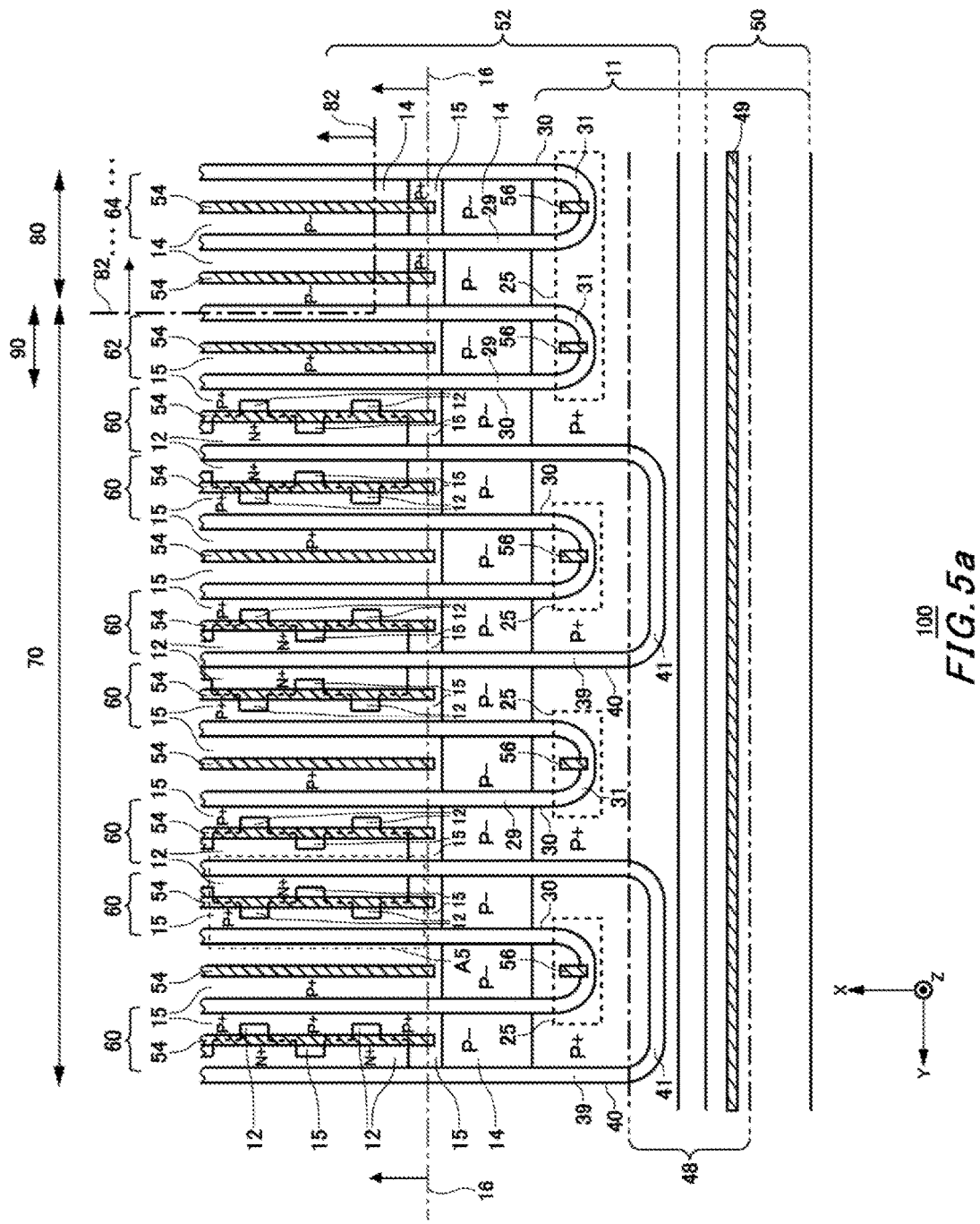
FIG. 5a partially illustrates an upper surface of a semiconductor device 100 according to still another embodiment of the present invention.

FIG. 5a partially illustrates an upper surface of a semiconductor device 100 according to still another embodiment of the present invention. The semiconductor device 100 shown in FIG. 5a is different from the semiconductor device 100 shown in FIG. 1a in a point where the emitter regions 12 are spaced apart from the dummy trench portions 30.

Figure 5B:
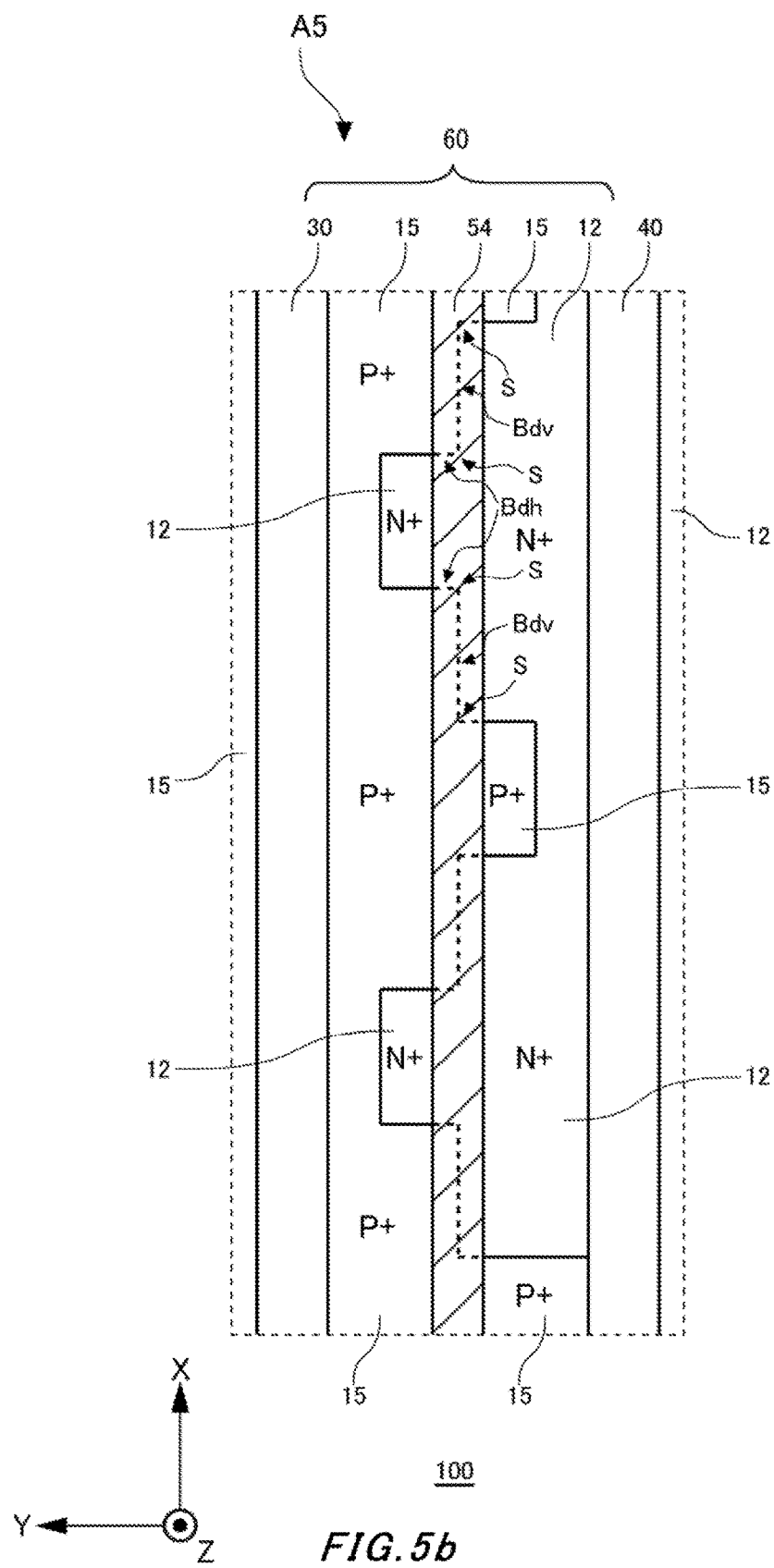

FIG. 5b is an enlarged view of the region A5 in FIG. 5a. The region A5 illustrates a part of a configuration, being arrayed under the same rule in FIG. 5a. The semiconductor device 100 shown in FIG. 5b is different from the semiconductor device 100 shown in FIG. 1c in a point where the emitter region 12 is spaced apart from the dummy trench portion 30. Also, the semiconductor device 100 shown in FIG. 5b is different from the semiconductor device 100 shown in FIG. 1c in a point where the contact region 15 is spaced apart from the first gate trench portion 40.

The semiconductor device 100 shown in FIG. 5b has, below the contact hole 54, the same configuration as that of the semiconductor device 100 shown in FIG. 1c. Like the semiconductor device 100 shown in FIG. 1c, this can prevent and reduce the variance in the threshold voltage of the transistor portion 70. Also, this can prevent and reduce the variance in the contact area between the emitter region 12 and the contact and the variance in the contact area between the contact region 15 and the contact.

In the semiconductor device 100 in the present example, like the semiconductor device 100 shown in FIG. 4b, the emitter region 12 is continuously arranged in X-axis direction contacting with the first gate trench portion 40. This can improve more the saturation current characteristics of the transistor portion 70, as compared with the semiconductor device 100 shown in FIG. 1c. Also, the transconductance of the transistor portion 70 can be made higher to make lower the resistance of the transistor portion 70.

In the semiconductor device 100 in the present example, the ratio of the contact region 15 to the first transistor mesa portion 60 is greater than that of the semiconductor device 100 shown in FIG. 1c. This can make, as compared with the semiconductor device 100 shown in FIG. 1c, the semiconductor device 100 in the present example a semiconductor device 100 that focuses on the latch-up resistance, as well as the saturation current characteristics.

Figure 6A:
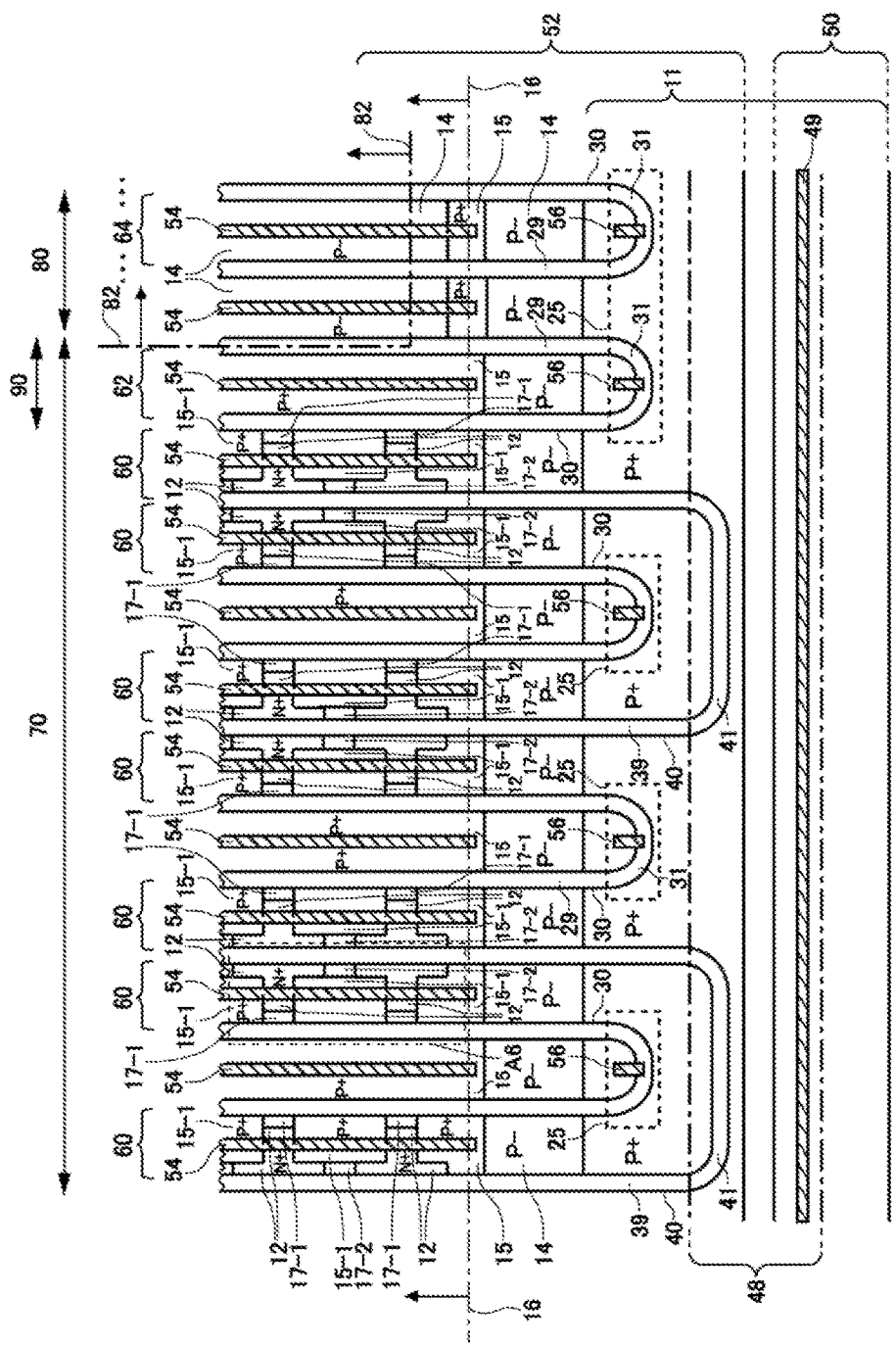
FIG. 6a partially illustrates an upper surface of a semiconductor device 100 according to still another embodiment of the present invention.

FIG. 6a partially illustrates an upper surface of a semiconductor device 100 according to still another embodiment of the present invention. The semiconductor device 100 shown in FIG. 6a is different from the semiconductor device 100 shown in FIG. 2a in a point where the second conductivity type regions further have first intermediate regions 17-1. Also, the semiconductor device 100 shown in FIG. 6a is different from the semiconductor device 100 shown in FIG. 2a in a point where the second conductivity type regions have contact regions 15-1 of the second conductivity type and second intermediate regions 17-2 of the second conductivity type.

Figure 6B:
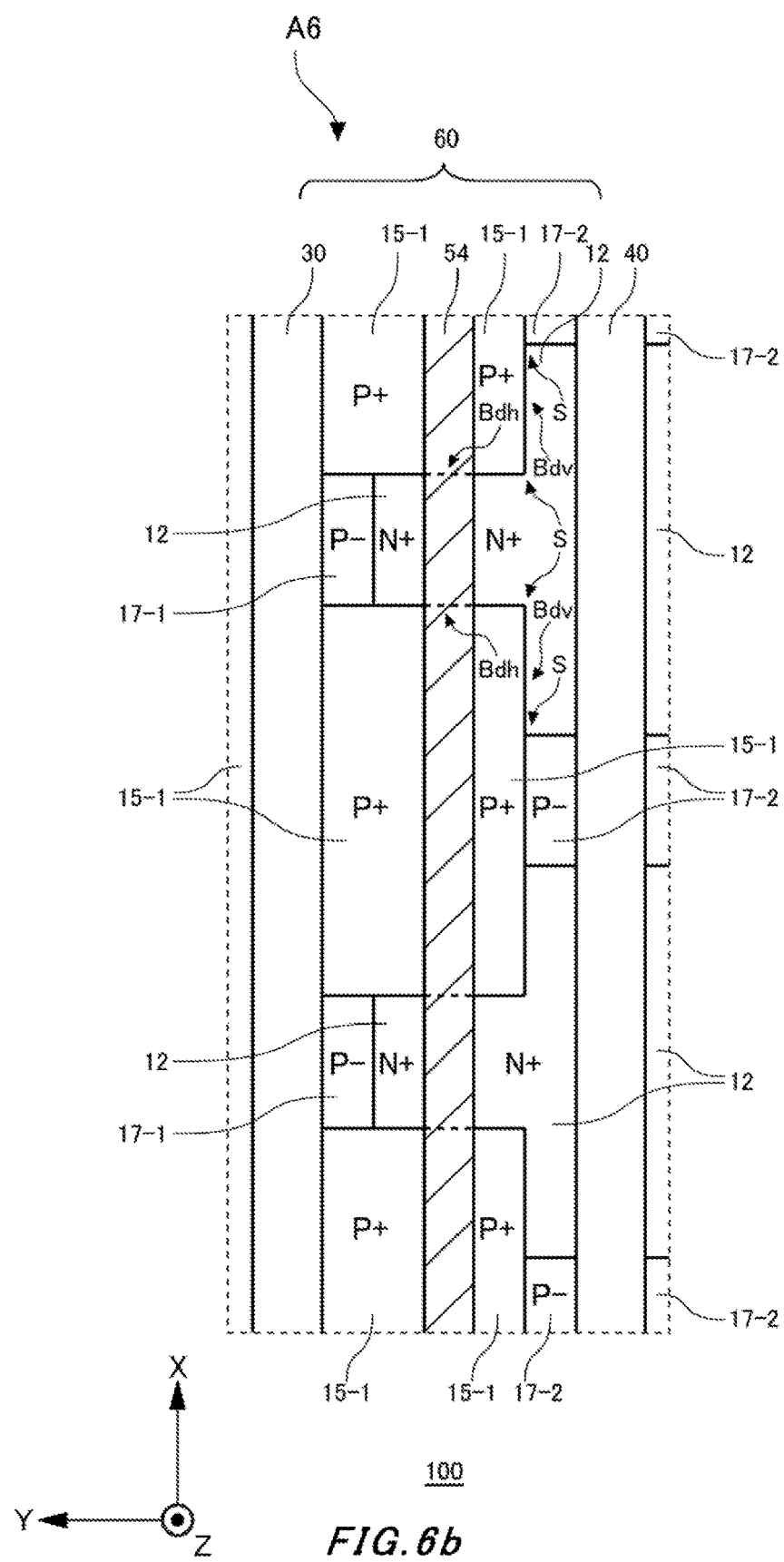

FIG. 6b is an enlarged view of the region A6 in FIG. 6a. The region A6 illustrates a part of a configuration, being arrayed under the same rule in FIG. 6a. The semiconductor device 100 shown in FIG. 6b is different from the semiconductor device 100 shown in FIG. 2b in a point where the second conductivity type region further has the first intermediate regions 17-1. Also, the semiconductor device 100 shown in FIG. 6b is different from the semiconductor device 100 shown in FIG. 2b in a point where the second conductivity type region has the contact regions 15-1 of the second conductivity type and the second intermediate regions 17-2 of the second conductivity type.

The contact region 15-1 in the present example is of P(+)-type. The first intermediate region 17-1, the contact region 15-1, and the second intermediate region 17-2 are examples of the second conductivity type region.

The first intermediate region 17-1 may be sandwiched by the dummy trench portion 30 and the emitter region 12 and contact with both the dummy trench portion 30 and the emitter region 12. The doping concentration of the first intermediate region 17-1 may be lower than the doping concentration of the contact region 15. Alternatively, the doping concentration of the first intermediate region 17-1 may be equal to the doping concentration of the base region 14.

The second intermediate region 17-2 may be sandwiched by the first gate trench portion 40 and the contact region 15-1 contacting with both the first gate trench portion 40 and the contact region 15-1. The doping concentration of the contact region 15-1 may be equal to the doping concentration of the contact region 15. The doping concentration of the second intermediate region 17-2 may be lower than the doping concentration of the contact region 15-1. The doping concentration of the second intermediate region 17-2 may be higher than the doping concentration of the base region 14. Alternatively, the doping concentration of the second intermediate region 17-2 may be equal to the doping concentration of the base region 14. The latch-up is more easily prevented and reduced when the doping concentration of the second intermediate region 17-2 is higher than the doping concentration of the base region 14.

The doping concentration of the second intermediate region 17-2 may be higher than the doping concentration of the first intermediate region 17-1. Alternatively, the doping concentration of the second intermediate region 17-2 may be lower than the doping concentration of the first intermediate region 17-1.

The semiconductor device 100 in the present example has second intermediate regions 17-2 contacting with both the first gate trench portion 40 and the contact region 15-1, and thus, when the contact region 15-1 is doped, the vicinity of the end portion S of the emitter region 12 is less likely to be corroded in negative Y-axis direction, as compared with the semiconductor device 100 shown in FIG. 2b. This can ensure a channel depth of the transistor portion 70 expanding in Y-axis direction. This can prevent and reduce an influence on the threshold voltage of the transistor portion 70.

The semiconductor device 100 in the present example has, below the contact hole 54, the same configuration as that of the semiconductor device 100 shown in FIG. 2b. Therefore, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, like the semiconductor device 100 shown in FIG. 2b.

Figure 7A:
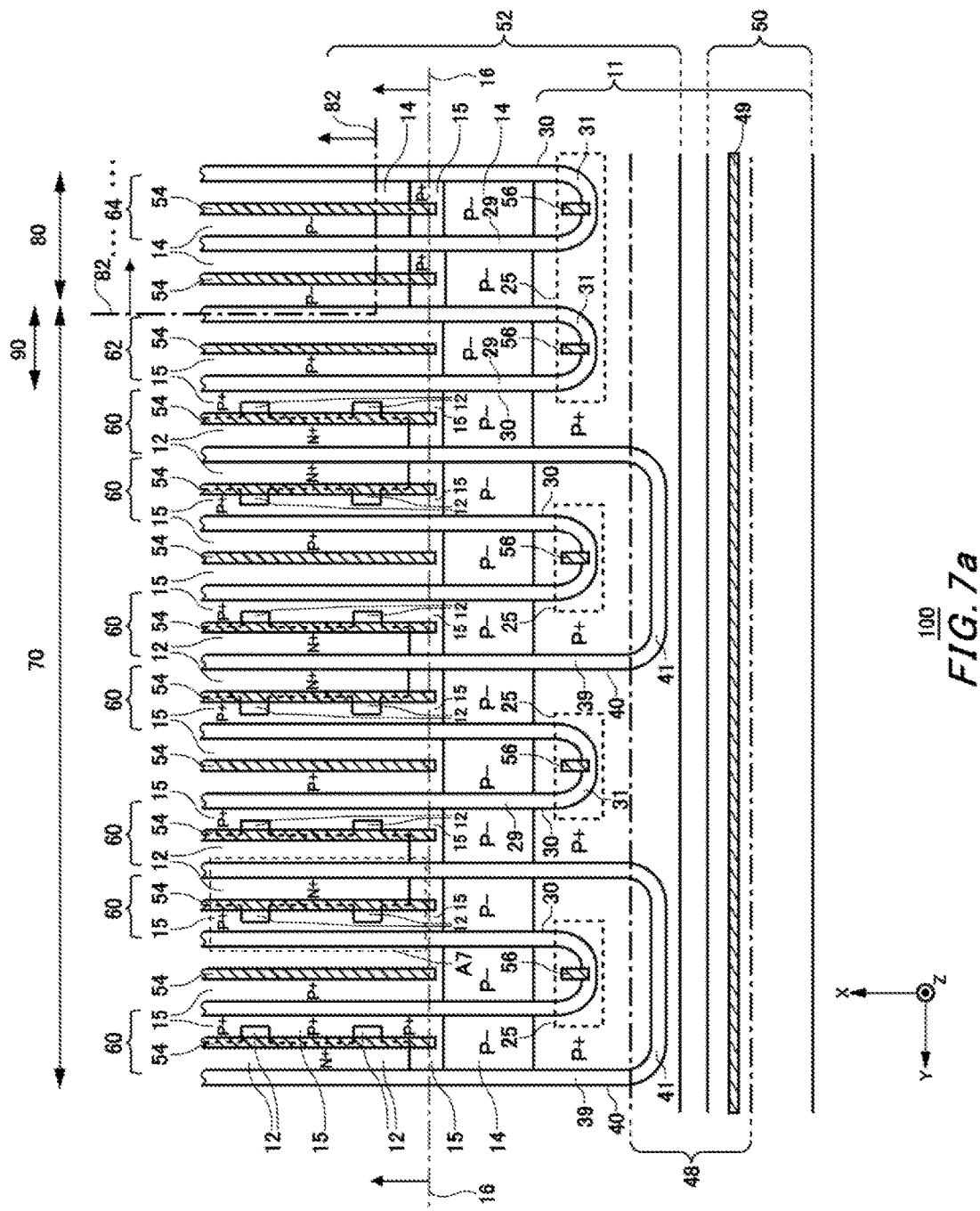
FIG. 7a partially illustrates an upper surface of a semiconductor device 100 according to still another embodiment of the present invention.

FIG. 7a partially illustrates an upper surface of a semiconductor device 100 according to still another embodiment of the present invention. The semiconductor device 100 shown in FIG. 7a is different from the semiconductor device 100 shown in FIG. 4a in a point where the emitter regions 12 are spaced apart from the dummy trench portions 30.

Figure 7B:
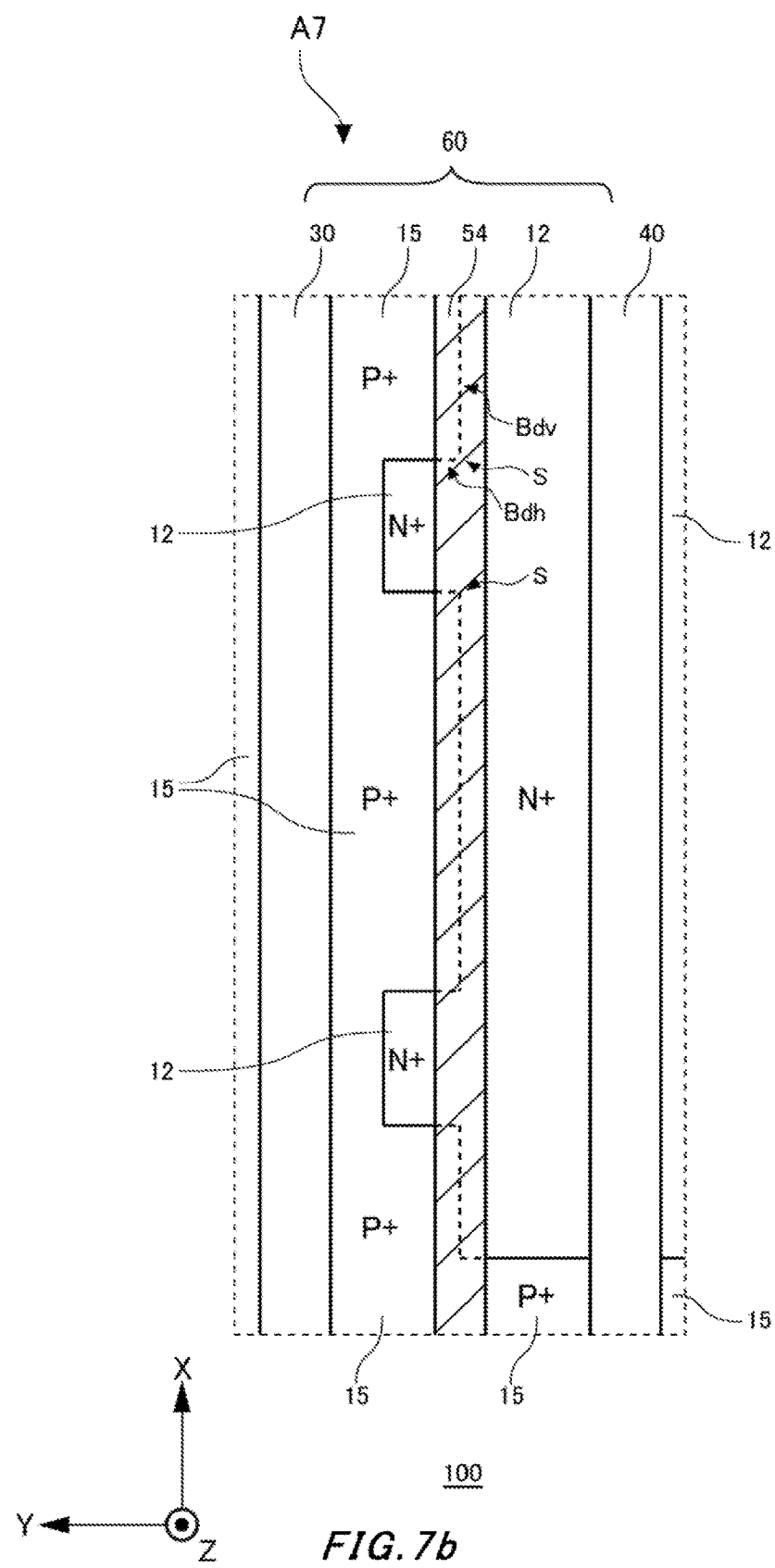

FIG. 7b is an enlarged view of the region A7 in FIG. 7a. The region A7 illustrates a part of a configuration, being arrayed under the same rule in FIG. 7a. The semiconductor device 100 shown in FIG. 7b is different from the semiconductor device 100 shown in FIG. 4b in a point where the emitter region 12 is spaced apart from the dummy trench portion 30. The semiconductor device 100 shown in FIG. 7b has, below the contact hole 54, the same configuration as that of the semiconductor device 100 shown in FIG. 4b. Like the semiconductor device 100 shown in FIG. 4b, this can improve more the saturation current characteristics of the transistor portion 70, as compared with the semiconductor device 100 shown in FIG. 1c. Also, this can prevent and reduce variance in the threshold voltage of the transistor portion 70. Also, even when the contact hole 54 is shifted, due to the manufacturing variance, from the middle of the first transistor mesa portion 60 to the positive side in Y-axis direction, the variance in a contact area between the emitter region 12 and the contact and the variance in a contact area between the contact region 15 and the contact can be prevented and reduced.

In the semiconductor device 100 in the present example, like the semiconductor device 100 shown in FIG. 4b, the emitter region 12 is continuously arranged in X-axis direction contacting with the first gate trench portion 40. This can improve more the saturation current characteristics of the transistor portion 70, as compared with the semiconductor device 100 shown in FIG. 1c. Also, the transconductance of the transistor portion 70 can be made higher to make lower the resistance of the transistor portion 70.

In the semiconductor device 100 in the present example, the ratio of the contact region 15 to the first transistor mesa portion 60 is greater than that of the semiconductor device 100 shown in FIG. 4b. This can make, as compared with the semiconductor device 100 shown in FIG. 4b, the semiconductor device 100 in the present example a semiconductor device 100 that focuses on the latch-up resistance, as well as the saturation current characteristics.

Figure 8A:
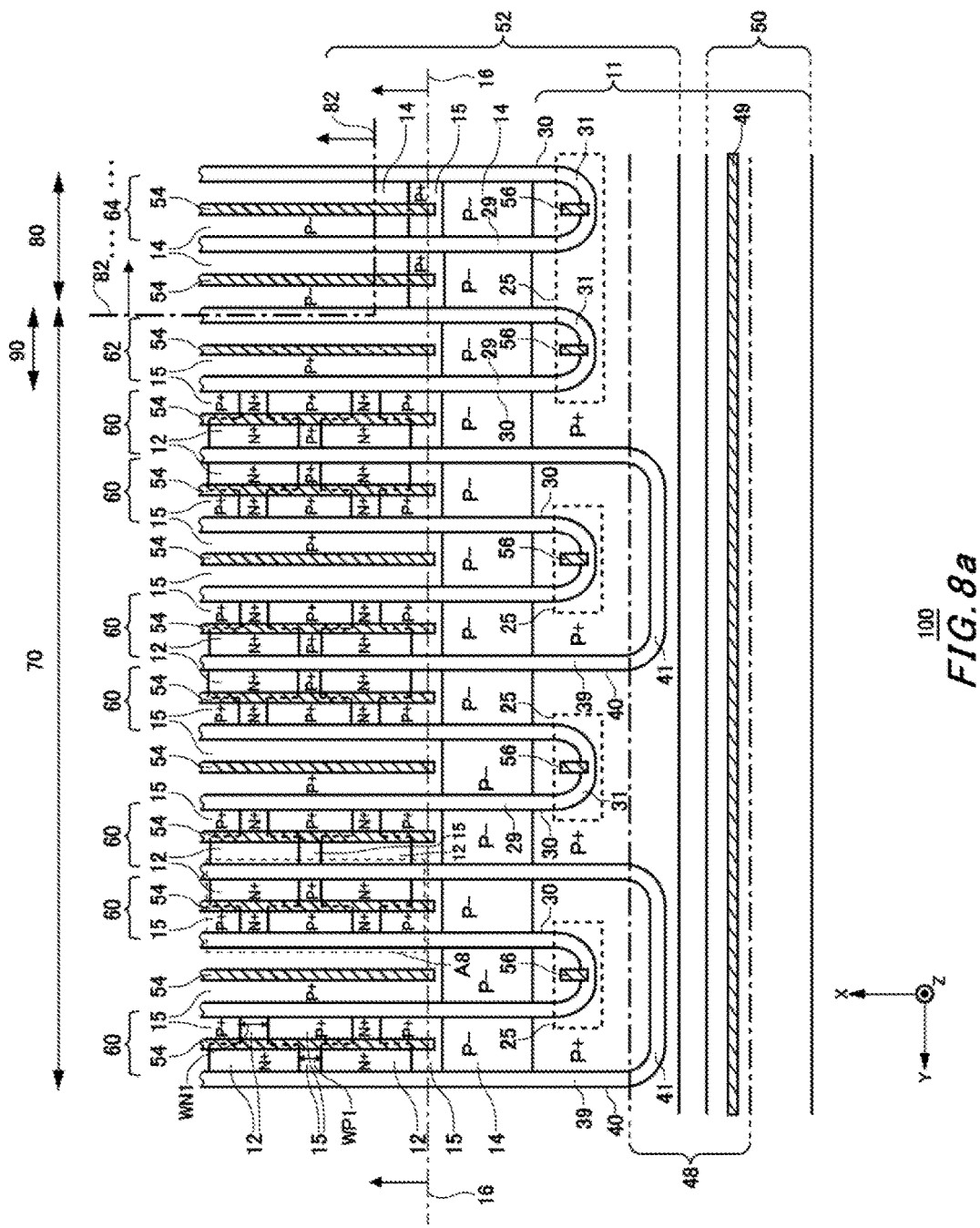
FIG. 8a partially illustrates an upper surface of a semiconductor device 100 according to still another embodiment of the present invention.

FIG. 8a partially illustrates an upper surface of a semiconductor device 100 according to still another embodiment of the present invention. The semiconductor device 100 shown in FIG. 8a is different from the semiconductor device 100 shown in FIG. 1a in a point where the width WP1 of the contact region 15 in X-axis direction contacting with the first gate trench portion 40 is smaller than the width WN1 of the emitter region 12 in X-axis direction contacting with the dummy trench portion 30.

Figure 8B:
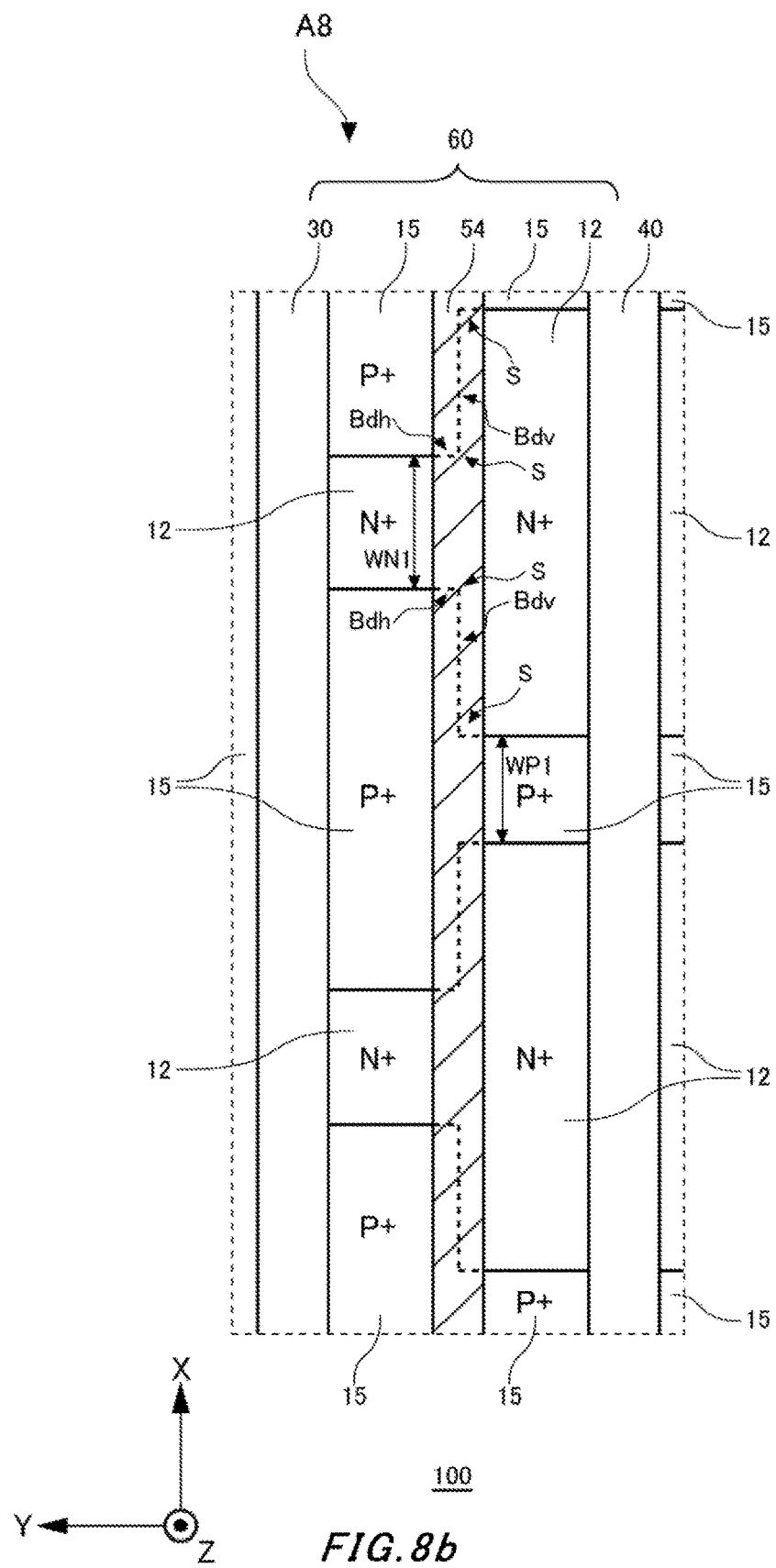

FIG. 8b is an enlarged view of the region A8 in FIG. 8a. The region A8 illustrates a part of a configuration, being arrayed under the same rule in FIG. 8a. The semiconductor device 100 shown in FIG. 8b is different from the semiconductor device 100 shown in FIG. 1c in a point where the width WP1 of the contact region 15 in X-axis direction contacting with the first gate trench portion 40 is smaller than the width WN1 of the emitter region 12 in X-axis direction contacting with the dummy trench portion 30.

In the semiconductor device 100 in the present example, the ratio of the contact region 15 to the first transistor mesa portion 60 is smaller than that of the semiconductor device 100 shown in FIG. 1c. Also, the ratio of the emitter region 12 to the first transistor mesa portion 60 is greater than that of the semiconductor device 100 shown in FIG. 1c. This can make, as compared with the semiconductor device 100 shown in FIG. 1c, the semiconductor device 100 in the present example a semiconductor device 100 that focuses on the saturation current characteristics, as well as the latch-up resistance.

Figure 9A:
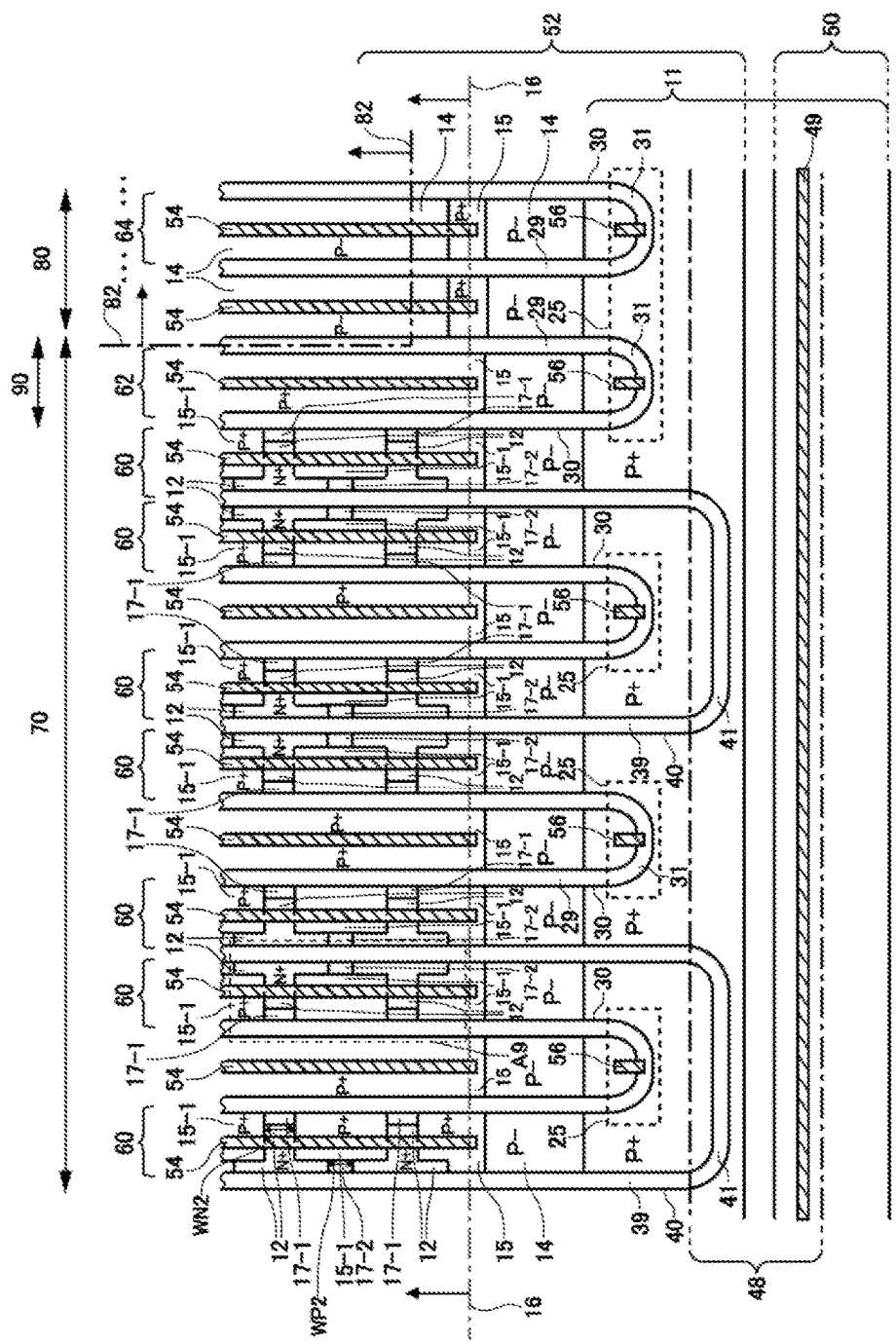
FIG. 9a partially illustrates an upper surface of a semiconductor device 100 according to still another embodiment of the present invention.

FIG. 9a partially illustrates an upper surface of a semiconductor device 100 according to still another embodiment of the present invention. The semiconductor device 100 shown in FIG. 9a is different from the semiconductor device 100 shown in FIG. 6a in a point where the width WP2 of the second intermediate region 17-2 contacting with the first gate trench portion 40 is smaller than the width WN2 of the first intermediate region 17-1 contacting with the dummy trench portion 30.

Figure 9B:
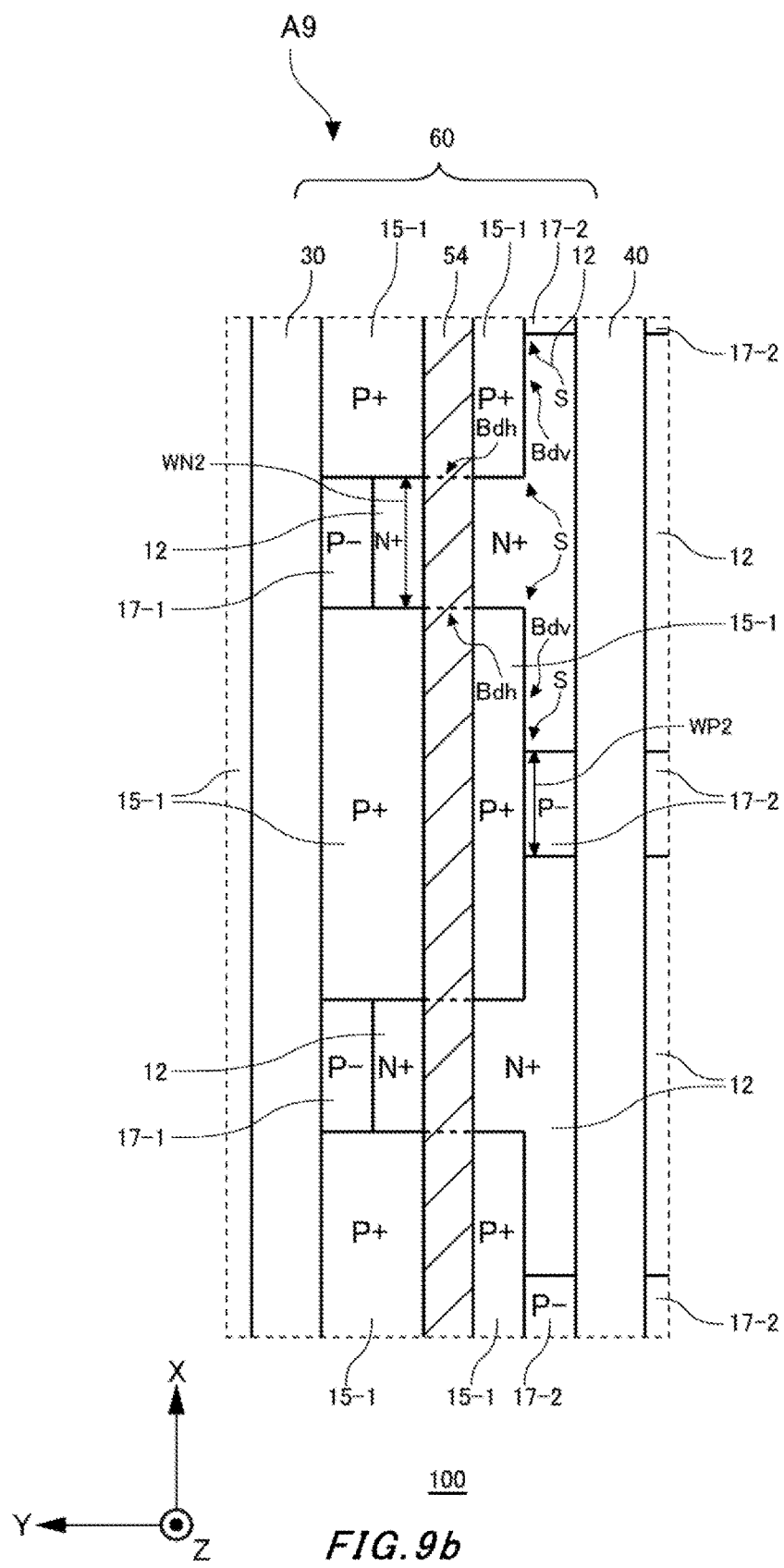

FIG. 9b is an enlarged view of the region A9 in FIG. 9a. The region A9 illustrates a part of a configuration, being arrayed under the same rule in FIG. 9a. The semiconductor device 100 shown in FIG. 9b is different from the semiconductor device 100 shown in FIG. 6b in a point where the width WP2 of the second intermediate region 17-2 contacting with the first gate trench portion 40 is smaller than the width WN2 of the first intermediate region 17-1 contacting with the dummy trench portion 30.

The semiconductor device 100 in the present example has second intermediate regions 17-2 contacting with both the first gate trench portion 40 and the contact regions 15-1, and thus, when the contact region 15-1 is doped, the vicinity of the end portions S of the emitter regions 12 are less likely to be corroded in negative Y-axis direction, like the semiconductor device 100 shown in FIG. 6b. This can ensure a channel depth of the transistor portion 70 expanding in Y-axis direction. This can prevent and reduce an influence on the threshold voltage of the transistor portion 70.

In the semiconductor device 100 in the present example, the ratio of the emitter region 12 to the first transistor mesa portion 60 is greater than that of the semiconductor device 100 shown in FIG. 6b. This can make, as compared with the semiconductor device 100 shown in FIG. 6b, the semiconductor device 100 in the present example a semiconductor device 100 that focuses on the saturation current characteristics, as well as the latch-up resistance.

Figure 10A:
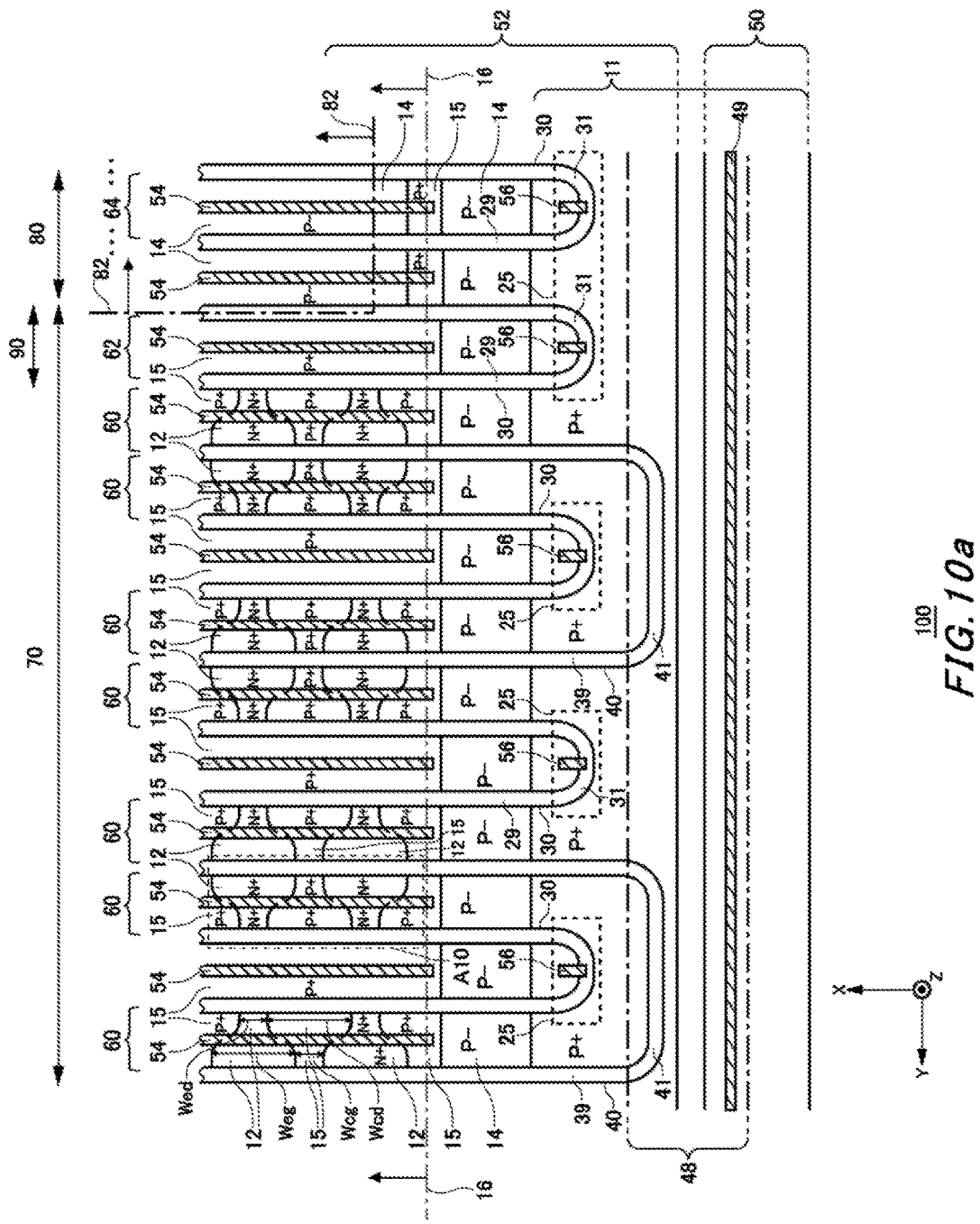
FIG. 10a partially illustrates an upper surface of a semiconductor device 100 according to still another embodiment of the present invention.

FIG. 10a partially illustrates an upper surface of a semiconductor device 100 according to still another embodiment of the present invention. The semiconductor device 100 shown in FIG. 10a is different from the semiconductor device 100 shown in FIG. 1a in a point where the width of the emitter region 12 in X-axis direction is continuously changed on XY-plane from the width Weg to the width Wed. Also, the semiconductor device 100 shown in FIG. 10a is different from the semiconductor device 100 shown in FIG. 1a in a point where the width of the contact region 15 in X-axis direction is continuously changed on XY-plane from the width Wcd to the width Wcg.

Figure 10B:
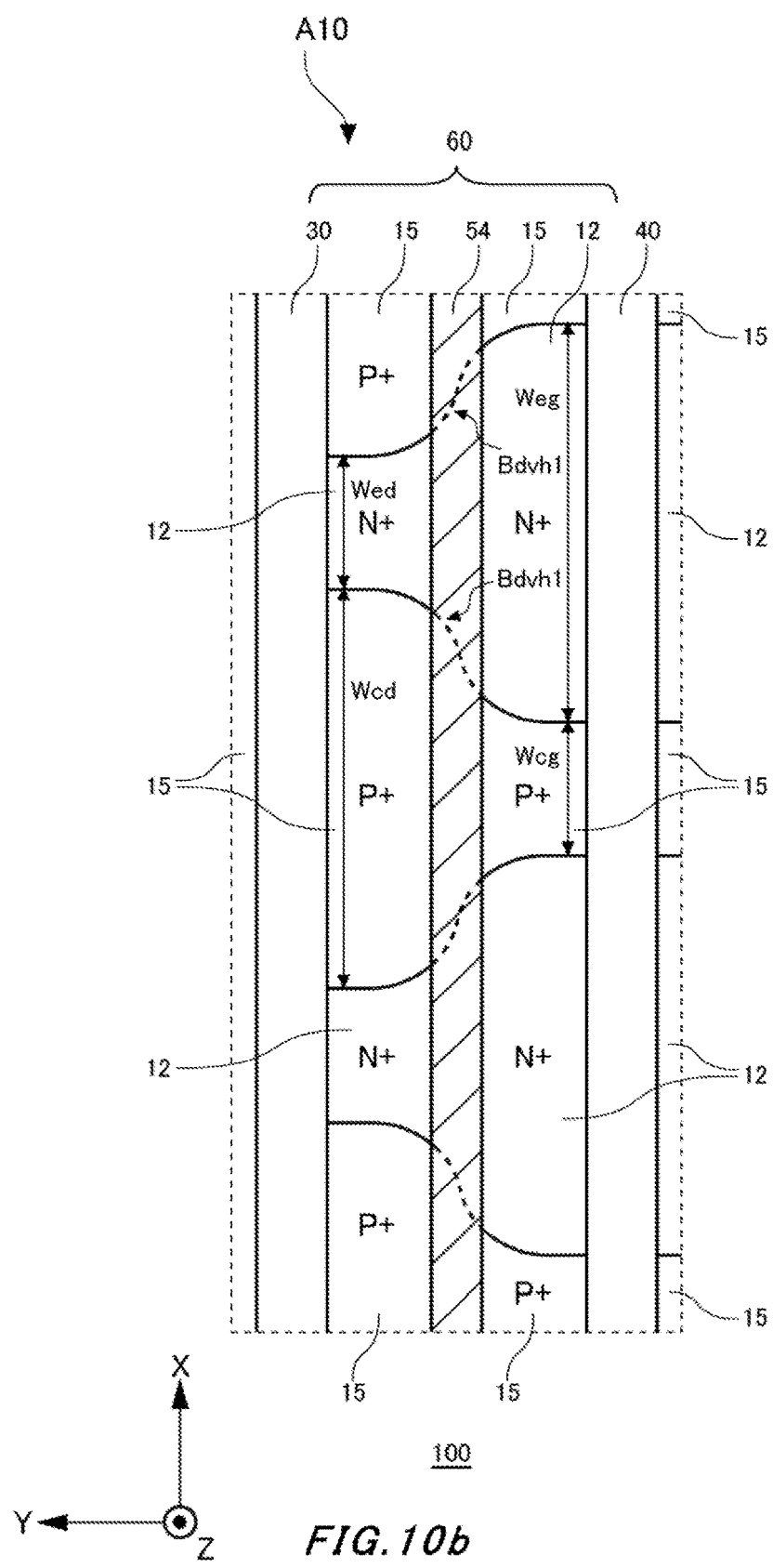

FIG. 10b is an enlarged view of the region A10 in FIG. 10a. The region A10 illustrates a part of a configuration, being arrayed under the same rule in FIG. 10a. The semiconductor device 100 shown in FIG. 10b is different from the semiconductor device 100 shown in FIG. 1c in a point where the width of the emitter region 12 in X-axis direction is continuously changed on XY-plane from the width Weg to the width Wed. Also, the semiconductor device 100 shown in FIG. 10b is different from the semiconductor device 100 shown in FIG. 1c in a point where the width of the contact region 15 in X-axis direction is continuously changed on XY-plane from the width Wcd to the width Wcg. Here, the width being continuously changed refers to that the width is changed smoothly and has no discontinuous change. The width of the emitter region 12 in X-axis direction is changed in the form of a convex shape, on the negative side in Y-axis direction from the contact hole 54, in a direction from the emitter region 12 to the contact region 15. Also, the width of the contact region 15 in X-axis direction is changed in the form of a convex shape, on the positive side in Y-axis direction from the contact hole 54, in a direction from the contact region 15 to the emitter region 12.

As shown in FIG. 10b, the emitter regions 12 and the contact regions 15 contact with each other through the boundaries Bdvh1 of the p-n junctions. The boundaries Bdvh1 have both X-axis direction components and Y-axis direction components. By the Y-axis direction component of the boundary Bdvh1 existing below the contact hole 54, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced.

Figure 11A:
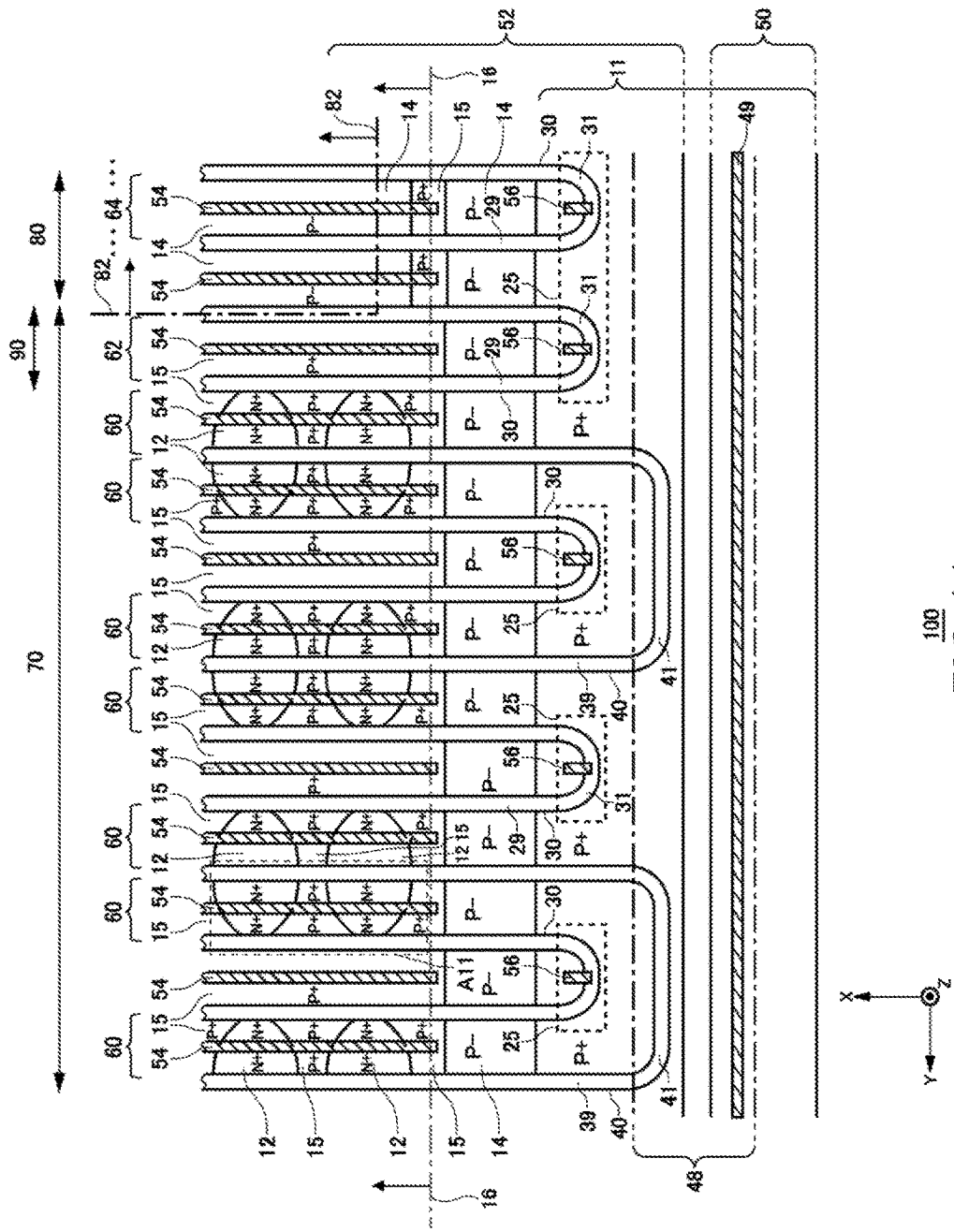
FIG. 11a partially illustrates an upper surface of a semiconductor device 100 according to still another embodiment of the present invention.

FIG. 11a partially illustrates an upper surface of a semiconductor device 100 according to still another embodiment of the present invention. The semiconductor device 100 shown in FIG. 11a is different from the semiconductor device 100 shown in FIG. 10a in a point where the width of the emitter region 12 in X-axis direction is changed in the form of a convex shape in the direction from the emitter region 12 to the contact region 15 on both the positive and the negative sides in Y-axis direction from the contact hole 54. Also, the semiconductor device 100 shown in FIG. 11a is different from the semiconductor device 100 shown in FIG. 10a in a point where the width of the contact region 15 in X-axis direction is changed in the form of a concave shape in the direction from the emitter region 12 to the contact region 15 on both the positive and the negative sides in Y-axis direction from the contact hole 54.

Figure 11B:
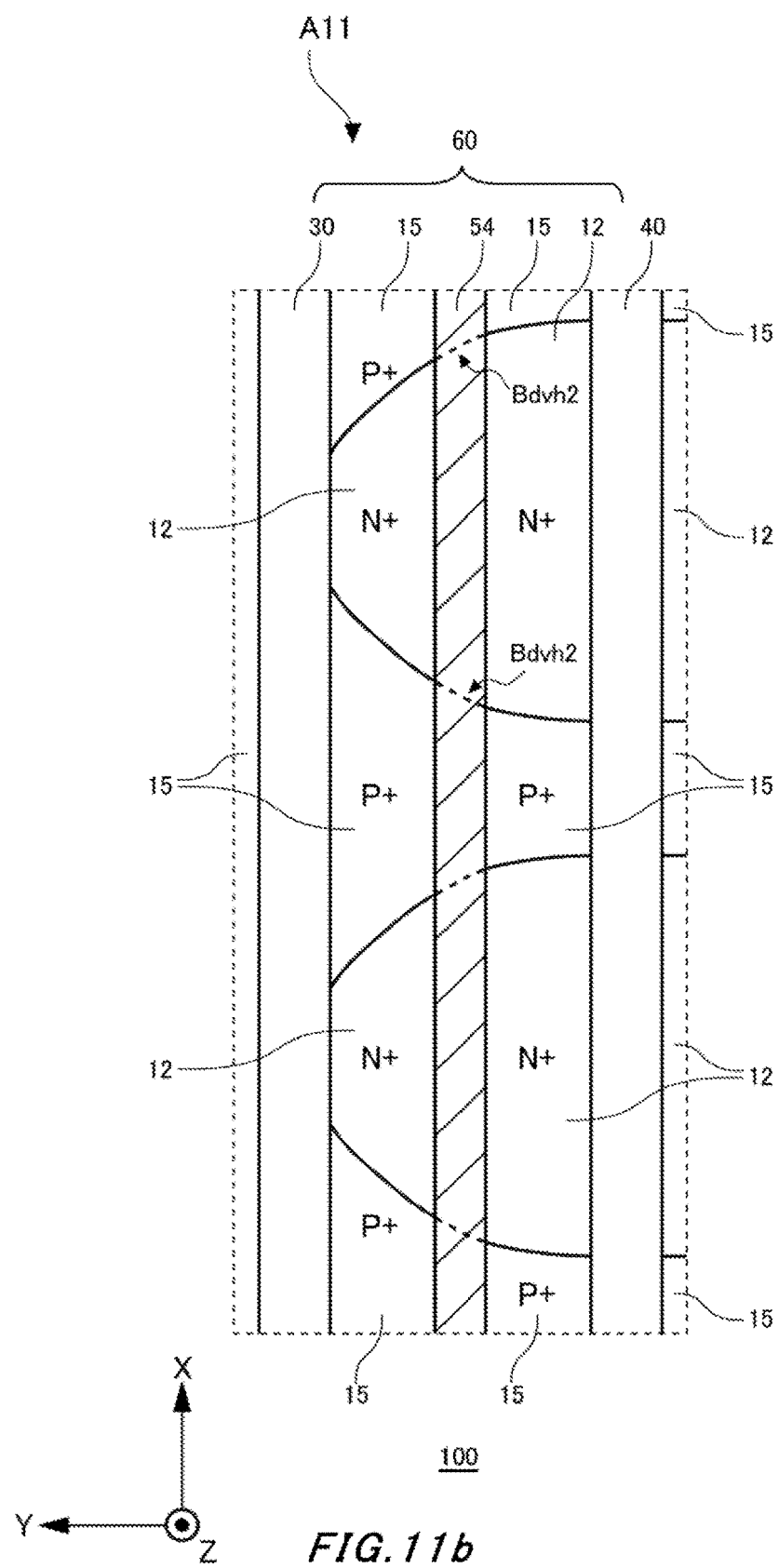

FIG. 11b is an enlarged view of the region A11 in FIG. 11a. The region A11 illustrates a part of a configuration, being arrayed under the same rule in FIG. 11a. The semiconductor device 100 shown in FIG. 11b is different from the semiconductor device 100 shown in FIG. 10b in a point where the width of the emitter region 12 in X-axis direction is changed in the form of a convex shape in the direction from the emitter region 12 to the contact region 15 on both the positive and the negative sides in Y-axis direction from the contact hole 54. Also, the semiconductor device 100 shown in FIG. 11b is different from the semiconductor device 100 shown in FIG. 10b in a point where the width of the contact region 15 in X-axis direction is changed in the form of a concave shape in the direction from the emitter region 12 to the contact region 15 on both the positive and the negative sides in Y-axis direction from the contact hole 54.

The emitter regions 12 and the contact regions 15 contact with each other through the boundaries Bdvh2 of the p-n junctions. The boundaries Bdvh2 have both X-axis direction components and Y-axis direction components. By the Y-axis direction component of the boundary Bdvh2 existing below the contact hole 54, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced.

Figure 12A:
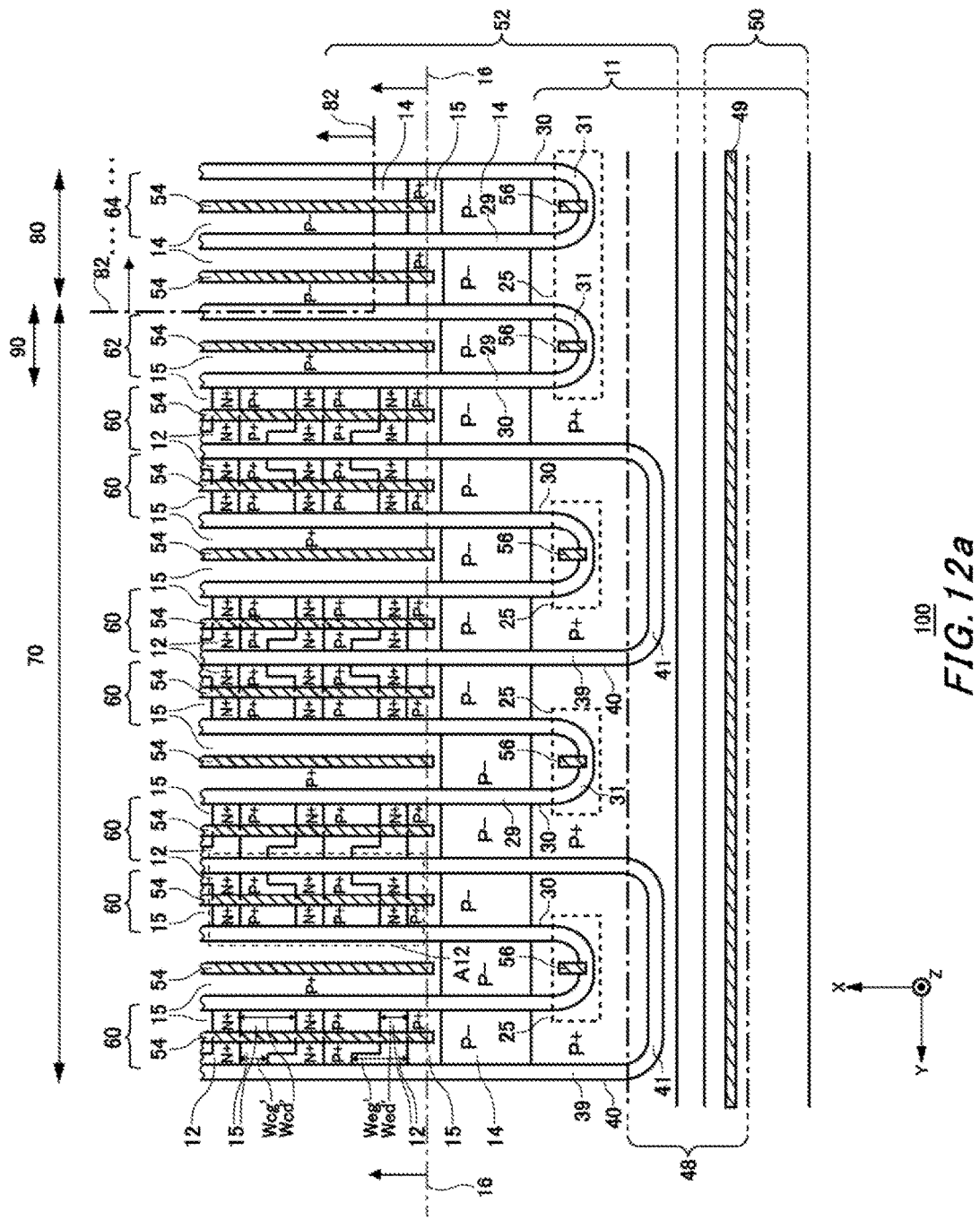
FIG. 12a partially illustrates an upper surface of a semiconductor device 100 according to still another embodiment of the present invention.

FIG. 12a partially illustrates an upper surface of a semiconductor device 100 according to still another embodiment of the present invention. The semiconductor device 100 shown in FIG. 12a forms, below the contact hole 54, p-n junctions that have boundaries parallel to Y-axis direction. The width Weg' of the emitter region 12 in X-axis direction contacting with the first gate trench portion 40 may be greater than the width Wed' of the emitter region 12 in X-axis direction contacting with the dummy trench portion 30. The width Weg' may be twice to five times greater than the width Wed'. Also, the width Wcd' of the contact region 15 in X-axis direction contacting with the dummy trench portion 30 may be greater than the width Wcg' of the contact region 15 in X-axis direction contacting with the first gate trench portion 40. The width Wcd' may be twice to five times greater than the width Wcg'.

Figure 12B:
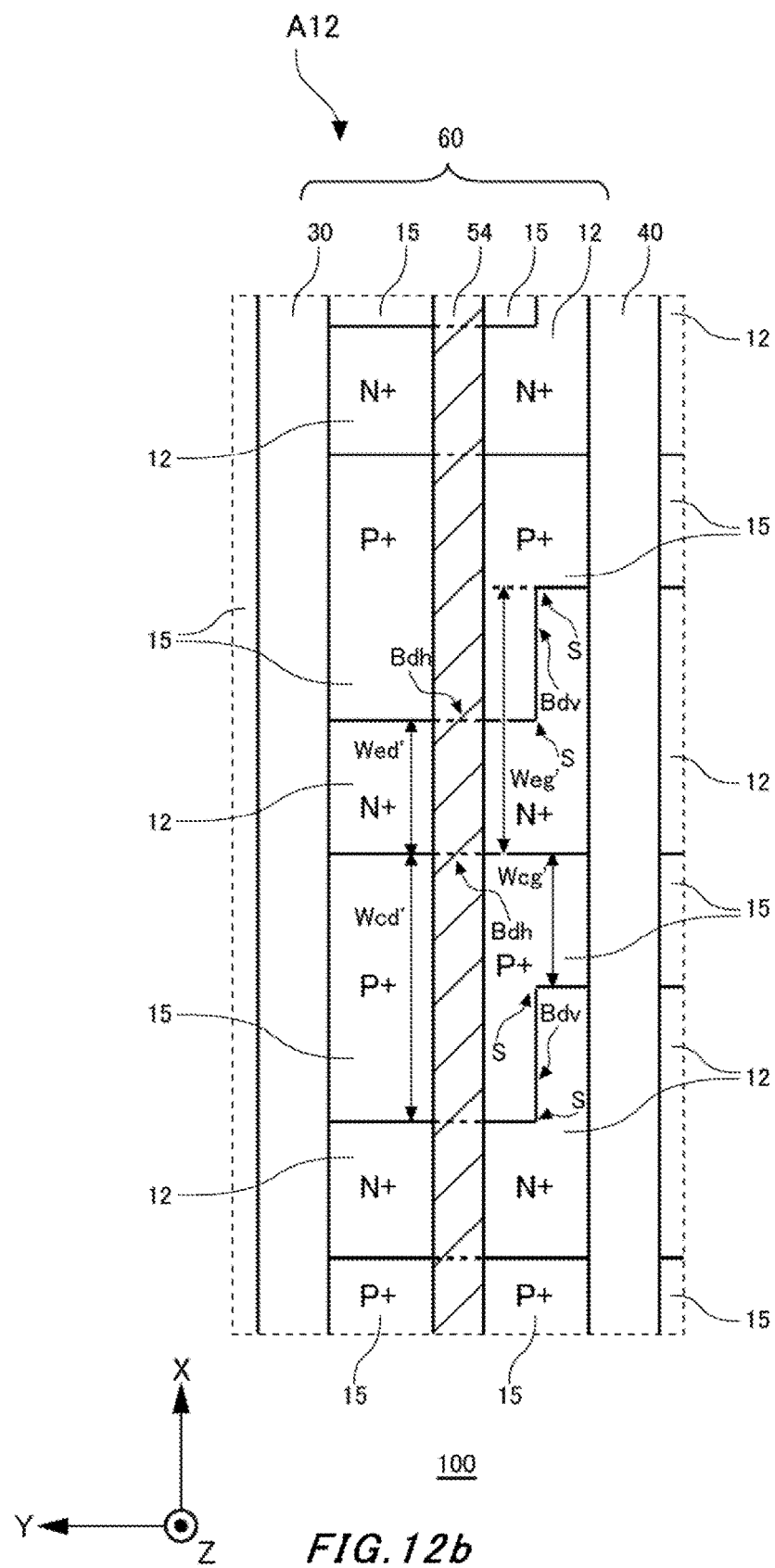

FIG. 12b is an enlarged view of the region A12 in FIG. 12a. The region A12 illustrates a part of a configuration, being arrayed under the same rule in FIG. 12a. In the semiconductor device 100 shown in FIG. 12b, the end portions S are arranged, in the top view of the semiconductor substrate 10, between the contact hole 54 and the first gate trench portion 40, and there is no boundary Bdv below the contact hole 54. Also, below the contact hole 54, p-n junctions that have boundaries Bdh parallel to Y-axis direction are formed. Therefore, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, as compared with the semiconductor device 100 in FIG. 1c.

The distances in Y-axis direction from the first gate trench portion 40 to the end portion S and from the same to the boundary Bdv respectively are values such that the dopant of the contact region 15 does not reach the first gate trench portion 40. Particularly, depending on the variance at the time of manufacturing, the minimum values of the distances in Y-axis direction from the first gate trench portion 40 to the end portion S and from the same to the boundary Bdv only have to be greater than zero. This can prevent a dopant of the contact region 15 from reaching the first gate trench portion 40 and prevent and reduce variance in the threshold voltage of the transistor portion 70.

Figure 13A:
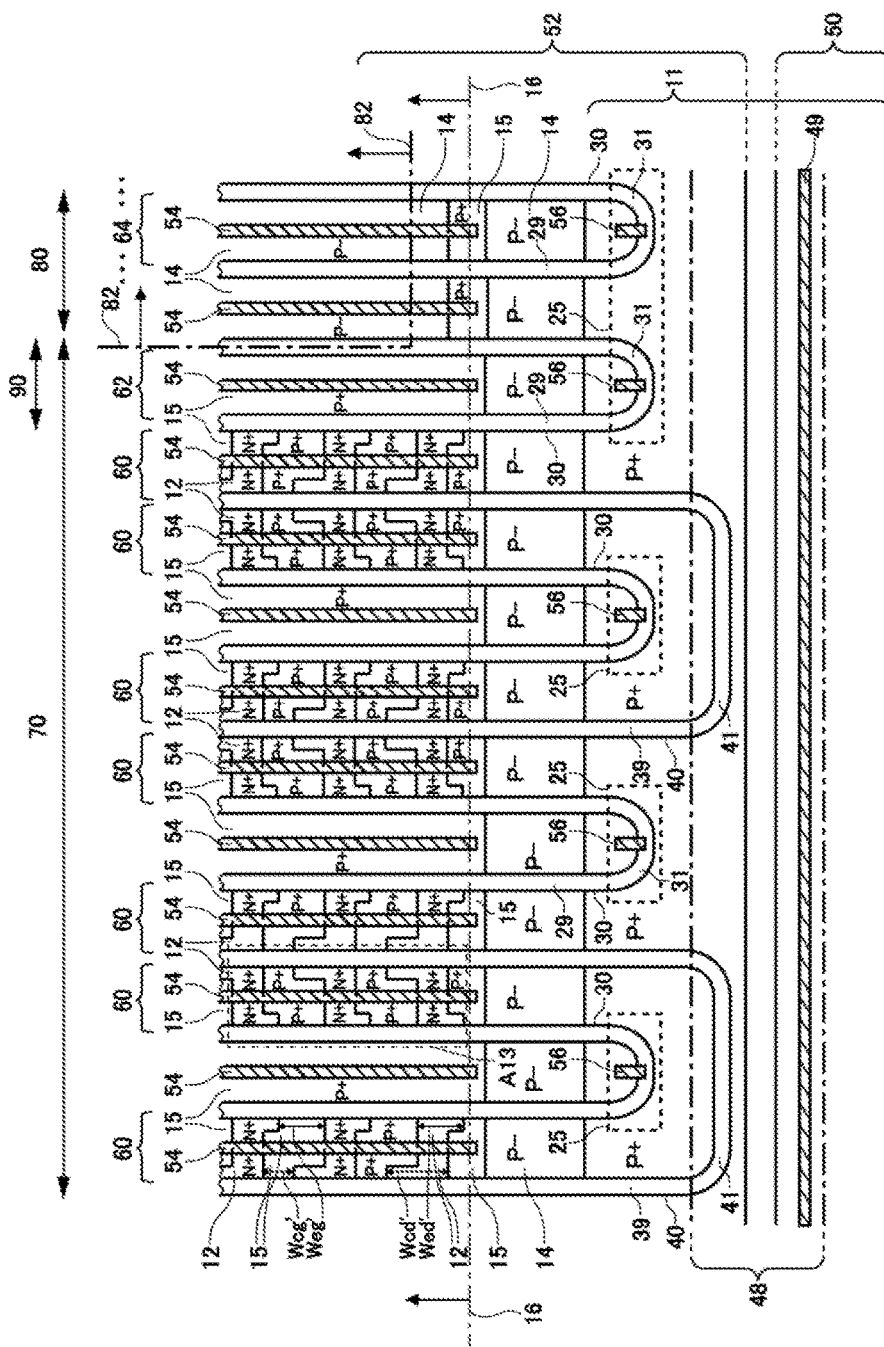
FIG. 13a partially illustrates an upper surface of a semiconductor device 100 according to still another embodiment of the present invention.

FIG. 13a partially illustrates an upper surface of a semiconductor device 100 according to still another embodiment of the present invention. The semiconductor device 100 shown in FIG. 13a is different from the semiconductor device 100 shown in FIG. 12a in a point where the width of the emitter region 12 contacting with the dummy trench portion 30 is greater than that of the semiconductor device 100 shown in FIG. 12a, protruding in the negative side in X-axis direction. Also, the semiconductor device 100 shown in FIG. 13a is different from the semiconductor device 100 shown in FIG. 12a in a point where the width of the dummy trench portion 30 contacting with the contact region 15 is smaller than that of the semiconductor device 100 shown in FIG. 12a, being recessed in the negative side in X-axis direction.

The semiconductor device 100 in the present example forms, below the contact hole 54, p-n junctions that have boundaries parallel to Y-axis direction. The width Weg" of the emitter region 12 in X-axis direction contacting with the first gate trench portion 40 may be greater than the width Wed" of the emitter region 12 in X-axis direction contacting with the dummy trench portion 30. The width Weg" may be twice to five times greater than the width Wed". Also, the width Wcd" of the contact region 15 in X-axis direction contacting with the dummy trench portion 30 may be greater than the width Wcg" of the contact region 15 in X-axis direction contacting with the first gate trench portion 40. The width Wcd" may be twice to five times greater than the width Wcg".

Figure 13B:
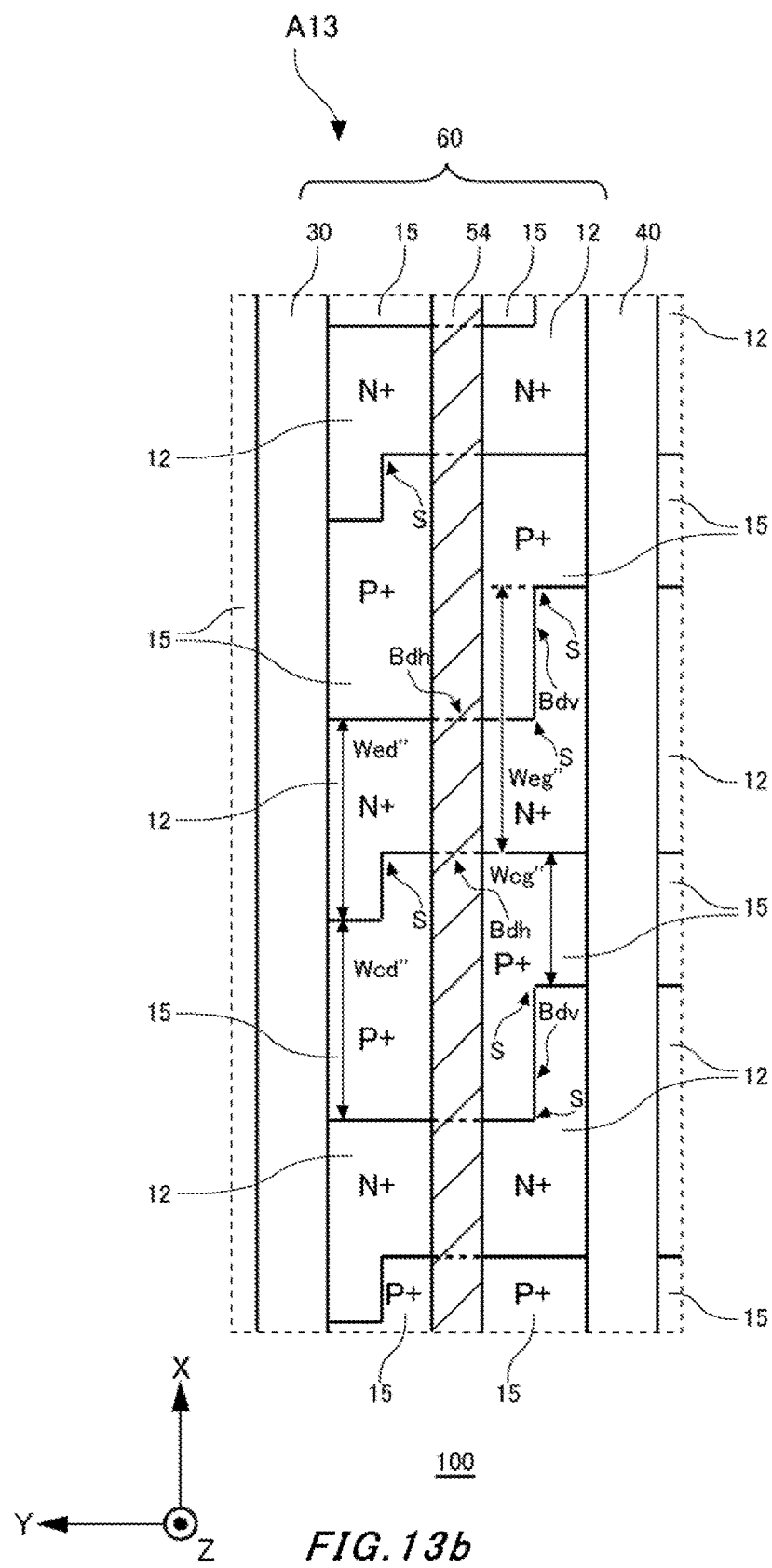

FIG. 13b is an enlarged view of the region A13 in FIG. 13a. The region A13 illustrates a part of a configuration, being arrayed under the same rule in FIG. 13a. In the semiconductor device 100 shown in FIG. 13b, the end portions S are arranged, in the top view of the semiconductor substrate 10, between the contact hole 54 and the first gate trench portion 40 and between the contact hole 54 and the dummy trench portion 30, and there is no boundary Bdv below the contact hole 54. Also, below the contact hole 54, p-n junctions that have boundaries Bdh parallel to Y-axis direction are formed. Therefore, even when the contact hole 54 is shifted, due to the manufacturing variance, from the middle of the first transistor mesa portion 60 to either the positive or the negative side in Y-axis direction, the variance in a contact area between the emitter region 12 and the contact and the variance in a contact area between the contact region 15 and the contact can be prevented and reduced, as compared with the semiconductor device 100 in FIG. 1c.

The distances in Y-axis direction from the first gate trench portion 40 to the end portion S and from the same to the boundary Bdv respectively are values such that the dopant of the contact region 15 does not reach the first gate trench portion 40. Particularly, depending on the variance at the time of manufacturing, the minimum values of the distances in Y-axis direction from the first gate trench portion 40 to the end portion S and from the same to the boundary Bdv only have to be greater than zero. This can prevent a dopant of the contact region 15 from reaching the first gate trench portion 40 and prevent and reduce variance in the threshold voltage of the transistor portion 70.

In the semiconductor device 100 in the present example, the ratio of the emitter region 12 to the first transistor mesa portion 60 is greater than that of the semiconductor device 100 shown in FIG. 12b. This can make, as compared with the semiconductor device 100 shown in FIG. 12b, the semiconductor device 100 in the present example a semiconductor device 100 that focuses on the saturation current characteristics, as well as the latch-up resistance.

Figure 14A:
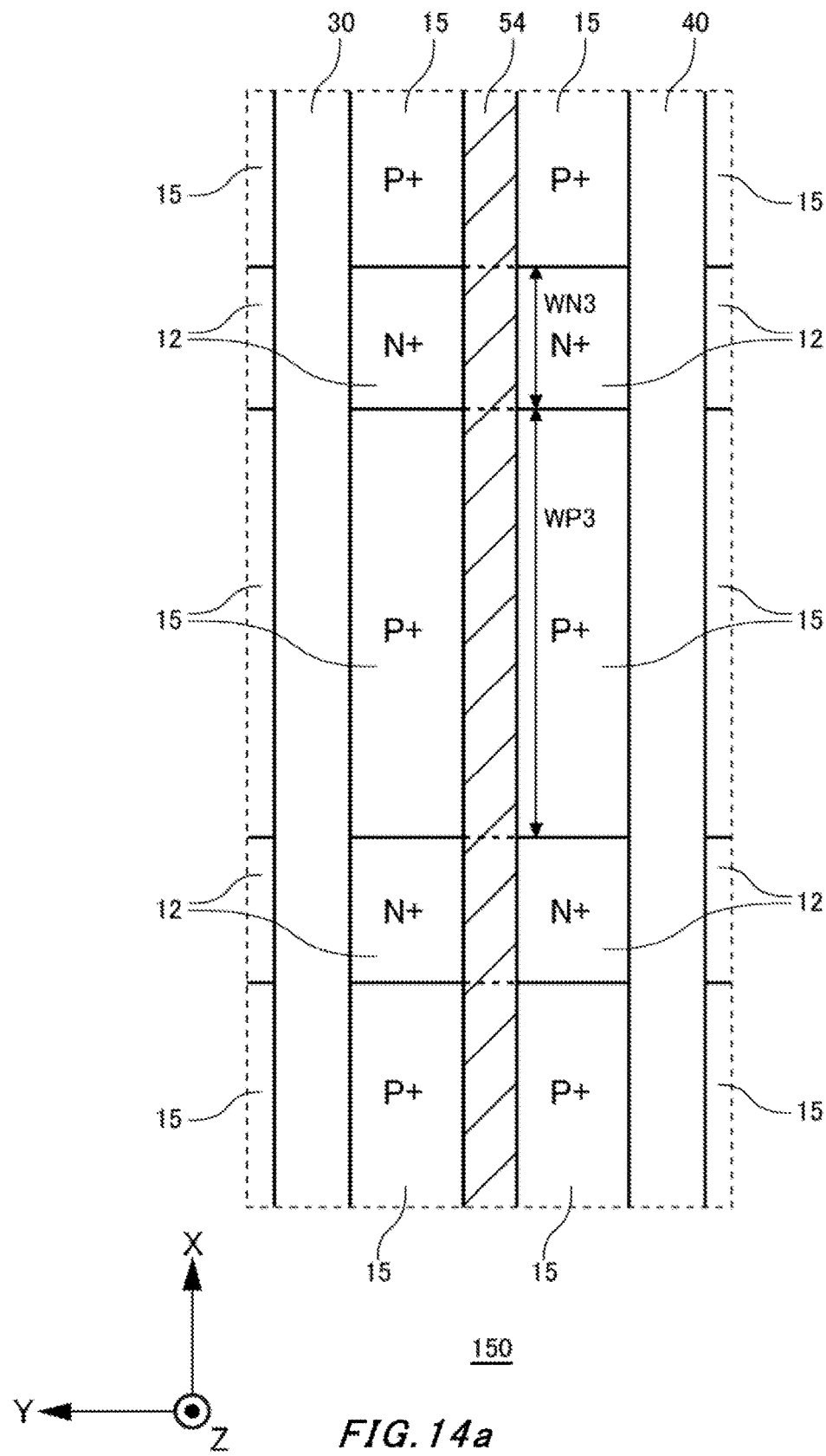
FIG. 14a partially illustrates an upper surface of a semiconductor device 150 in a first comparative example.

FIG. 14a partially illustrates an upper surface of a semiconductor device 150 in a first comparative example. In the semiconductor device 150 in FIG. 14a, the width of the emitter region 12 in X-axis direction equals the width WN3 from the dummy trench portion 30 to the first gate trench portion 40. Also, the width of the contact region 15 in X-axis direction equals the width WP3 from the dummy trench portion 30 to the first gate trench portion 40. The contact region 15 is a contact region, as an example. In the present comparative example, the relationship: WN3<WP3 is fulfilled. This can make greater the latch-up resistance of the transistor portion 70, but can not make the saturation current greater.

Figure 14B:
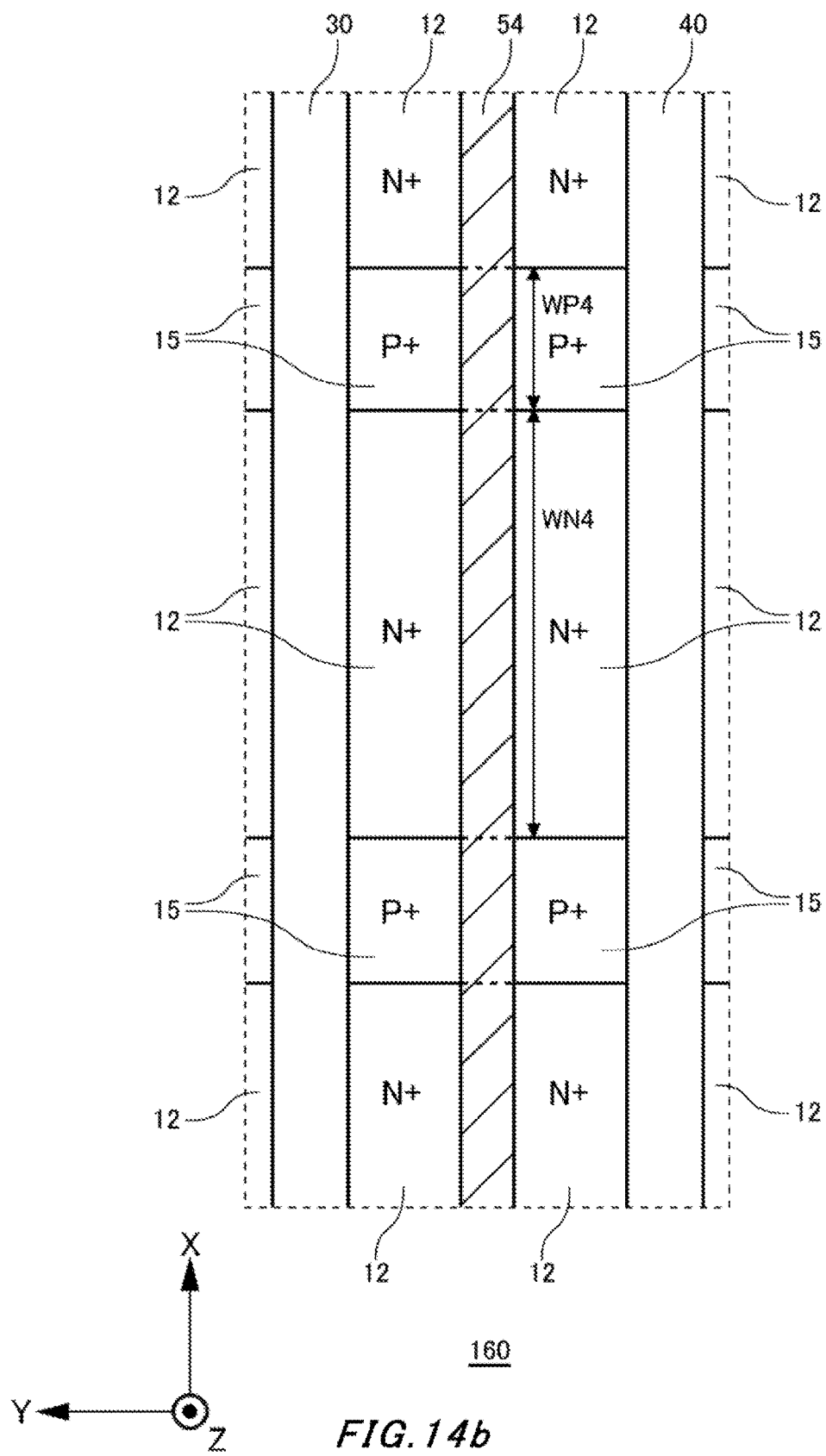
FIG. 14b partially illustrates an upper surface of a semiconductor device 160 in a second comparative example.

FIG. 14b partially illustrates an upper surface of a semiconductor device 160 in a second comparative example. In the semiconductor device 160, the width of the emitter region 12 in X-axis direction equals the width WN4 from the dummy trench portion 30 to the first gate trench portion 40. Also, the width of the contact region 15 in X-axis direction equals the width WP4 from the dummy trench portion 30 to the first gate trench portion 40. The contact region 15 is a contact region, as an example. In the present comparative example, the relationship WN4>WP4 is fulfilled. Thereby, on the contrary to the first comparative example shown in FIG. 14a, the saturation current of the transistor portion 70 can be made great, but the latch-up resistance can not be made great.

In the semiconductor device 150 in the first comparative example and the semiconductor device 160 in the second comparative example, the saturation current characteristics and the latch-up resistance of the transistor portion 70 are in the relationship of trade-off. Thereby, the balance between the saturation current characteristics and the latch-up resistance of the transistor portion 70 can not be made better.

Figure 14C:
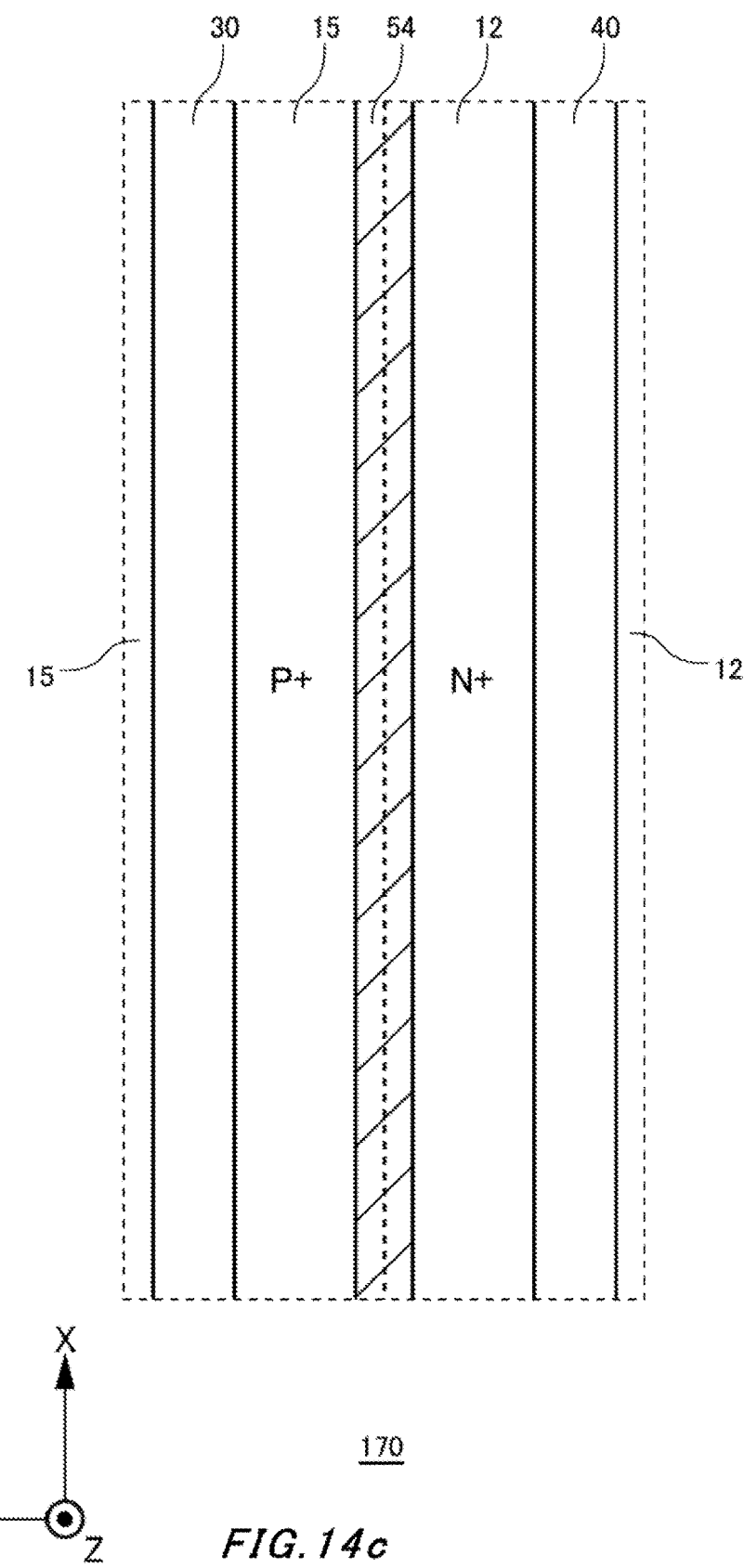
FIG. 14c partially illustrates an upper surface of a semiconductor device 170 in a third comparative example.

FIG. 14c partially illustrates an upper surface of a semiconductor device 170 in a third comparative example. In the semiconductor device 170 in FIG. 14c, the emitter region 12 is provided, below the contact hole 54, closer to the first gate trench portion 40 from the center in Y-axis direction. Also, the contact region 15 is provided, below the contact hole 54, closer to the dummy trench portion 30 from the center in Y-axis direction. The contact region 15 is contact region, as an example.

In the present comparative example, the emitter region 12 contacts with the first gate trench portion 40 at its entire region in X-axis direction. Also, the contact region 15 contacts with the dummy trench portion 30 at its entire region in X-axis direction. This can make both the saturation current characteristics and the latch-up resistance great. However, the emitter region 12 and the contact region 15 form, below the contact hole 54, only the p-n junction that has boundary parallel to X-axis direction. Thereby, when the contact hole 54 is shifted to the positive side in Y-axis direction due to the manufacturing variance, the emitter region 12 can not contact with the contact. Also, when the contact hole 54 is shifted to the negative side in Y-axis direction, the contact region 15 can not contact with the contact.

Figure 15A:
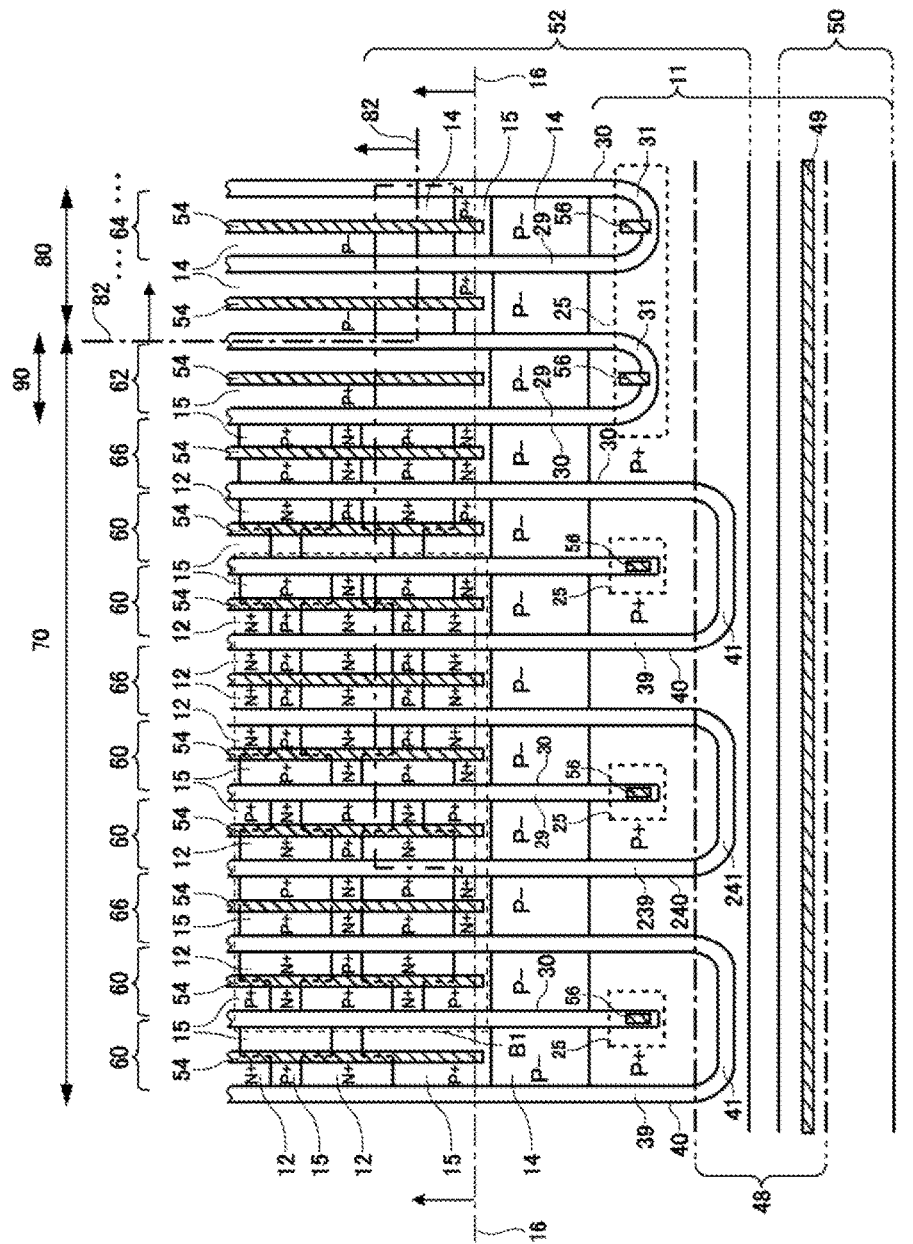
FIG. 15a partially illustrates an upper surface of a semiconductor device 200 according to another embodiment of the present invention.

FIG. 15a partially illustrates an upper surface of a semiconductor device 200 according to another embodiment of the present invention. In the semiconductor device 200 shown in FIG. 15a, unlike the semiconductor device 100 shown in FIG. 1a, one of the dummy trench portions 30 is sandwiched by the first gate trench portions 40. Also, the second gate trench portion 240 is arranged next to the first gate trench portion 40 and on the opposite side to the dummy trench portion 30. In the semiconductor device 200 shown in FIG. 15a, the gate trench portions are more densely arranged, as compared with the semiconductor device 100 shown in FIG. 1a. In the semiconductor device 200 shown in FIG. 15a, this can make the current of the transistor portion 70 larger with smaller area, as compared with the semiconductor device 100 shown in FIG. 1a.

The first gate trench portions 40 in the present example may have two extending portions 39 which are parallel to the upper surface of the semiconductor substrate 10 and extend along an extending direction perpendicular to the array direction, and the connecting portion 41 to connect the two extending portions 39. Preferably, at least part of the connecting portion 41 is formed in a curved shape. The gate runner 48 may be connected to the gate conductive portion at the connecting portion 41 of the first gate trench portion 40.

The second gate trench portions 240 in the present example may have two extending portions 239 which are parallel to the upper surface of the semiconductor substrate 10 and extend along an extending direction perpendicular to the array direction, and the connecting portion 241 to connect the two extending portions 239. Preferably, at least part of the connecting portion 241 is formed in a curved shape. The gate runner 48 may be connected to the gate conductive portion at the connecting portion 241 of the second gate trench portion 240.

The gate runner 48 is connected to the gate conductive portions in the first gate trench portions 40 and the gate conductive portion in the second gate trench portion 240 on the upper surface of the semiconductor substrate. The gate runner 48 in the present example is formed from below the contact holes 49 to the edge portion of the first gate trench portions 40 and from the same to the edge portion of the second gate trench portion 240. In the edge portion of the first gate trench portion 40, the gate conductive portion is exposed on the upper surface of the semiconductor substrate. Also, in the edge portions of the second gate trench portions 240, the gate conductive portion is exposed on the upper surface of the semiconductor substrate. The first gate trench portions 40 and the second gate trench portion 240 contact with the gate runner 48 at the exposed portions of the gate conductive portions.

The emitter electrode 52 is formed above the first gate trench portions 40, the second gate trench portion 240, the dummy trench portions 30, the well region 11, the emitter regions 12, the base regions 14 and the contact regions 15. The well region 11 is of P(+)-type. A diffusion depth of the well region 11 may be greater than that of the first gate trench portion 40, the second gate trench portion 240, and the dummy trench portion 30. A part of region of the first gate trench portion 40, the second gate trench portion 240, and the dummy trench portions 30 which are closer to the gate metal layer 50 is formed in the well region 11. The bottom of the end of the first gate trench portions 40, the second gate trench portion 240, and the dummy trench portions 30 in the extending direction may be covered with the well region 11.

In the transistor portion 70, the first transistor mesa portions 60 are provided contacting with the first gate trench portions 40 and the dummy trench portions 30, except the boundary portion 90. Also, the first transistor mesa portions 60 are provided contacting with the second gate trench portions 240 and the dummy trench portions 30. Also, the second transistor mesa portions 66 are provided contacting with the first gate trench portions 40 and the second gate trench portions 240. In the boundary portion 90, a boundary mesa portion 62 is provided contacting with each trench portion. Also, in a region contacting with the boundary portion 90 of the transistor portion 70, the second transistor mesa portions 66 are provided contacting with the first gate trench portions 40 and the dummy trench portions 30.

In the diode portion 80, the diode mesa portion 64 is provided in a region sandwiched by dummy trench portions 30 that are next to each other. At the both end portions of the first transistor mesa portion 60, the boundary mesa portion 62, the diode mesa portion 64, and the second transistor mesa portion 66 in X-axis direction, the base regions 14 are provided, as an example. Note that FIG. 15a shows only one of the both end portions in X-axis direction.

On the upper surface of the first transistor mesa portion 60, the emitter regions 12 are provided contacting with the first gate trench portions 40. Also, on the upper surface of the first transistor mesa portion 60, the emitter regions 12 are provided contacting with the second gate trench portion 240. Also, on the upper surface of the first transistor mesa portion 60, the contact region 15 is provided. The contact region 15 may be a contact region, as an example.

In the first transistor mesa portion 60, the emitter regions 12 and the contact regions 15 may be alternately provided repeatedly in the extending direction of the first gate trench portions 40. Also, the emitter regions 12 and the contact regions 15 may be alternately provided repeatedly in the extending direction of the second gate trench portions 240.

In the transistor portion 70, the emitter regions 12 are provided contacting with both the first gate trench portions 40 and the second gate trench portions 240 on the upper surface of the second transistor mesa portion 66. Also, the contact regions 15 are provided between the first gate trench portion 40 and the second gate trench portion 240 on the upper surface of the second transistor mesa portion 66.

The boundary mesa portion 62 and the diode mesa portions 64 have the same configuration of the semiconductor device 100 shown in FIG. 1a. The boundary portion 90 and the diode portion 80 have the same configuration of the semiconductor device 100 shown in FIG. 1a.

The semiconductor device 200 has an accumulation region 16 of the first conductivity type below the base region 14 inside the semiconductor substrate. The accumulation region 16 in the present example is of N(+)-type. In FIG. 15a, a range where the accumulation region 16 is formed is indicated by a chain line. The accumulation region 16 is formed, in the top view of the semiconductor substrate, on +X-axis direction side from a region where the contact region 15 or the emitter region 12 at the end in −X-axis direction and the contact hole 54 overlap. Note that the accumulation region 16 may not contact with the dummy trench portion 30.

Figure 15B:
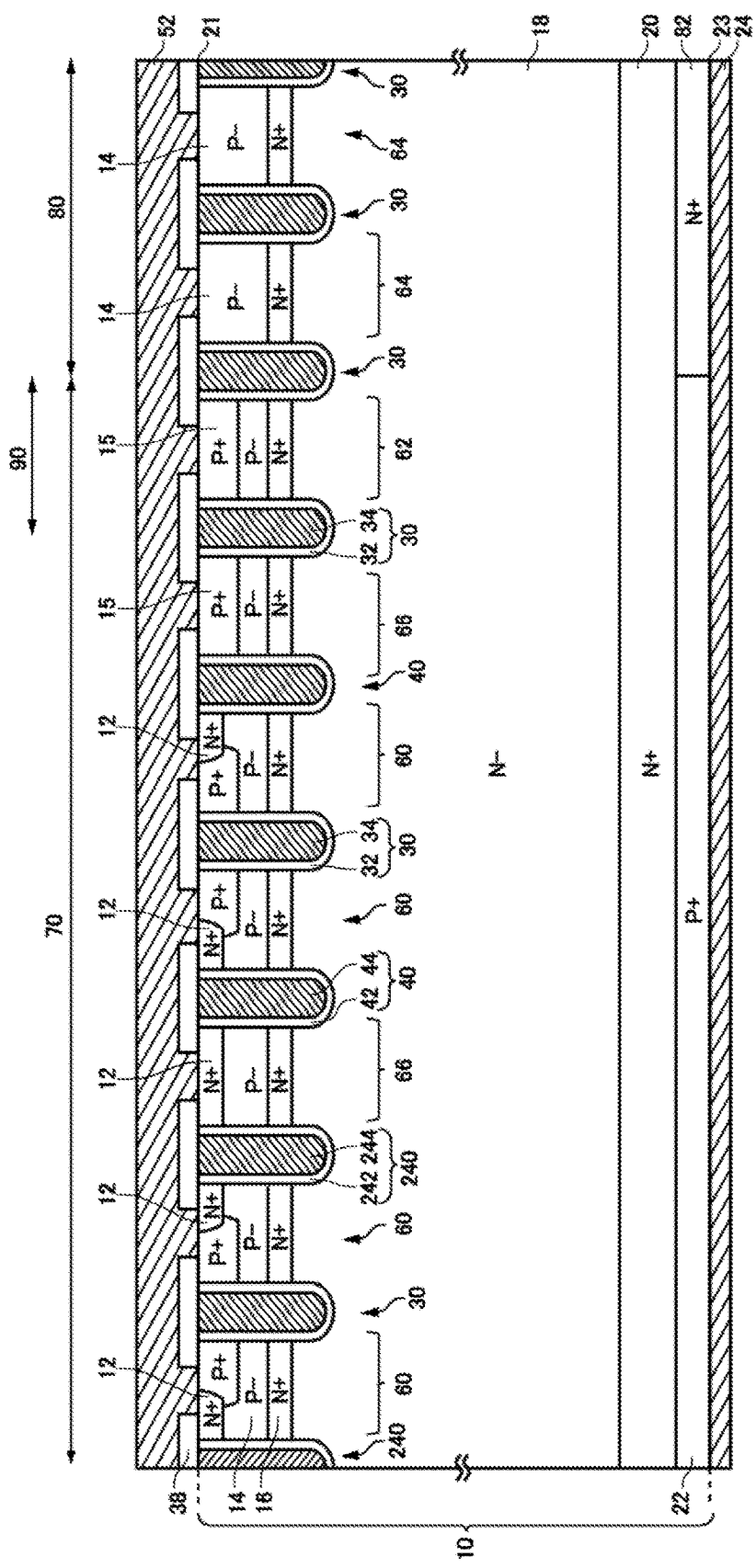

FIG. 15b illustrates an exemplary z-z' cross-section in FIG. 15a. The z-z' cross-section is YZ-plane which passes through the emitter regions 12, the contact regions 15 and the base regions 14 in the transistor portion 70 and the diode portion 80. The semiconductor device 200 in the present example has the semiconductor substrate 10, the interlayer dielectric film 38, the emitter electrode 52 and the collector electrode 24 on the z-z' cross-section. The emitter electrode 52 is formed on an upper surface 21 of the semiconductor substrate 10 and an upper surface of the interlayer dielectric film 38. The collector electrode 24 is formed on a lower surface 23 of the semiconductor substrate 10.

The semiconductor substrate 10 in the present example includes a drift region 18 of the first conductivity type. The drift region 18 in the present example is of N(−)-type. Also, below the drift region 18, a buffer region 20 of the first conductivity type is formed. The buffer region 20 in the present example is of N(+)-type. In the transistor portion 70, below the buffer region 20, the collector region 22 of P(+)-type is formed. The collector region 22 may extend up to a region on a lower surface 23 side of the boundary mesa portion 62.

The diode portion 80 has the cathode region 82 of N(+)-type below the buffer region 20. The cathode region 82 may be provided at the same depth of that of the collector region 22 of the transistor portion 70.

In the first transistor mesa portion 60, the second transistor mesa portion 66, and the boundary mesa portion 62, the accumulation regions 16 of N(+)-type may be provided above the drift region 18. The accumulation regions 16 are provided contacting with both the first gate trench portions 40 and the second gate trench portions 240.

In the first transistor mesa portion 60, the second transistor mesa portion 66, and the boundary mesa portion 62, the base regions 14 of P(−)-type are provided above the accumulation regions 16. The base regions 14 are provided contacting with both the first gate trench portions 40 and the second gate trench portions 240. Also, in the first transistor mesa portion 60, the emitter region 12 and the contact region 15 are provided between the base region 14 and the upper surface 21. Also, on the z-z' cross-section, either the emitter region 12 or the contact region 15 is provided between the base region 14 and the upper surface 21 in the second transistor mesa portion 66.

The emitter regions 12 are provided contacting with both the first gate trench portions 40 and the second gate trench portions 240. The contact regions 15 may be provided contacting with the dummy trench portions 30.

In the boundary mesa portion 62, the contact region 15 of P(+)-type is provided above the accumulation region 16 on the z-z' cross-section. The contact region 15 is provided contacting with the dummy trench portion 30. In the boundary mesa portion 62, the emitter region 12 may not be provided.

In diode mesa portion 64, the accumulation region 16 of N(+)-type is provided above the drift region 18. Also, in the diode mesa portion 64, the base region 14 may be provided above the accumulation region 16. In the diode mesa portion 64, the emitter region 12 may not be provided.

On the upper surface 21, one or more first gate trench portion(s) 40, one or more second gate trench portion(s) 240, and one or more dummy trench portion(s) 30 are formed. Each trench portion is provided from the upper surface 21 through the drift region 18. In regions where at least any of the emitter region 12, the contact region 15 and the accumulation region 16 is provided, trench portions each reach the drift region 18, penetrating these regions as well. In FIG. 15b, the dummy trench portion 30 may have the same structure as those of the first gate trench portion 40 and the second gate trench portion 240.

The first gate trench portion 40 has the gate trench, the gate-insulating film 42, and the gate conductive portion 44 which are formed on the upper surface 21. The gate-insulating film 42 is formed covering the inner wall of the gate trench. The gate conductive portion 44 is formed inside the gate trench on an inner side relative to the gate-insulating film 42. The gate-insulating film 42 insulates the gate conductive portion 44 and the semiconductor substrate 10 from each other. The first gate trench portion 40 is covered with the interlayer dielectric film 38 on the upper surface 21. The gate conductive portion 44 includes, in the depth direction of the semiconductor substrate 10, a region facing the neighboring base region 14 on the first transistor mesa portion 60 side, having the gate-insulating film 42 therebetween.

The second gate trench portion 240 has the gate trench, the gate-insulating film 242, and the gate conductive portion 244 which are formed on the upper surface 21. The gate-insulating film 242 is formed covering the inner wall of the gate trench. The gate conductive portion 244 is formed inside the gate trench on an inner side relative to the gate-insulating film 242. The gate-insulating film 242 insulates the gate conductive portion 244 and the semiconductor substrate 10 from each other. The second gate trench portion 240 is covered with the interlayer dielectric film 38 on the upper surface 21. The gate conductive portion 244 includes, in the depth direction of the semiconductor substrate 10, a region facing the neighboring base region 14 on the second transistor mesa portion 66 side, having the gate-insulating film 242 therebetween.

In FIG. 15b, the dummy trench portion 30 may have the same structure as that of the first gate trench portion 40. The dummy trench portion 30 has a dummy trench, the dummy insulating film 32 and the dummy conductive portion 34 which are formed on the upper surface 21 side. The dummy trench portion 30 is covered with the interlayer dielectric film 38 on the upper surface 21.

Figure 15C:
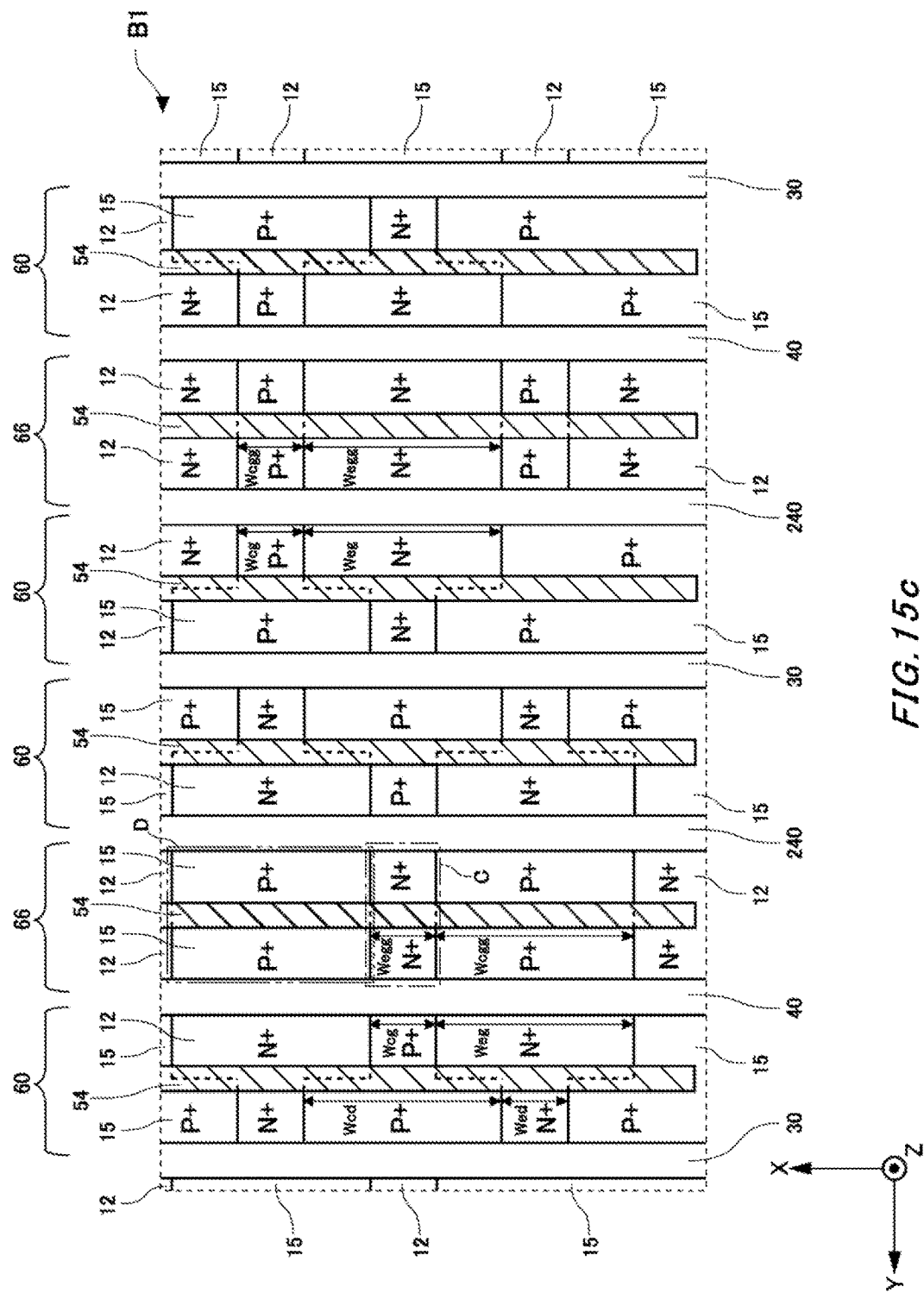

FIG. 15c is an enlarged view of the region B1 in FIG. 15a. The region B1 illustrates a part of a configuration, being arrayed under the same rule in FIG. 15a. As shown in FIG. 15c, in the semiconductor device 200 in the present example, the emitter regions 12 and the contact regions 15 are provided contacting with the first gate trench portion 40 on the upper surface of the first transistor mesa portion 60. The emitter region 12 and the contact region 15 are alternately provided repeatedly in the extending direction of the first gate trench portions 40. Also, the emitter regions 12 and the contact regions 15 are provided contacting with the first gate trench portion 40 and the second gate trench portion 240 on the upper surface of the second transistor mesa portion 66. The emitter regions 12 and the contact regions 15 are alternately provided repeatedly in the extending direction of the first gate trench portions 40. Also, the emitter regions 12 and the contact regions 15 are provided contacting with the dummy trench portion 30 on the upper surface of the first transistor mesa portion 60. The emitter regions 12 and the contact regions 15 are alternately provided repeatedly in the extending direction of the first gate trench portions 40. The emitter region 12 may not contact with the dummy trench portion 30. Also, the contact regions 15 may not contact with the first gate trench portion 40.

In the first transistor mesa portion 60 in the semiconductor device 200 in the present example, as shown in FIG. 15c, the width of the emitter region 12 in X-axis direction may be changed stepwise on XY-plane, like the semiconductor device 100 shown in FIG. 1c. In the second transistor mesa portion 66 in the semiconductor device 200 in the present example, as shown in FIG. 15c, unlike the first transistor mesa portion 60, the emitter regions 12 and the contact regions 15 may be arranged alternately in X-axis direction forming only p-n junctions that have boundaries parallel to Y-axis direction. An example is shown, in the semiconductor device 200 shown in FIG. 15c, where the emitter region 12 of a rectangular shape indicated as the region C by the chain line and the contact region 15 of the rectangular shape indicated as the region D by a two-dot chain line are arranged alternately in X-axis direction.

The width Weg of the emitter region 12 in X-axis direction contacting with the first gate trench portion 40 is provided so as to be greater than the width Wcg of the contact region 15 in X-axis direction contacting with the first gate trench portion 40. The width of the emitter region 12 in x-axis direction contacting with the second gate trench portion 240 is provided as the width Weg. The width of the contact region 15 in x-axis direction contacting with the second gate trench portion 240 is provided as the width Wcg. The width Wcd of the contact region 15 in X-axis direction contacting with the dummy trench portion 30 is provided so as to be greater than the width Wed of the emitter region 12 in X-axis direction contacting with the dummy trench portion 30.

The width Weg of the emitter region 12 in the first transistor mesa portion 60 in X-axis direction contacting with the first gate trench portion 40 may be equal to the width Wcgg of the contact region 15 in the second transistor mesa portion 66 in X-axis direction contacting with the first gate trench portion 40. Also, in first transistor mesa portions 60, the width Wcg of the contact region 15 in X-axis direction contacting with the first gate trench portion 40 may be equal to the width Wegg of the emitter region 12 in the second transistor mesa portion 66 in X-axis direction contacting with the first gate trench portion 40.

The width Weg of the emitter region 12 in the first transistor mesa portion 60 in X-axis direction contacting with the second gate trench portion 240 may be equal to the width Wegg of the emitter region 12 in the second transistor mesa portion 66 in X-axis direction contacting with the second gate trench portion 240. Also, the width Wcg of the contact region 15 in the first transistor mesa portion 60 in X-axis direction contacting with the second gate trench portion 240 may be equal to the width Wcgg of the contact region 15 in the second transistor mesa portion 66 in X-axis direction contacting with the second gate trench portion 240.

Figure 16A:
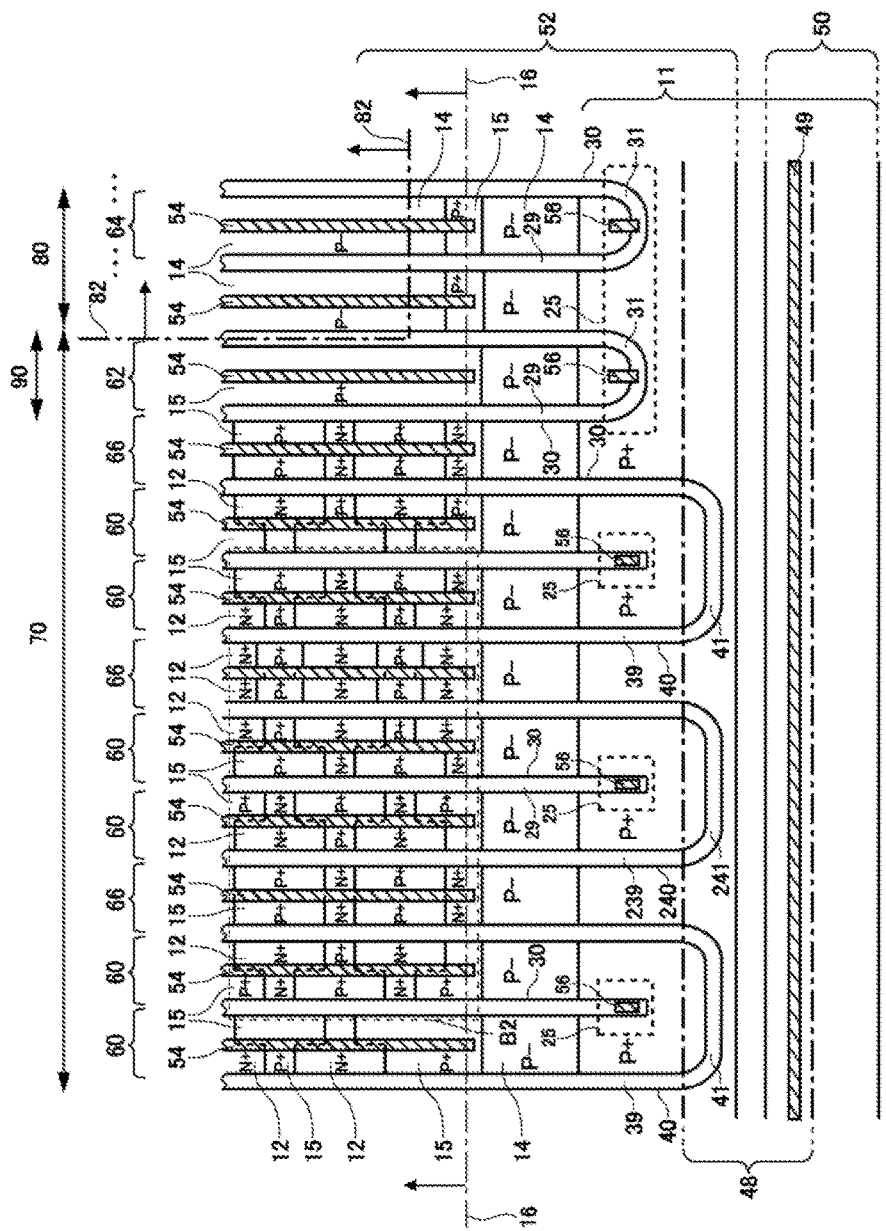
FIG. 16a partially illustrates an upper surface of a semiconductor device 200 according to still another embodiment of the present invention.

FIG. 16a partially illustrates an upper surface of a semiconductor device 200 according to still another embodiment of the present invention. The semiconductor device 100 shown in FIG. 16a is different from the semiconductor device 200 shown in FIG. 15a in a point where the width in X-axis direction of the emitter region 12 of the second transistor mesa portion 66 contacting with the second gate trench portion 240 is smaller than the width in x-axis direction of the emitter region 12 of the first transistor mesa portion 60 contacting with the second gate trench portion 240.

Figure 16B:
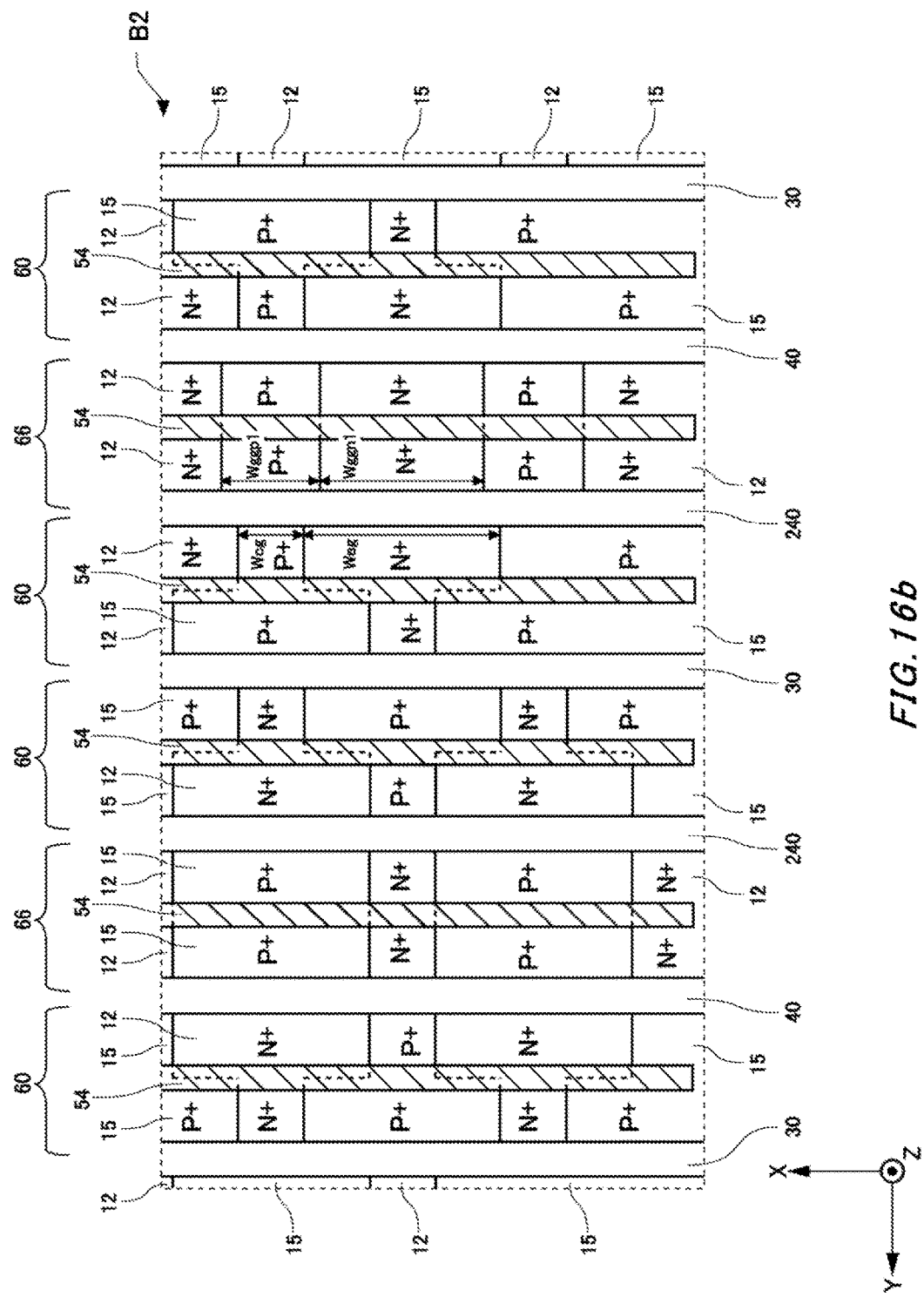

FIG. 16b is an enlarged view of the region B2 in FIG. 16a. The region B2 illustrates a part of a configuration, being arrayed under the same rule in FIG. 16a. The semiconductor device 200 shown in FIG. 16b is different from the semiconductor device 200 shown in FIG. 15c in a point where the width Wggn1 of the emitter region 12 of the second transistor mesa portion 66 in X-axis direction contacting with the second gate trench portion 240 is smaller than the width Weg of the emitter region 12 of the first transistor mesa portion 60 in X-axis direction contacting with the second gate trench portion 240. Also, the width Wggp1 of the contact region 15 in the second transistor mesa portion 66 in X-axis direction contacting with the second gate trench portion 240 is greater than the width Wcg of the contact region 15 in the first transistor mesa portion 60 in X-axis direction contacting with the second gate trench portion 240. By making the width Wggn1 smaller than the width Weg, the semiconductor device 200 can be adjusted in a direction to focus on the saturation current characteristics within the balance between the saturation current characteristics and the latch-up resistance of the entire transistor portion 70.

Figure 17A:
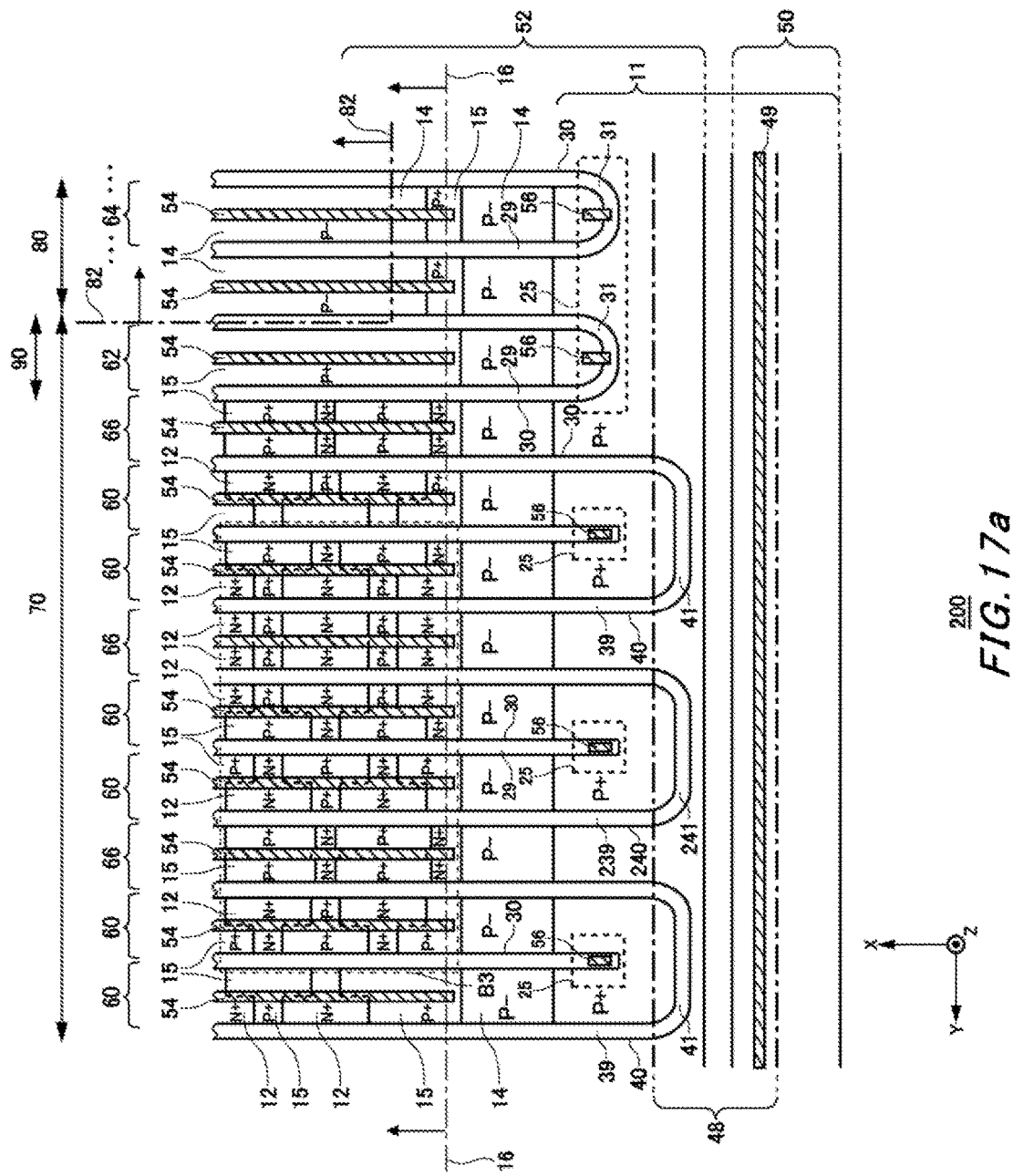
FIG. 17a partially illustrates an upper surface of a semiconductor device 200 according to still another embodiment of the present invention.

FIG. 17a partially illustrates an upper surface of a semiconductor device 200 according to still another embodiment of the present invention. The semiconductor device 100 shown in FIG. 17a is different from the semiconductor device 200 shown in FIG. 15a in a point where the width of the contact region 15 of the second transistor mesa portion 66 in X-axis direction contacting with the first gate trench portion 40 is greater than the width of the emitter region 12 of the first transistor mesa portion 60 in x-axis direction contacting with the first gate trench portion 40.

Figure 17B:
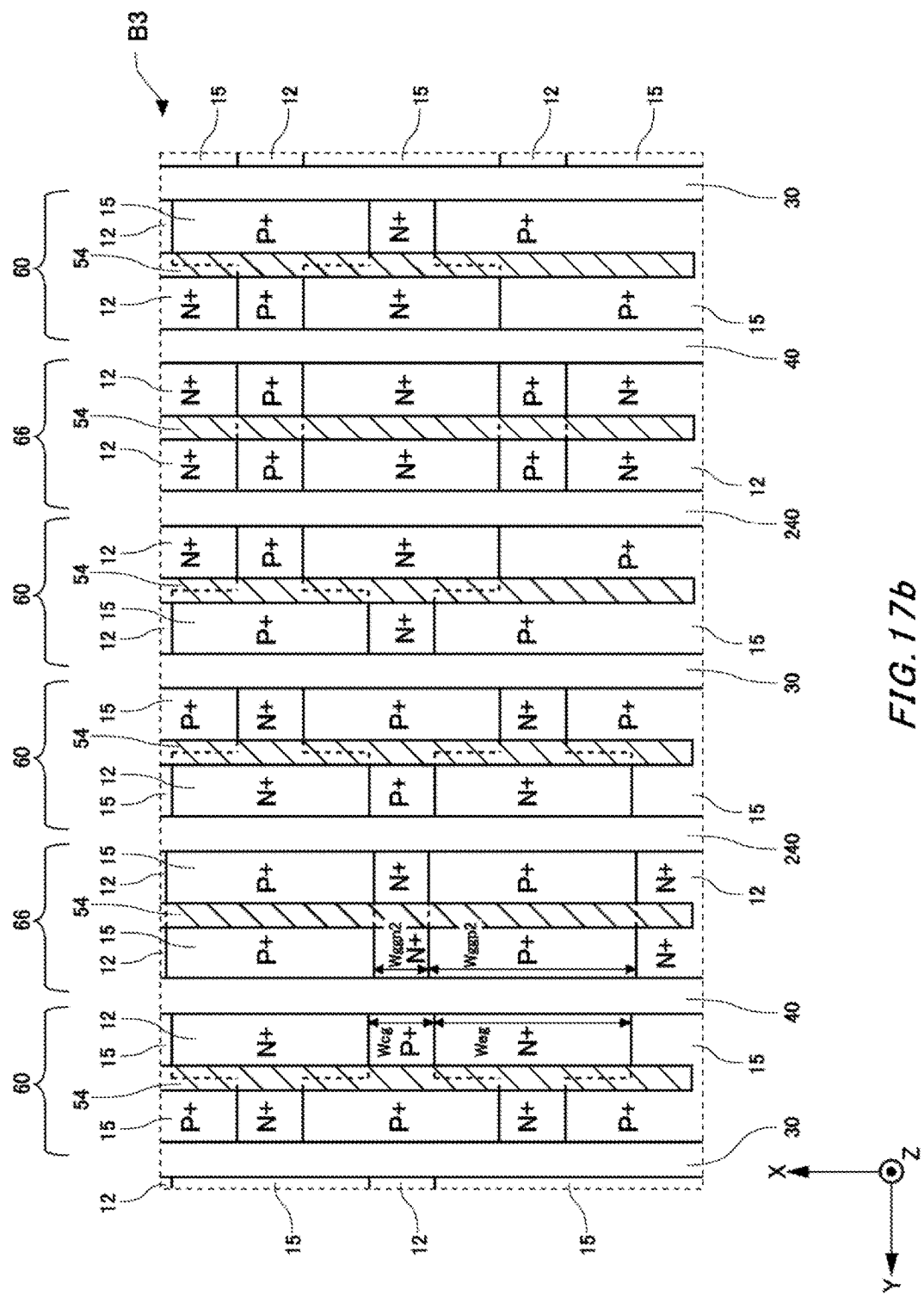

FIG. 17b is an enlarged view of the region B3 in FIG. 17a. The region B3 illustrates a part of a configuration, being arrayed under the same rule in FIG. 17a. The semiconductor device 200 shown in FIG. 17b is different from the semiconductor device 200 shown in FIG. 15c in a point where the width Wggp2 of the contact region 15 of the second transistor mesa portion 66 in X-axis direction contacting with the first gate trench portion 40 is greater than the width Weg of the emitter region 12 of the first transistor mesa portion 60 in X-axis direction contacting with the first gate trench portion 40. Also, the width Wggn2 of the emitter region 12 in the second transistor mesa portion 66 in X-axis direction contacting with the first gate trench portion 40 is smaller than the width Wcg of the contact region 15 in the first transistor mesa portion 60 in X-axis direction contacting with the first gate trench portion 40. By making the width Wggp2 greater than the width Weg, the semiconductor device 200 can be adjusted in a direction to focus on the latch-up resistance within the balance between the saturation current characteristics and the latch-up resistance of the entire transistor portion 70.

Figure 18A:
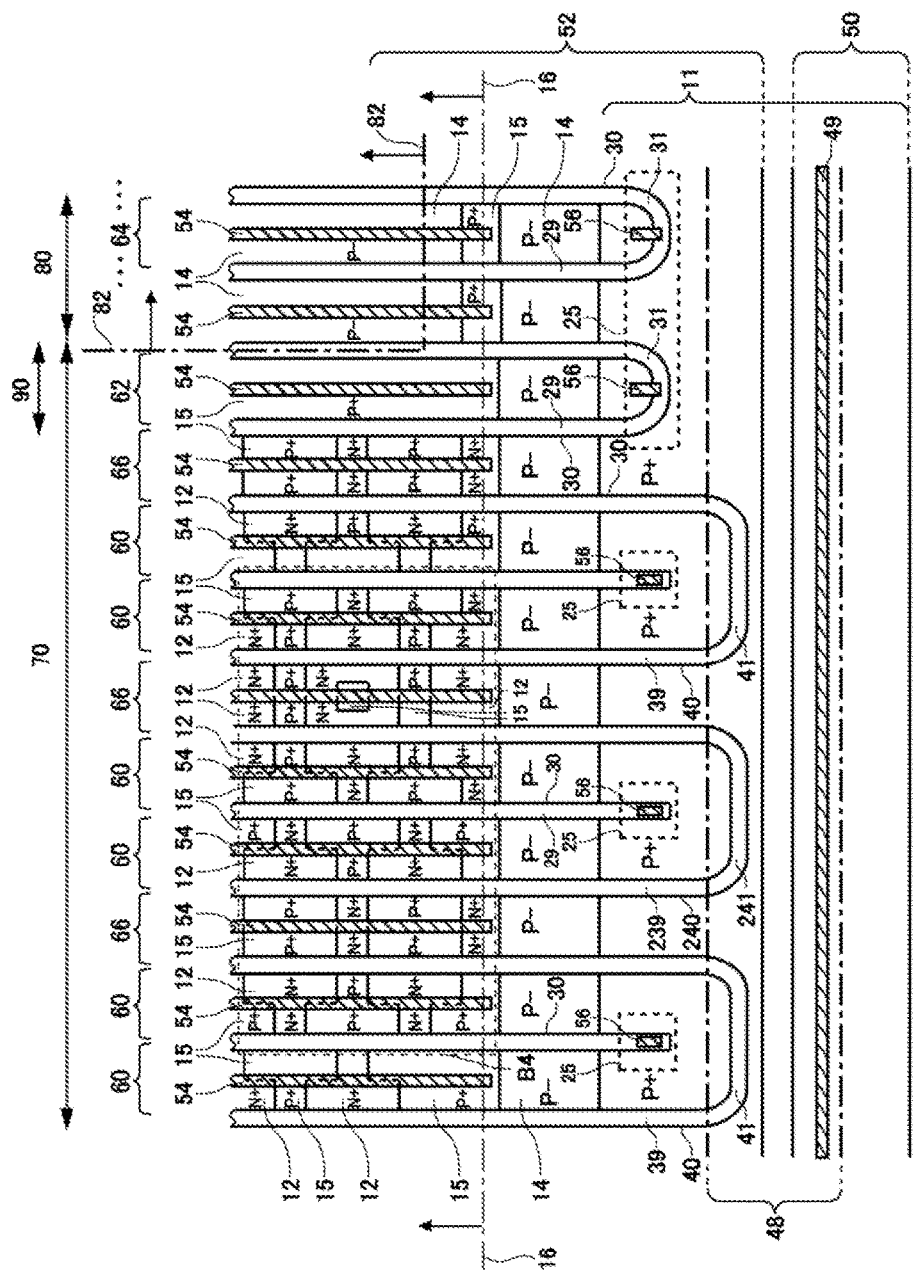
FIG. 18a partially illustrates an upper surface of a semiconductor device 200 according to another embodiment of the present invention.

FIG. 18a partially illustrates an upper surface of a semiconductor device 200 according to still another embodiment of the present invention. The semiconductor device 100 shown in FIG. 18*a* is different from the semiconductor device 200 shown in FIG. 15*a* in a point where the contact regions 15, which are surrounded by the emitter regions 12 of the second transistor mesa portion 66, contact with the emitter regions 12, and are spaced apart from both the first gate trench portion 40 and the second gate trench portion 240, are further included.

Figure 18B:
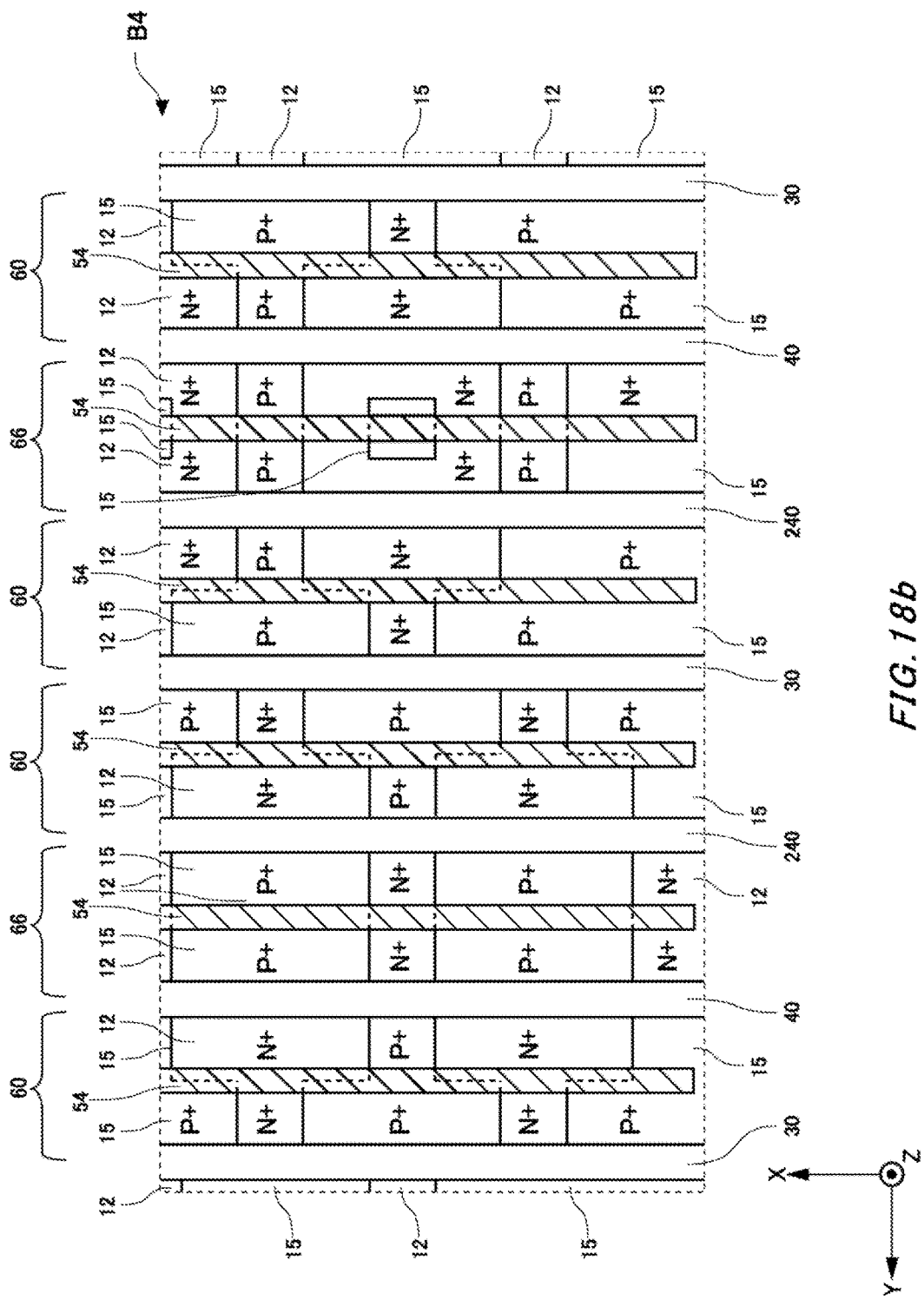

FIG. 18*b* is an enlarged view of the region B4 in FIG. 18*a*. The region B4 illustrates a part of a configuration, being arrayed under the same rule in FIG. 18*a*. The semiconductor device 200 shown in FIG. 18*b* is different from the semiconductor device 200 shown in FIG. 15*c* in a point where the contact region 15 is further included contacting with the emitter region 12 surrounded by the emitter region 12 of the second transistor mesa portion 66 and spaced apart from both the first gate trench portion 40 and the second gate trench portion 240. By providing the contact region 15 surrounded by the emitter region 12 in the second transistor mesa portion 66, the semiconductor device 200 can be adjusted in a direction to focus on the latch-up resistance within the balance between the saturation current characteristics and the latch-up resistance of the entire transistor portion 70.

Note that the contact regions 15 may be contacting with the first gate trench portion 40. Also, the contact regions 15 may be contacting with the second gate trench portion 240. Also, the contact region 15 may contact with the contact region 15 provided through from the first gate trench portion 40 to the second gate trench portion 240 in the second transistor mesa portion 66.

Figure 19A:
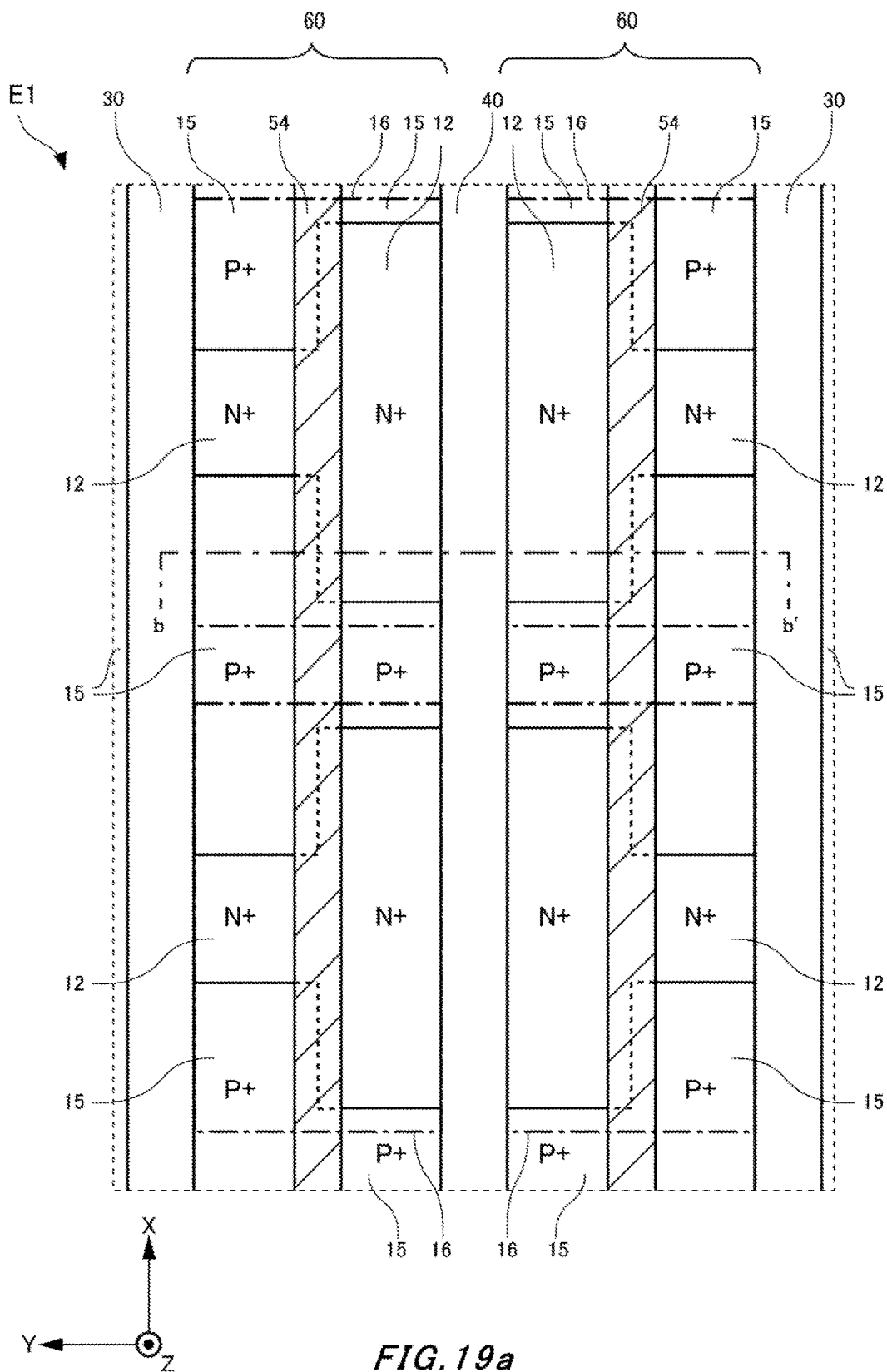

FIG. 19*a* is an enlarged view of the region E1 in FIG. 1*a*. The region E1 illustrates a part of a configuration, being arrayed under the same rule in FIG. 1*a*. As shown in FIG. 19*a*, the semiconductor device 100 in the present example further includes an accumulation region 16 contacting with the first gate trench portion 40 and the dummy trench portion 30 below the emitter regions 12. In FIG. 19*a*, a region where the accumulation region 16 is provided on XY-plane is indicated by a chain line part. The accumulation region 16, as shown in FIG. 19*a*, is provided overlapping the emitter region 12 on XY-plane. Some of the accumulation region 16, as shown in FIG. 19*a*, may not overlap the contact region 15 on XY-plane.

Figure 19B:
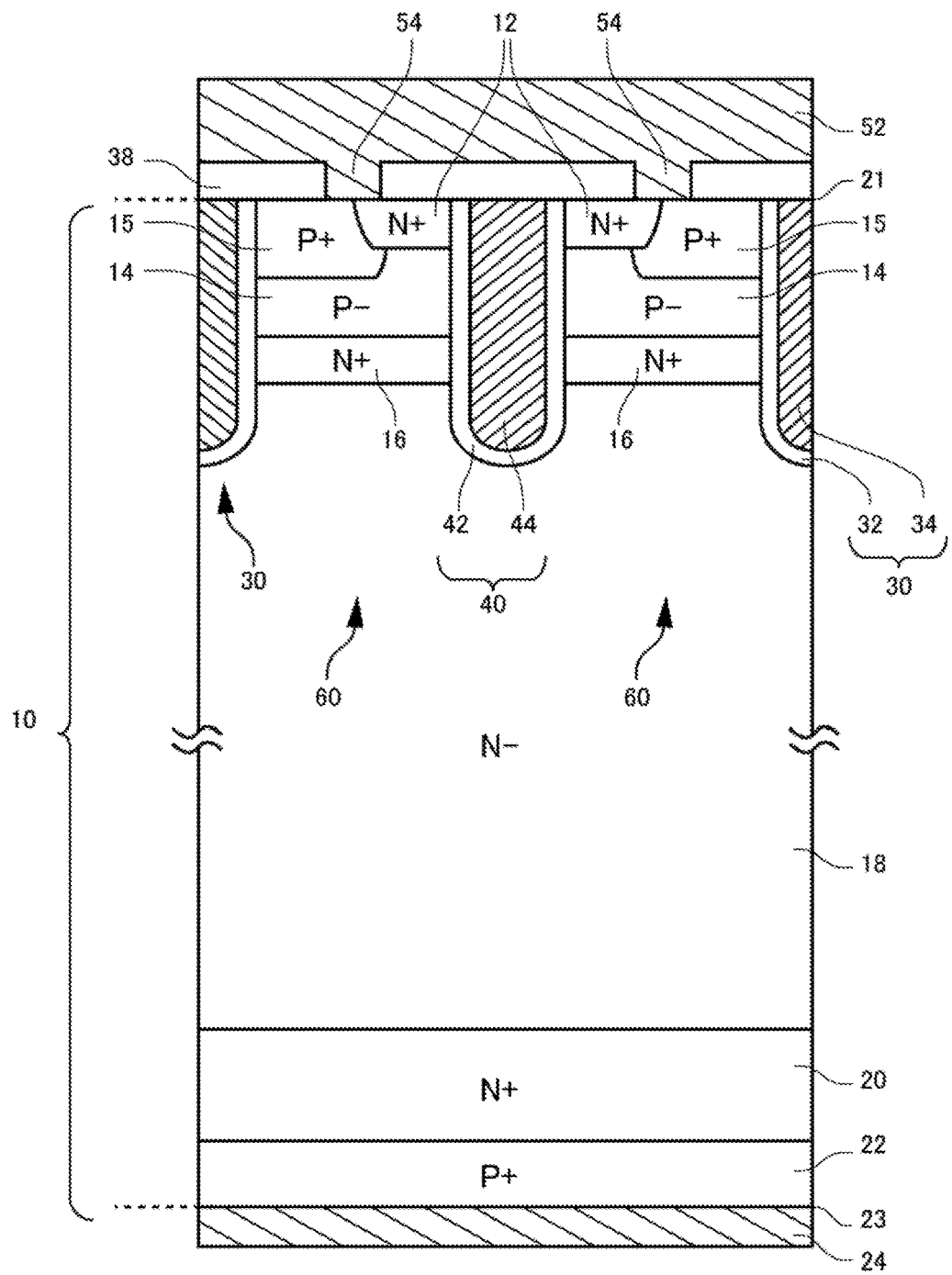

FIG. 19*b* illustrates an exemplary b-b' cross-section in FIG. 19*a*. The b-b' cross-section is YZ plane which passes through, in the transistor portion 70, the dummy trench portion 30, the emitter region 12, the contact region 15, and the first gate trench portion 40. As shown in FIG. 19*b*, the semiconductor device 100 in the present example includes the accumulation region 16 contacting with the first gate trench portion 40 above the drift region 18 and below the base region 14. The accumulation region 16 may or may not contact with the dummy trench portion 30. FIG. 19*b* shows an example where the accumulation region 16 contacts with the dummy trench portion 30.

Figure 20A:
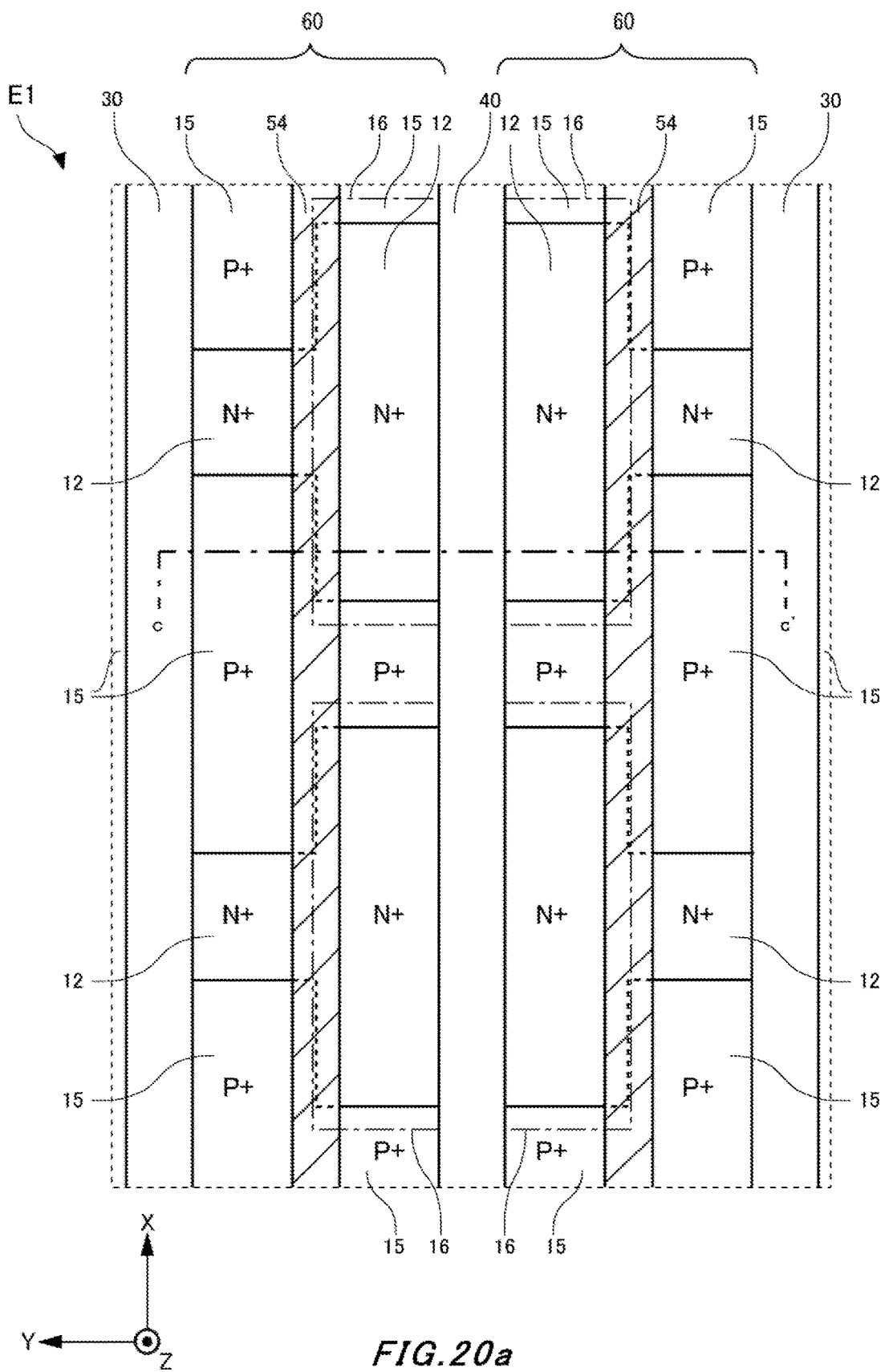

FIG. 20*a* is another enlarged view of the region E1 in FIG. 1*a*. The region E1 illustrates apart of a configuration, being arrayed under the same rule in FIG. 1*a*. As shown in FIG. 20*a*, the semiconductor device 100 in the present example further includes an accumulation region 16 contacting with the first gate trench portion 40 below the emitter region 12. In FIG. 20*a*, a region where the accumulation region 16 is provided on XY-plane is indicated by a chain line part. The accumulation region 16, as shown in FIG. 20*a*, is provided overlapping the emitter region 12 on XY-plane. In the semiconductor device 100 in the present example, the accumulation region 16 does not contact with the dummy trench portion 30. Also, some of the accumulation region 16 may not overlap the contact region 15 on XY-plane.

Figure 20B:
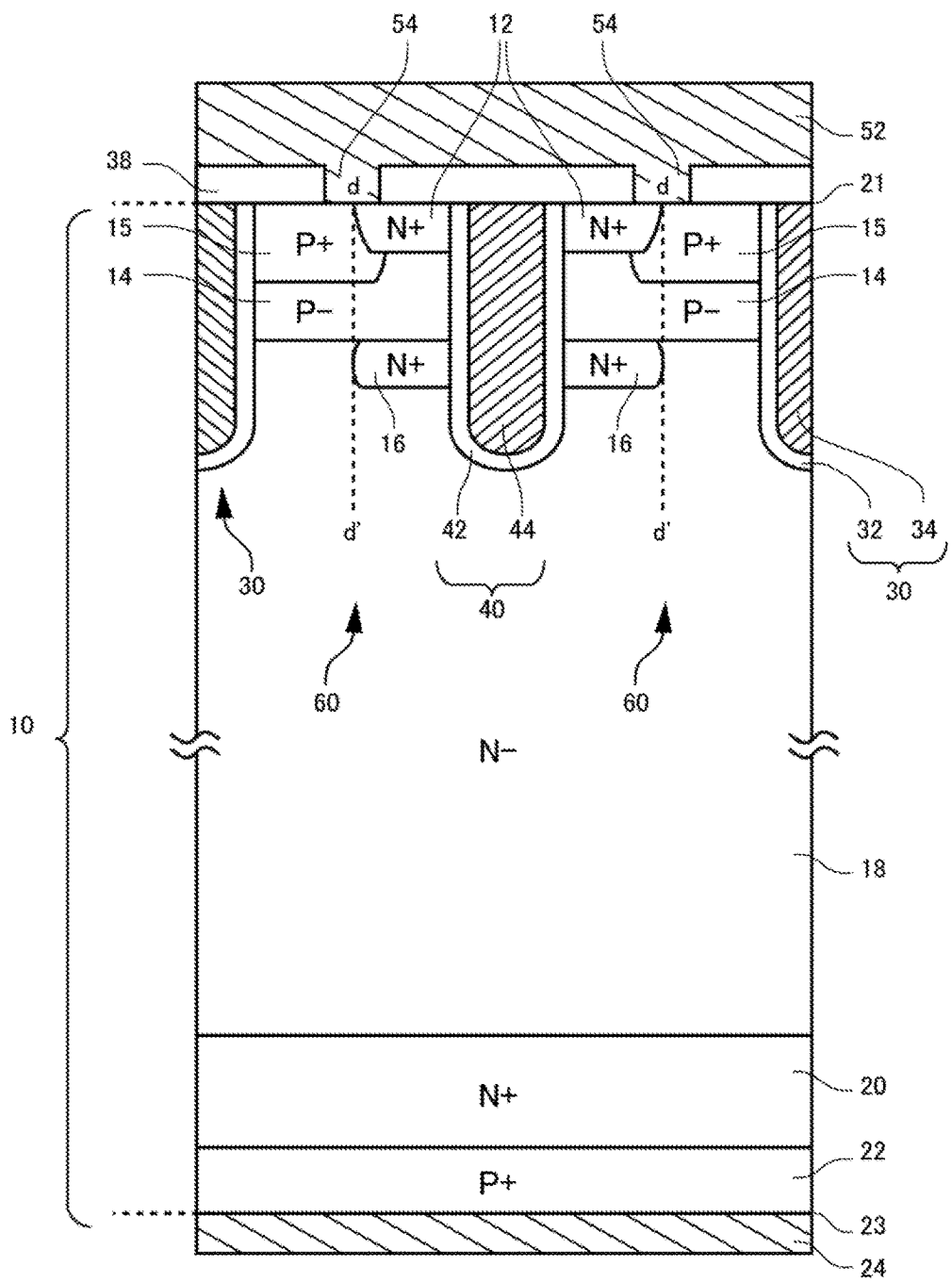

FIG. 20*b* illustrates an exemplary c-c' cross-section in FIG. 20*a*. The c-c' cross-section is YZ plane which passes through, in the transistor portion 70, the dummy trench portion 30, the emitter region 12, the contact region 15, and the first gate trench portion 40. As shown in FIG. 20*b*, the semiconductor device 100 in the present example further includes the accumulation region 16 of N(±)-type contacting with the first gate trench portion 40 above the drift region 18 and below the base region 14. The accumulation region 16 does not contact with the dummy trench portion 30. The accumulation region 16 may not contact with the dummy trench portion 30 to perform the function to increase the IE effect in the vicinity of the first gate trench portion 40. As indicated by the d-d' line in FIG. 20*b*, the accumulation region 16 may just overlap the emitter region 12 in the top view of the semiconductor substrate 10. The accumulation region 16 may be provided up to a side closer to the dummy trench portion 30 than the d-d' line, within a range not to contact with the dummy trench portion 30.

Figure 21A:
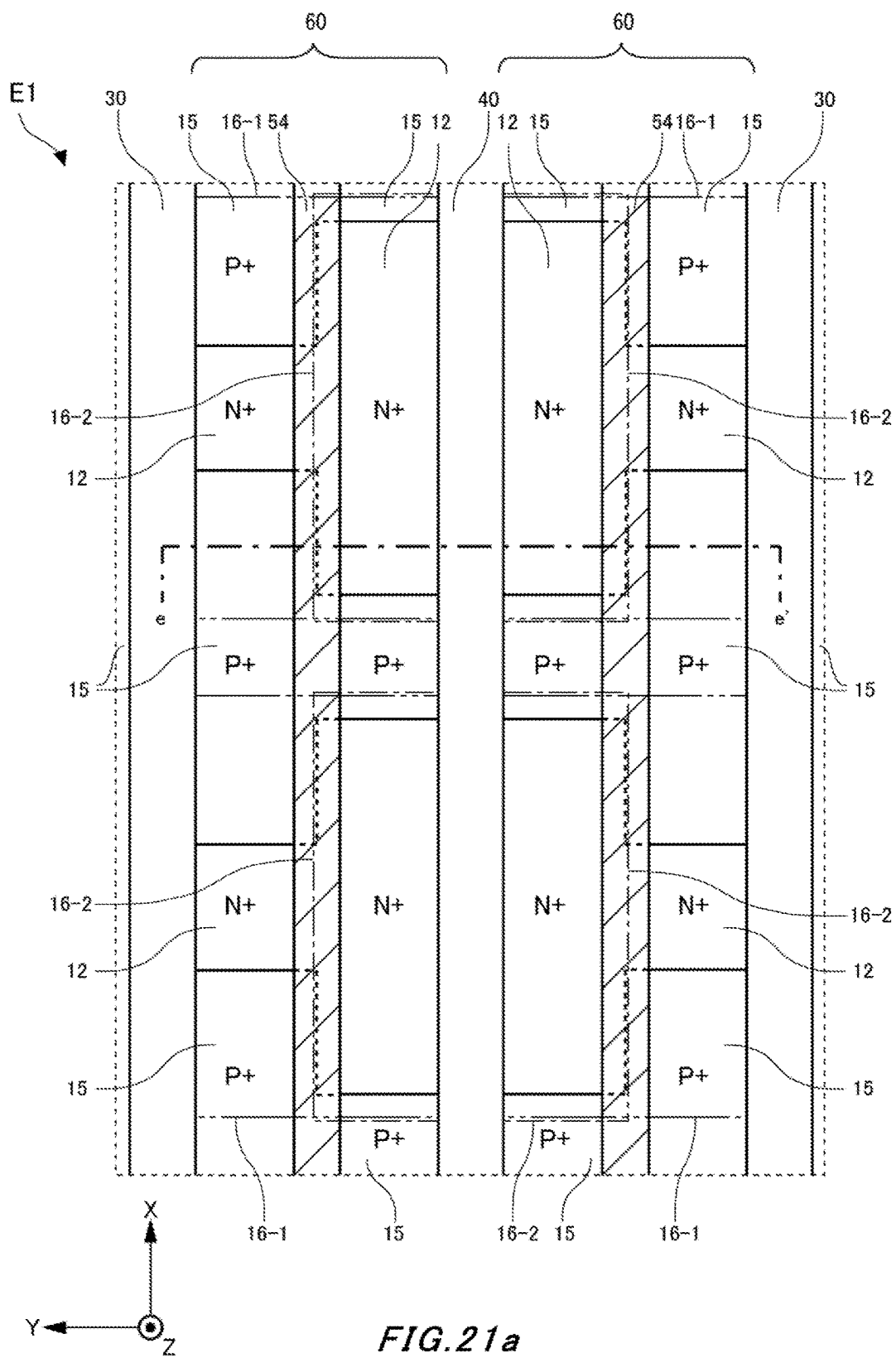

FIG. 21*a* is another enlarged view of the region E1 in FIG. 1*a*. The region E1 illustrates apart of a configuration, being arrayed under the same rule in FIG. 1*a*. The semiconductor device 100 shown in FIG. 21*a* includes a first accumulation region 16-1 contacting with the first gate trench portion 40 and the dummy trench portion 30 below the emitter regions 12. Also, the semiconductor device 100 shown in FIG. 21*a* further includes a second accumulation region 16-2 contacting with the first gate trench portion 40 and not contacting with the dummy trench portion 30. FIG. 21*a* shows a region where the first accumulation region 16-1 is provided on XY-plane by a two-dot chain line part. Also, a region where the second accumulation region 16-2 is provided is indicated by a chain line part. The first accumulation region 16-1 and the second accumulation region 16-2, as shown in FIG. 21*a*, are provided, on XY-plane, overlapping the region where the emitter region 12 and the first gate trench portion 40 contact with each other. Some of the first accumulation region 16-1 and the second accumulation region 16-2, as shown in FIG. 21*a*, may not overlap the contact region 15 on XY-plane.

Figure 21B:
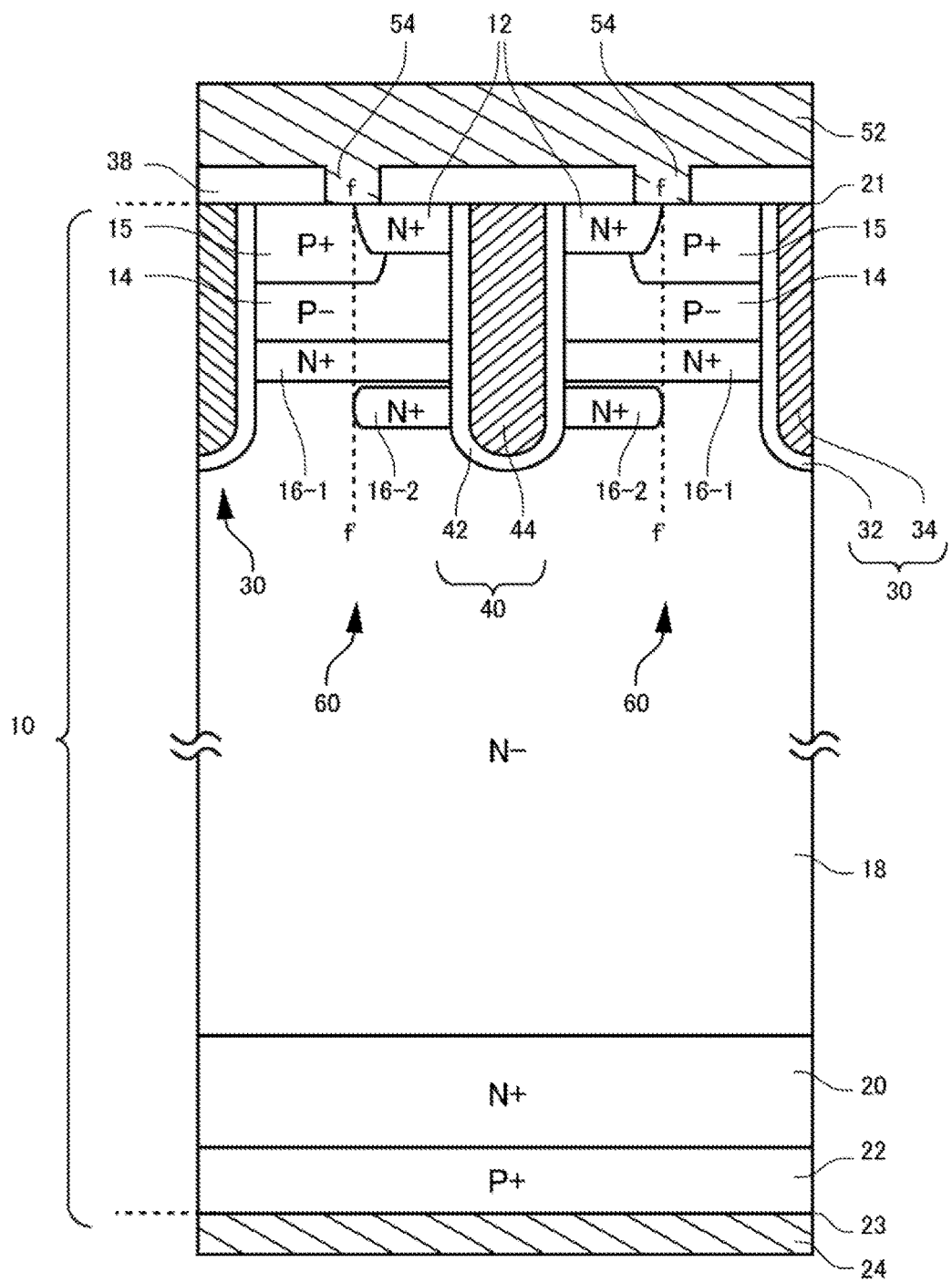

FIG. 21*b* illustrates an exemplary e-e' cross-section in FIG. 21*a*. The e-e' cross-section is YZ plane which passes through, in the transistor portion 70, the dummy trench portion 30, the emitter region 12, the contact region 15, and the first gate trench portion 40. As shown in FIG. 21*b*, the semiconductor device 100 in the present example further includes the first accumulation region 16-1 of N(+)-type contacting with the first gate trench portion 40 and the second accumulation region 16-2 of N(+)-type contacting with the first gate trench portion 40 above the drift region 18 and below the base region 14. The first accumulation region 16-1 contacts with the first gate trench portion 40 and the dummy trench portion 30. The second accumulation region 16-2 contacts with the first gate trench portion 40, but may not contact with the dummy trench portion 30. As indicated by the f-f' line in FIG. 21*b*, the second accumulation region 16-2 may just overlap the emitter region 12 in the top view of the semiconductor substrate 10. The second accumulation region 16-2 may be provided up to a side closer to the dummy trench portion 30 than the f-f' line, within a range not to contact with the dummy trench portion 30.

Figure 22A:
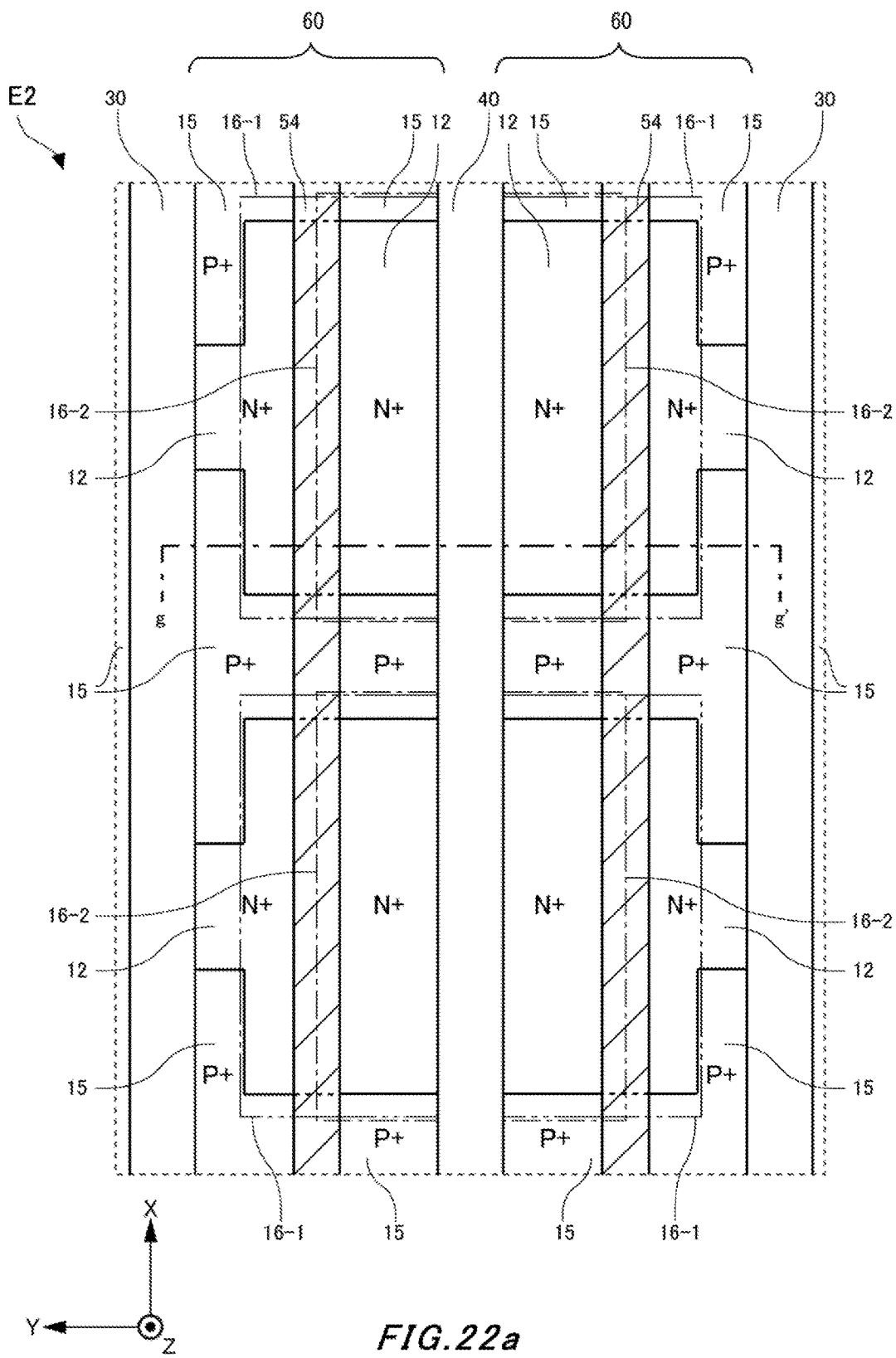
FIG. 22a is an enlarged view of the region E2 in FIG. 1.

FIG. 22*a* is an enlarged view of the region E2 in FIG. 3*a*. The region E2 illustrates a part of a configuration, being arrayed under the same rule in FIG. 3*a*. In the semiconductor device 100 shown in FIG. 22*a*, the emitter region 12 is provided up to a side closer to the dummy trench portion 30 than that in FIG. 21*a*, and the first accumulation region 16-1 does not contact with the dummy trench portion 30. FIG. 22*a* shows a region where the first accumulation region 16-1 is provided on XY-plane by a two-dot chain line part. Also, a region where the second accumulation region 16-2 is provided is indicated by a chain line part. The first accumulation region 16-1 and the second accumulation region 16-2, as shown in FIG. 22*a*, are provided overlapping the region where the emitter region 12 and the first gate trench portion 40 contact with each other on XY-plane. Some of the first accumulation region 16-1 and the second accumulation region 16-2, as shown in FIG. 22*a*, may not overlap the contact region 15 on XY-plane.

Figure 22B:
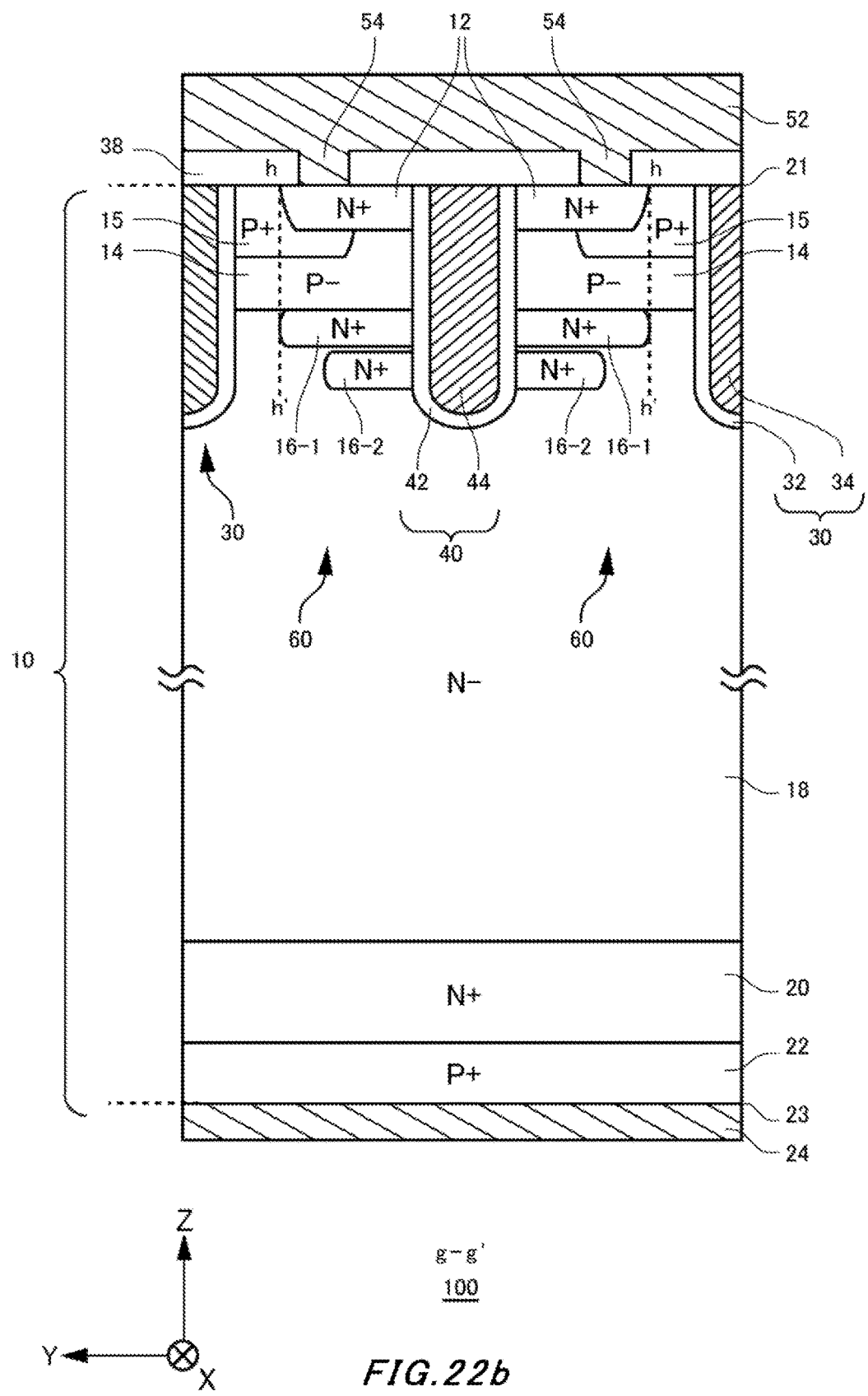

FIG. 22*b* illustrates an exemplary g-g' cross-section in FIG. 22*a*. The g-g' cross-section is YZ plane which passes through, in the transistor portion 70, the dummy trench portion 30, the emitter region 12, the contact region 15, and the first gate trench portion 40. As shown in FIG. 22*b*, the semiconductor device 100 in the present example further includes the first accumulation region 16-1 of N(+)-type contacting with the first gate trench portion 40 and the second accumulation region 16-2 of N(+)-type contacting with the first gate trench portion 40 above the drift region 18 and below the base region 14. The first accumulation region 16-1 and the second accumulation region 16-2 may contact with the first gate trench portion 40, but may not contact with the dummy trench portion 30. As indicated by the h-h' line in FIG. 22*b*, the first accumulation region 16-1 may just overlap the emitter region 12 in the top view of the semiconductor substrate 10. The first accumulation region 16-1 may be provided up to a side closer to the dummy trench portion 30 than the h-h' line, within a range not to contact with the dummy trench portion 30.

Note that, while the contact region 15 is described as of P(+)-type in the present specification, the contact region 15 may be of P(−)-type. Also, the doping concentration of the contact region 15 may be equal to the doping concentration of the base region 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a semiconductor substrate having a drift region of a first conductivity type;
   a first gate trench portion that is provided from an upper surface of the semiconductor substrate to the drift region and extends in a predetermined extending direction on the upper surface of the semiconductor substrate;
   a dummy trench portion that is provided from the upper surface of the semiconductor substrate to the drift region and extends in the extending direction;
   a first transistor mesa portion sandwiched by the first gate trench portion and the dummy trench portion;
   a base region of a second conductivity type contacting with the first gate trench portion above the drift region;
   an emitter region of the first conductivity type that is provided on the upper surface of the semiconductor substrate contacting with the first gate trench portion and has a higher doping concentration than a doping concentration of the drift region; and
   a second conductivity type region exposed on the upper surface of the semiconductor substrate, wherein,
   on an upper surface of the first transistor mesa portion,
      the emitter region of the first conductivity type, and the second conductivity type region, are adjacent one another and form a single transistor unit; and
      a total width of the emitter region of the single transistor unit in the extending direction contacting with the first gate trench portion is greater than a total width of the second conductivity type region of the single transistor unit in the extending direction contacting with the first gate trench portion.

2. The semiconductor device according to claim 1, wherein, on the upper surface of the first transistor mesa portion, the total width of the emitter region of the single transistor unit in the extending direction contacting with the first gate trench portion is greater than a total width of the emitter region of the single transistor unit in the extending direction contacting with the dummy trench portion.

3. The semiconductor device according to claim 1, wherein,
   on the upper surface of the first transistor mesa portion,
      the second conductivity type region contacts with the dummy trench portion; and
      a total width of the second conductivity type region of the single transistor unit in the extending direction contacting with the dummy trench portion is greater than the total width of the second conductivity type region of the single transistor unit in the extending direction contacting with the first gate trench portion.

4. The semiconductor device according to claim 1, wherein the emitter region contacts with the dummy trench portion.

5. The semiconductor device according to claim 4, wherein a total width of the second conductivity type region of the single transistor unit in the extending direction contacting with the first gate trench portion is smaller than the total width of the emitter region of the single transistor unit in the extending direction contacting with the dummy trench portion.

6. The semiconductor device according to claim 4, wherein,
   on the upper surface of the first transistor mesa portion,
      the emitter region is continuously arranged in the extending direction; and
      the emitter region and the second conductivity type region are arranged alternately in the extending direction.

7. The semiconductor device according to claim 1, wherein the emitter region is spaced apart from the dummy trench portion.

8. The semiconductor device according to claim 1, wherein the total width of the emitter region of the single transistor unit in the extending direction is changed stepwise.

9. The semiconductor device according to claim 1, further comprising
an interlayer dielectric film on the upper surface of the semiconductor substrate, the interlayer dielectric film having a contact hole, wherein
below the contact hole, the emitter region and the second conductivity type region are next to and contact with each other in a direction from the dummy trench portion to the first gate trench portion.

10. The semiconductor device according to claim 9, wherein an end portion of the emitter region is arranged below the contact hole.

11. The semiconductor device according to claim 9, wherein
a total width of the emitter region of the single transistor unit in the extending direction between the contact hole and the first gate trench portion is equal to a total width of the emitter region of the single transistor unit in the extending direction between the contact hole and the dummy trench portion.

12. The semiconductor device according to claim 1, further comprising an interlayer dielectric film on the upper surface of the semiconductor substrate, the interlayer dielectric film having a contact hole, wherein
below the contact hole, the emitter region and the second conductivity type region are next to and contact with each other in the extending direction.

13. The semiconductor device according to claim 12, wherein an end portion of the emitter region is arranged, in a top view of the semiconductor substrate, between the contact hole and the first gate trench portion.

14. The semiconductor device according to claim 12, wherein an end portion of the emitter region is arranged, in a top view of the semiconductor substrate, between the contact hole and the dummy trench portion.

15. The semiconductor device according to claim 1, wherein the total width of the emitter region of the single transistor unit in the extending direction is changed continuously.

16. The semiconductor device according to claim 1, further comprising
an accumulation region of the first conductivity type, above the drift region and below the base region, contacting with the first gate trench portion and having a higher doping concentration than a doping concentration of the drift region, wherein
the accumulation region overlaps the emitter region in a top view of the semiconductor substrate.

17. The semiconductor device according to claim 1, wherein
a plurality of the units are joined below a corresponding contact hole.

18. The semiconductor device according to claim 1, wherein
a plurality of the units are provided in the extending direction.

19. The semiconductor device according to claim 1, wherein
a shape of the emitter region of the first conductivity type or the second conductivity type region viewed from above is a polygon surrounded by five or more sides.

20. A semiconductor device comprising:
a semiconductor substrate having a drift region of a first conductivity type;
a first gate trench portion that is provided from an upper surface of the semiconductor substrate to the drift region and extends in a predetermined extending direction on the upper surface of the semiconductor substrate;
a dummy trench portion that is provided from the upper surface of the semiconductor substrate to the drift region and extends in the extending direction;
a first transistor mesa portion sandwiched by the first gate trench portion and the dummy trench portion;
a base region of a second conductivity type contacting with the first gate trench portion above the drift region;
an emitter region of the first conductivity type that is provided on the upper surface of the semiconductor substrate contacting with the first gate trench portion and has a higher doping concentration than a doping concentration of the drift region; and
a second conductivity type region exposed on the upper surface of the semiconductor substrate, wherein,
on an upper surface of the first transistor mesa portion,
the emitter region and the second conductivity type region are arranged alternately in the extending direction; and
a width of the emitter region in the extending direction contacting with the first gate trench portion is greater than a width of the second conductivity type region in the extending direction contacting with the first gate trench portion,
wherein the emitter region is spaced apart from the dummy trench portion;
the second conductivity type region further has a contact region of the second conductivity type, and a first intermediate region of the second conductivity type having a lower doping concentration than a doping concentration of the contact region; and
the first intermediate region is sandwiched by the dummy trench portion and the emitter region contacting with both the dummy trench portion and the emitter region.

21. The semiconductor device according to claim 20, wherein
the second conductivity type region has a second intermediate region of the second conductivity type having a lower doping concentration than the doping concentration of the contact region; and
the contact region is spaced apart from the first gate trench portion, and the second intermediate region contacts with the first gate trench portion.

22. The semiconductor device according to claim 21, wherein the second intermediate region is sandwiched by the first gate trench portion and the contact region contacting with both the first gate trench portion and the contact region.

23. The semiconductor device according to claim 22, wherein a width of the second intermediate region in the extending direction contacting with the first gate trench portion is smaller than a width of the emitter region in the extending direction contacting with the dummy trench portion.

24. A semiconductor device comprising:
a semiconductor substrate having a drift region of a first conductivity type;
a first gate trench portion that is provided from an upper surface of the semiconductor substrate to the drift region and extends in a predetermined extending direction on the upper surface of the semiconductor substrate;
a dummy trench portion that is provided from the upper surface of the semiconductor substrate to the drift region and extends in the extending direction;

a first transistor mesa portion sandwiched by the first gate trench portion and the dummy trench portion;
a base region of a second conductivity type contacting with the first gate trench portion above the drift region;
an emitter region of the first conductivity type that is provided on the upper surface of the semiconductor substrate contacting with the first gate trench portion and has a higher doping concentration than a doping concentration of the drift region; and
a second conductivity type region exposed on the upper surface of the semiconductor substrate, wherein,
on an upper surface of the first transistor mesa portion,
the emitter region and the second conductivity type region are arranged alternately in the extending direction; and
a width of the emitter region in the extending direction contacting with the first gate trench portion is greater than a width of the second conductivity type region in the extending direction contacting with the first gate trench portion,
a second gate trench portion that is provided from the upper surface of the semiconductor substrate to the drift region extending in the extending direction, and arranged next to the first gate trench portion and on an opposite side to the dummy trench portion; and
a second transistor mesa portion that is sandwiched by the first gate trench portion and the second gate trench portion, wherein
the base region contacts with both the first gate trench portion and the second gate trench portion above the drift region;
the emitter region contacts with both the first gate trench portion and the second gate trench portion on the upper surface of the semiconductor substrate;
the second conductivity type region is exposed on the upper surface of the semiconductor substrate; and
a width of the emitter region in the second transistor mesa portion in the extending direction contacting with the second gate trench portion is smaller than a width of the emitter region in the first transistor mesa portion in the extending direction contacting with the second gate trench portion.

25. The semiconductor device according to claim 24, wherein, in the second transistor mesa portion, the emitter region and the second conductivity type region are arranged alternately in the extending direction.

26. The semiconductor device according to claim 24, wherein, in the second transistor mesa portion, the second conductivity type region is spaced apart from both the first gate trench portion and the second gate trench portion.

27. The semiconductor device according to claim 24, wherein
the second conductivity type region contacts with the first gate trench portion; and
a width of the second conductivity type region in the second transistor mesa portion in the extending direction contacting with the first gate trench portion is greater than a width of the emitter region in the first transistor mesa portion in the extending direction contacting with the first gate trench portion.

* * * * *